United States Patent
Nakamura et al.

(10) Patent No.: US 7,469,367 B2
(45) Date of Patent: Dec. 23, 2008

(54) PHASE ERROR DETERMINATION METHOD AND DIGITAL PHASE-LOCKED LOOP SYSTEM

(75) Inventors: Shinobu Nakamura, Kanagawa (JP); Mamoru Kudo, Kanagawa (JP); Satoru Ooshima, Tokyo (JP); Jun Yamane, Tokyo (JP); Hirofumi Shimizu, Yokohama (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 11/633,547

(22) Filed: Dec. 4, 2006

(65) Prior Publication Data

US 2007/0094549 A1   Apr. 26, 2007

Related U.S. Application Data

(62) Division of application No. 10/882,121, filed on Jun. 30, 2004.

(30) Foreign Application Priority Data

Jul. 2, 2003   (JP) ............................. 2003-190302

(51) Int. Cl.
*H03M 13/00* (2006.01)
(52) U.S. Cl. ...................................... 714/709
(58) Field of Classification Search ............... 714/709
See application file for complete search history.

(56) References Cited

U.S. PATENT DOCUMENTS

| | | | | |
|---|---|---|---|---|
| 5,223,931 A * | 6/1993 | Fernsler et al. | ............. | 348/540 |
| 5,400,370 A * | 3/1995 | Guo | ............................ | 375/371 |
| 6,078,200 A * | 6/2000 | Miyano | ...................... | 327/142 |
| 6,340,910 B1 * | 1/2002 | Saeki | .......................... | 327/296 |
| 6,741,668 B1 * | 5/2004 | Nakamura | .................. | 375/376 |
| 7,233,638 B2 * | 6/2007 | Sumiyoshi | ................. | 375/376 |

FOREIGN PATENT DOCUMENTS

JP   09-247137   9/1997
JP   11-341306   12/1999

* cited by examiner

*Primary Examiner*—Joseph D Torres
(74) *Attorney, Agent, or Firm*—Rockey, Depke & Lyons, LLC; Robert J. Depke

(57) ABSTRACT

In a digital PLL system, instead of measuring a binarized playback RF signal with a high frequency clock, pulse-length data is generated by using N phase clocks (for example, 16 phase clocks). The pulse-length data is then run-length counted with a virtual channel clock so as to extract data. In this digital PLL system, the number of changing points of an asynchronous signal during an interval between adjacent clocks of the N phase clocks is detected so as to determine phase errors from the detected number of changing points. Phase errors are also determined from the timing relationship between changing points of a signal synchronized with the N phase clocks and each clock of the N phase clocks.

2 Claims, 90 Drawing Sheets

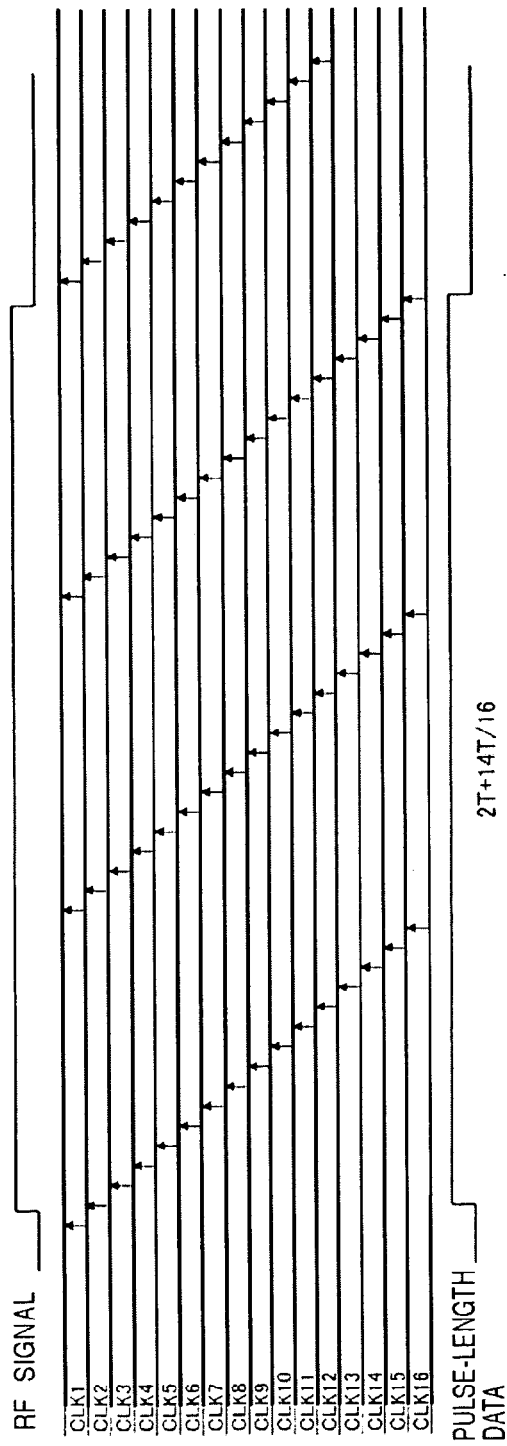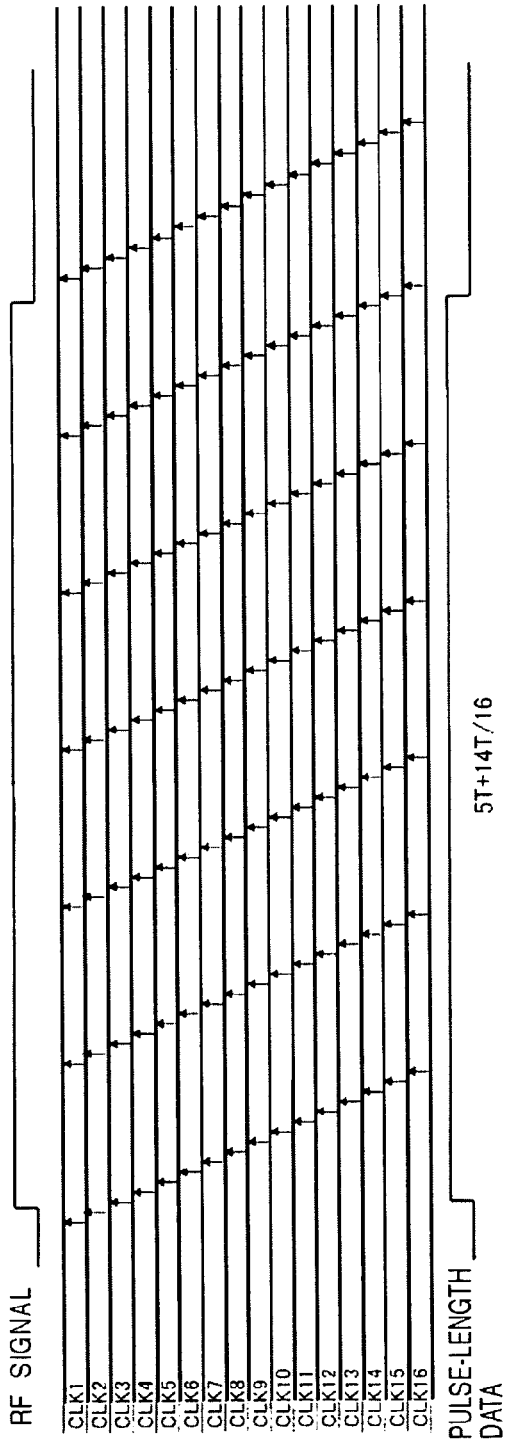

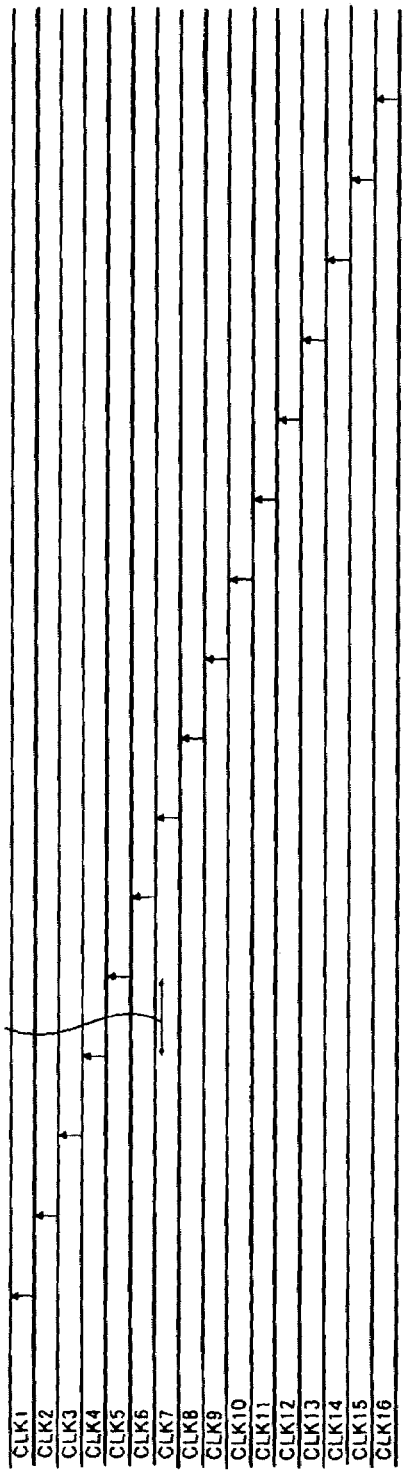
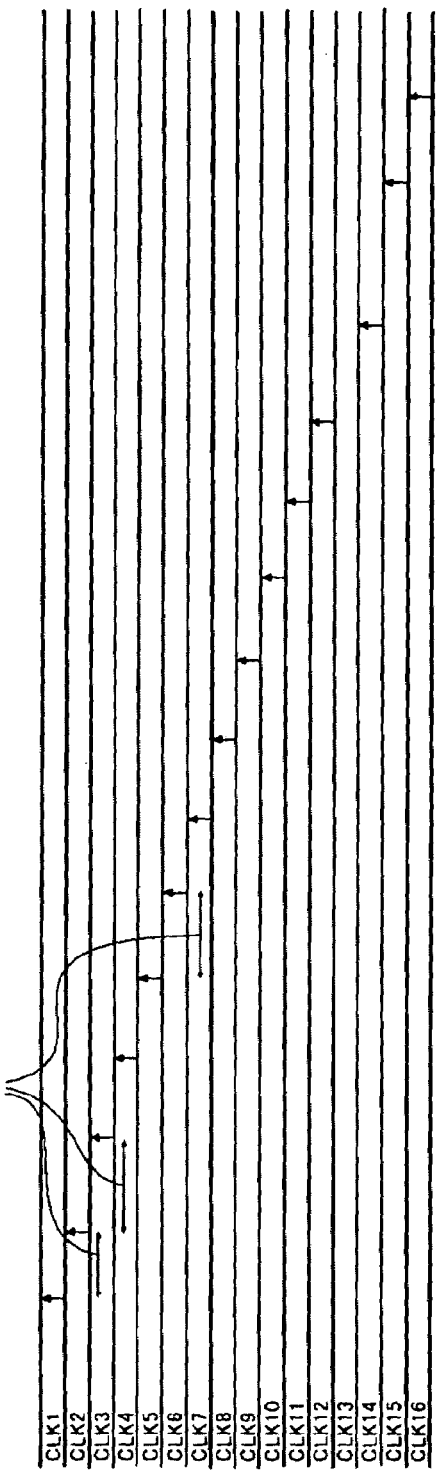

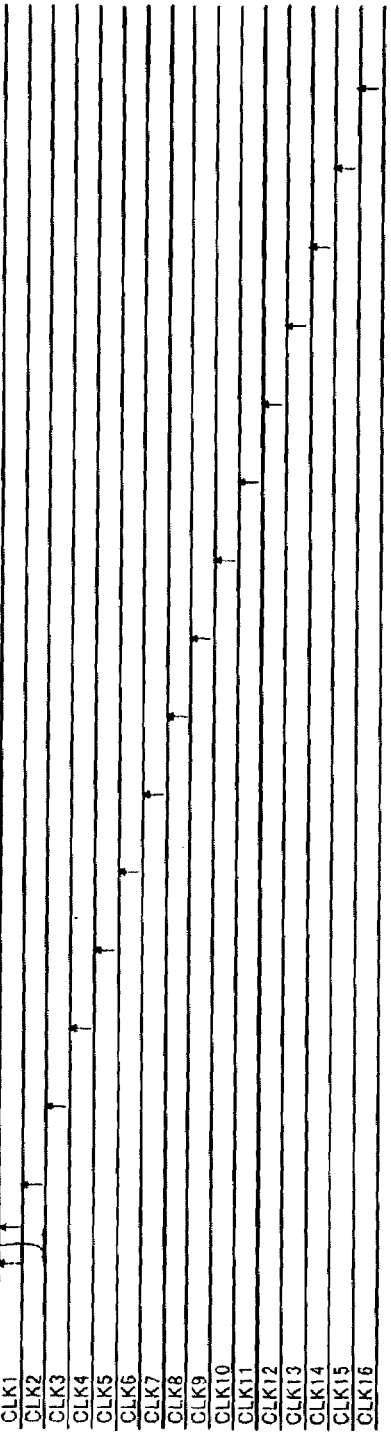
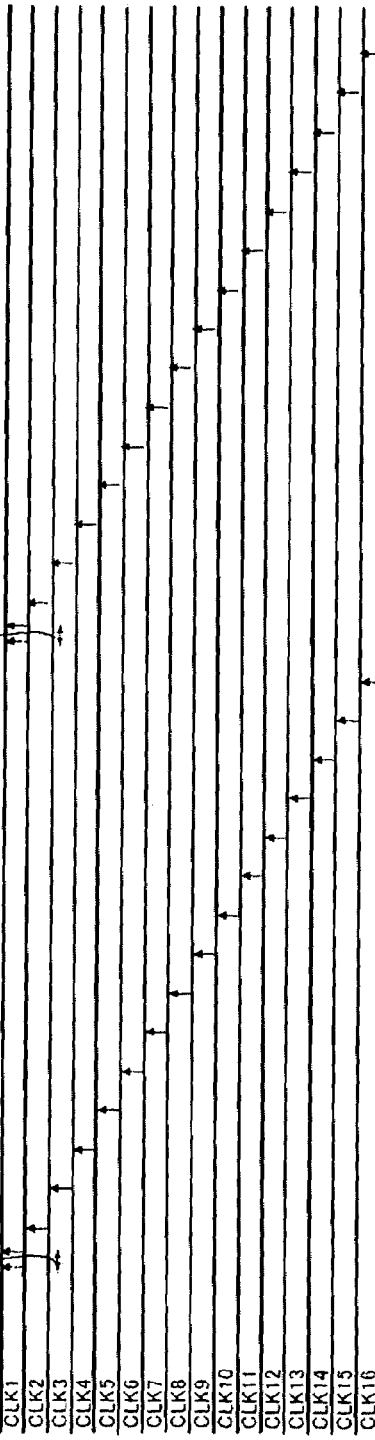

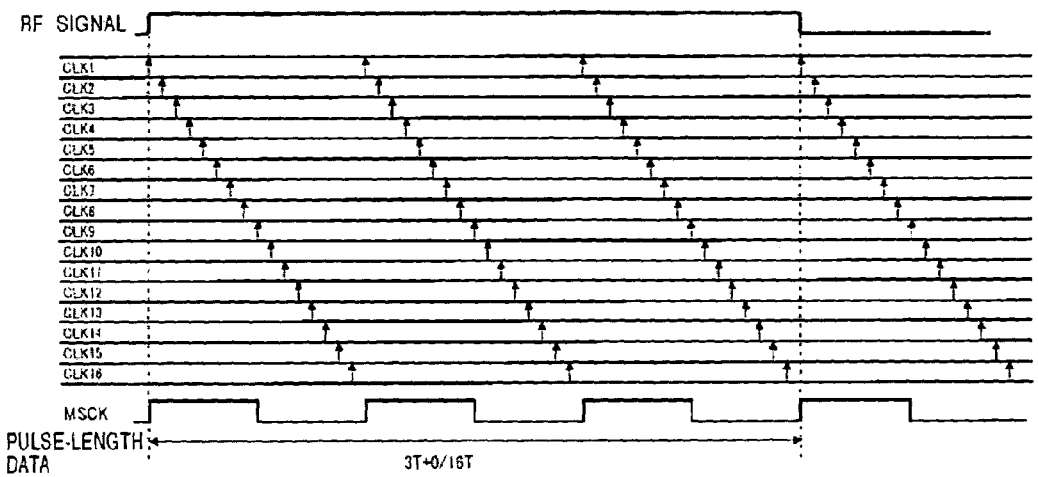
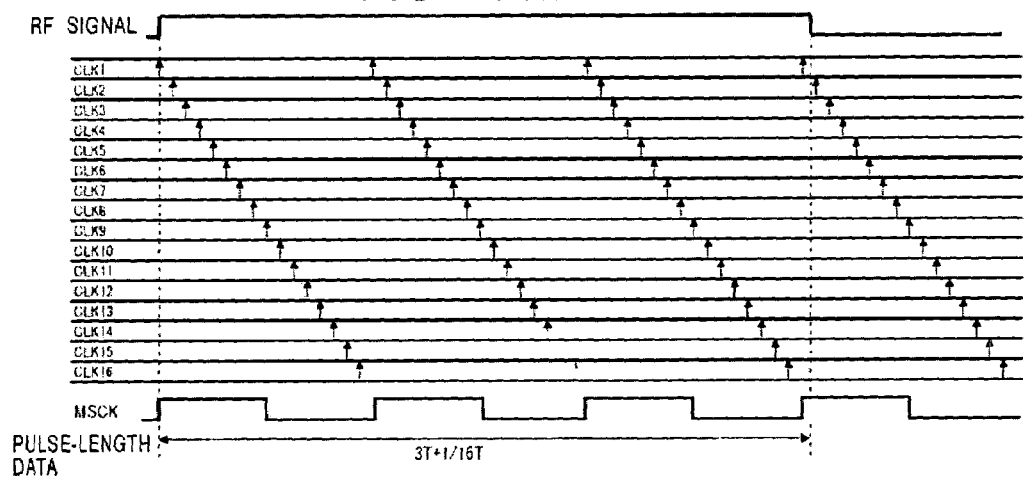
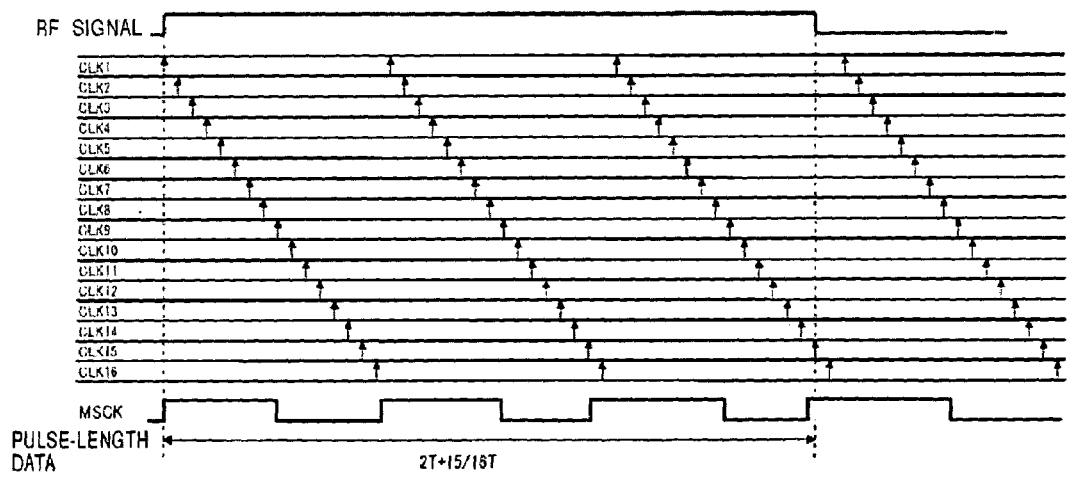

(a) BINARIZED RF SIGNAL (b) CHANNEL CLOCK SYNCHRONIZING WITH RF SIGNAL (c) RF SIGNAL WITH CHANNEL CLOCK

FIG. 35

| | CONDITIONS OF L1 AND L3 | CONDITIONS OF φ1 AND φ2 | CORRECTION PATTERN | CORRECTED RUN LENGTH |
|---|---|---|---|---|
| (1) | L1+L3≦8 | NONE | e | L1+L3 |
| (2) | L1=3, L3=6 | NONE | d | 3, 3, 3 |
| (3) | L1=4, L3=5 | NONE | c | 3, 3, 3 |
| (4) | L1=4, L3=6 | φ1=0, φ2≠0 | d | 4, 3, 3 |
| | | OTHERS | c | 3, 3, 4 |
| (5) | L1=5, L3=4 | NONE | b | 3, 3, 3 |
| (6) | L1=5, L3=5 | φ1<φ2 | c | 4, 3, 3 |
| | | φ1≧φ2 | b | 3, 3, 4 |
| (7) | L1=5, L3=6 | φ1=0, φ2≠0 | d | 5, 3, 3 |
| | | φ1≠0, φ2≠0, φ1<φ2 | c | 4, 3, 4 |
| | | OTHERS | b | 3, 3, 5 |
| (8) | L1=6, L3=3 | NONE | a | 3, 3, 3 |
| (9) | L1=6, L3=4 | φ1≠0, φ2=0 | b | 4, 3, 3 |
| | | OTHERS | a | 3, 3, 4 |
| (10) | L1=6, L3=5 | φ1≠0, φ2≠0, φ1≧φ2 | b | 4, 3, 4 |
| | | φ1=0, φ2≠0 | a | 3, 3, 5 |
| | | OTHERS | c | 5, 3, 3 |
| (11) | L1≧6, L3≧6 | φ1=0, φ2≠0 | d | L1, 3, L3−3 |
| | | φ1≠0, φ2≠0, φ1<φ2 | c | L1−1, 3, L3−2 |
| | | φ1≠0, φ2≠0, φ1≧φ2 | b | L1−2, 3, L3−1 |
| | | φ1≠0, φ2=0 | a | L1−3, 3, L3 |

FIG. 36

| | CONDITIONS OF L1 AND L3 | CONDITIONS OF φ1 AND φ2 | CORRECTION PATTERN | CORRECTED RUN LENGTH |
|---|---|---|---|---|
| (1) | L1+L3<11 | φ1≠0, φ2≠0 | e | L1+L3 |
| (2) | L1≧3, L3≧6 | φ1=0, φ2≠0 | d | L1, 3, L3−3 |
| (3) | L1+L3≧11, L1≧4, L3≧5 | φ1≠0, φ2≠0, φ1<φ2 | c | L1−1, 3, L3−2 |
| (4) | L1+L3≧11, L1≧5, L3≧4 | φ1≠0, φ2≠0, φ1≧φ2 | b | L1−2, 3, L3−1 |
| (5) | L1≧6, L3≧3 | φ1≠0, φ2=0 | a | L1−3, 3, L3 |

FIG. 37

| | CONDITIONS OF L1 AND L3 | CONDITIONS OF φ1 AND φ2 | CORRECTION PATTERN | CORRECTED RUN LENGTH |
|---|---|---|---|---|
| (1) | L3≧6 | NONE | d | L1, 3, L3−3 |
| (2) | L1≧4, L3=5 | NONE | c | L1−1, 3, L3−2 |
| (3) | L1≧5, L3=4 | NONE | b | L1−2, 3, L3−1 |
| (4) | L1≧6, L3=3 | NONE | a | L1−3, 3, L3 |

FIG. 39

| | CONDITIONS OF L1 AND L3 | CONDITIONS OF φ1 AND φ2 | CORRECTION PATTERN | CORRECTED RUN LENGTH |
|---|---|---|---|---|
| (1) | L1+L2+L3≦8 | NONE | d | L1+L2+L3 |
| (2) | L1=3, L3≧5 | NONE | c | 3, 3, L3−2 |
| (3) | L1≧5, L3=3 | NONE | a | L1−2, 3, 3 |
| (4) | L1=4, L3≧5 | φ1=0, φ2≠0 | c | 4, 3, L3−2 |
| | | OTHERS | b | 3, 3, L3−1 |
| (5) | L1≧5, L3=4 | φ1≠0, φ2=0 | a | L1−2, 3, 4 |
| | | OTHERS | b | L1−1, 3, 3 |
| (6) | L1≧5, L3≧5 | φ1=0, φ2≠0 | c | L1, 3, L3−2 |
| | | φ1≠0, φ2≠0 | b | L1−1, 3, L3−1 |
| | | φ1=φ2=0 | | |
| | | φ1≠0, φ2=0 | a | L1−2, 3, L3 |

FIG. 40

| | CONDITIONS OF L1 AND L3 | CONDITIONS OF φ1 AND φ2 | CORRECTION PATTERN | CORRECTED RUN LENGTH |
|---|---|---|---|---|
| (1) | L1+L2+L3<11 | φ1≠0, φ2≠0 | d | L1+L2+L3 |
| (2) | L1≧3, L3≧5 | φ1=0, φ2≠0 | c | L1, 3, L3−2 |
| (3) | L1+L2+L3≧11, L1≧4, L3≧4 | φ1≠0, φ2≠0 | b | L1−1, 3, L3−1 |
| | | φ1=φ2=0 | | |
| (4) | L1≧5, L3≧3 | φ1≠0, φ2=0 | a | L1−2, 3, L3 |

FIG. 41

| | CONDITIONS OF L1 AND L3 | CONDITIONS OF φ1 AND φ2 | CORRECTION PATTERN | CORRECTED RUN LENGTH |
|---|---|---|---|---|
| (1) | L3≧5 | NONE | c | L1, 3, L3−2 |
| (2) | L1≧4, L3=4 | NONE | b | L1−1, 3, L3−1 |
| (3) | L1≧5, L3=3 | NONE | a | L1−2, 3, L3 |

FIG. 43

| | CONDITIONS OF L1 AND L3 | CONDITIONS OF φ1 AND φ2 | CORRECTION PATTERN | CORRECTED RUN LENGTH |
|---|---|---|---|---|
| (1) | L1=3, L3=3 | NONE | c | L1+L2+L3 (=8) |
| (2) | L1=3, L3≧4 | NONE | b | 3, 3, L3−1 |
| (3) | L1≧4, L3=3 | NONE | a | L1−1, 3, 3 |
| (4) | L1≧4, L3≧4 | φ1=0, φ2≠0 | b | L1, 3, L3−1 |
| | | φ1≠0, φ2≠0, φ1<φ2 | b | L1, 3, L3−1 |
| | | φ1≠0, φ2=0 | a | L1−1, 3, L3 |
| | | φ1≠0, φ2≠0, φ1≧φ2 | a | L1−1, 3, L3 |

FIG. 45

| | CONDITIONS OF L1, L2, L3, AND L4 | CONDITIONS OF φ1, φ2, AND φ3 | CORRECTION PATTERN | CORRECTED RUN LENGTH |
|---|---|---|---|---|
| (1) | L1+L2+L3≦11 | φ1≠0, φ2≠0, φ3=0 | c | L1+L2+L3, L4 |
| (2) | L1+L2≦11, L3+L4≦11 | φ1≠0, φ2≠0, φ3≠0 | b | L1+L2, L3+L4 |
| (3) | L2+L3+L4≦11 | φ1=0, φ2≠0, φ3≠0 | a | L1, L2+L3+L4 |
| | | φ1=0, φ2≠0, φ3=0 | | |
| (4) | IF CORRECTED RUN LENGTH IS 11T+11T, THIS CORRECTION IS UNCONDITIONALLY PERFORMED, AND IF NOT, CORRECTION IS DETERMINED BY φ CONDITION | φ2=0 | d | L1+L2−3, 3, 3, L3+L4−3 |

FIG. 46

| | CONDITIONS OF L1, L2, L3, AND L4 | CONDITIONS OF $\phi_1$, $\phi_2$, AND $\phi_3$ | CORRECTION PATTERN | CORRECTED RUN LENGTH |
|---|---|---|---|---|
| (1) | L1+L2+L3≦11 | $\phi_1\neq 0$, $\phi_3=0$ | c | L1+L2+L3, L4 |
| (2) | L1+L2≦11, L3+L4≦11 | $\phi_1\neq 0$, $\phi_2\neq 0$, $\phi_3\neq 0$ | b | L1+L2, L3+L4 |
| (3) | L2+L3+L4≦11 | $\phi_1=0$, $\phi_3\neq 0$ | a | L1, L2+L3+L4 |
| | | $\phi_1=0$, $\phi_3=0$ | | |
| (4) | IF CORRECTED RUN LENGTH IS 11T+11T, THIS CORRECTION IS UNCONDITIONALLY PERFORMED, AND IF NOT, CORRECTION IS DETERMINED BY $\phi$ CONDITION | $\phi_1\neq 0$, $\phi_2=0$, $\phi_3\neq 0$ | d | L1+L2-3, 3, 3, L3+L4-3 |

FIG. 47

| | CONDITIONS OF L2 AND L3 | CONDITIONS OF L1 AND L4 AND φ | CORRECTED RUN LENGTH |
|---|---|---|---|
| (1) | L2+L3=1 | L1≦11, L4≦10 | L1, L4+1 |
| | | L1≦10, L4=11 | L1+1, L4 |
| | | OTHER CONDITIONS | L1, 1, L4 |
| (2) | L2+L3=2 | L1=11, L4≦9 | L1, L4+2 |
| | | L1≦11, L4=9, (φ1,φ2,φ3)≫0 | |
| | | L1=10, L4=10 | L1+1, L4+1 |
| | | L1≦10, L4≦10, (φ1,φ2,φ3)≫0 | |
| | | L1≦9, L4=11 | L1+2, L4 |
| | | OTHER CONDITIONS | L1, 2, L4 |
| (3) | L2+L3=3 | L1=11, L4≦8 | L1, L4+3 |
| | | L1≦10, L4≦9 | L1+1, L4+2 |
| | | L1=9, L4=10 | L1+2, L4+1 |
| | | L1≦8, L4=11 | L1+3, L4 |
| | | OTHER CONDITIONS | L1, 3, L4 |
| (4) | L2+L3=4 | L1=11, L4≦7 | L1, L4+4 |
| | | L1=10, L4=8 | L1+1, L4+3 |
| | | L1=9, L4=9 | L1+2, L4+2 |
| | | L1=8, L4=10 | L1+3, L4+1 |
| | | L1≦7, L4=11 | L1+4, L4 |
| | | OTHER CONDITIONS | L1, 4, L4 |

FIG. 49

| | CONDITIONS OF L1 AND L5 | CONDITIONS OF φ1 AND φ2 | CORRECTION PATTERN | CORRECTED RUN LENGTH |
|---|---|---|---|---|
| (1) | NONE | NONE | — | L1, L2+L3+L4, L5 |

FIG. 51

| | CONDITIONS OF L1 AND L5 | CONDITIONS OF φ1 AND φ2 | CORRECTION PATTERN | CORRECTED RUN LENGTH |
|---|---|---|---|---|
| (1) | NONE | NONE | — | L1, 3, L5 |

FIG. 53

| | CONDITIONS OF L1 AND L5 | CONDITIONS OF φ1 AND φ2 | CORRECTION PATTERN | CORRECTED RUN LENGTH |
|---|---|---|---|---|
| (1) | NONE | NONE | a | L1, L2+L3+L4, L5 |

FIG. 54

| | CONDITIONS OF L1 AND L5 | CONDITIONS OF φ1 AND φ2 | CORRECTION PATTERN | CORRECTED RUN LENGTH |
|---|---|---|---|---|
| (1) | L1+L2+L3+L4−3≦11 | φ1≧φ2 | c | L1+L2+L3+L4−3, 3, L5 |
| (2) | L2+L3+L4+L5−3≦11 | φ1<φ2 | b | L1, 3, L2+L3+L4+L5−3 |
| (3) | OTHERS | NONE | a | L1, L2+L3+L4, L5 |

FIG. 56

| | CONDITIONS OF L2, L3, L4, AND L5 | CORRECTED PATTERN 1 | CORRECTED PATTERN 2 |
|---|---|---|---|
| (1) | (L2+L3+L4+L5) = 2 | 2 | 2 |
| (2) | (L2+L3+L4+L5) = 3 | 3 | 3 |
| (3) | (L2+L3+L4+L5) = 4 | 4 | 2, 2 |
| (4) | (L2+L3+L4+L5) = 5 | 5 | 2, 3 |
| (5) | (L2+L3+L4+L5) = 6 | 6 | 3, 3 |
| (6) | (L2+L3+L4+L5) = 7 | 7 | 3, 4 |
| (7) | (L2+L3+L4+L5) = 8 | 8 | 4, 4 |

FIG. 58

| | CONDITIONS OF L1 AND L3 | CONDITIONS OF $\phi_1$ AND $\phi_2$ | CORRECTION PATTERN | CORRECTED RUN LENGTH |
|---|---|---|---|---|
| (1) | L1<10 | $\phi_1 \neq 0, \phi_2 = 0$ | a | L1+1, 11, L3 |
| | | $\phi_1 \neq 0, \phi_2 \neq 0, \phi_1 \geq \phi_2$ | | |
| (2) | L3<10 | $\phi_1 = 0, \phi_2 \neq 0$ | b | L1, 11, L3+1 |
| | | $\phi_1 \neq 0, \phi_2 \neq 0, \phi_1 < \phi_2$ | | |
| (3) | OTHERS | | – | NOT CORRECTED |

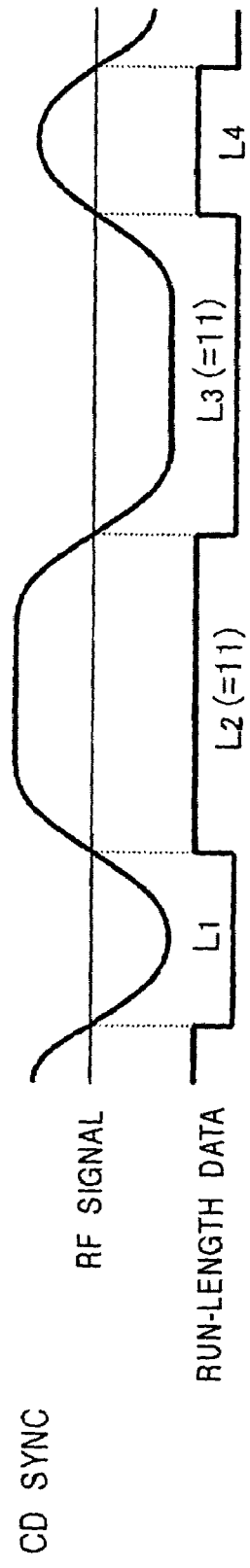
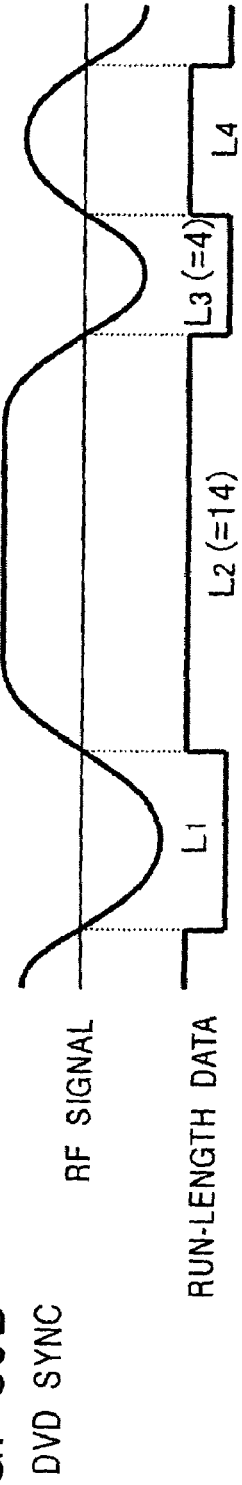
FIG. 59A CD SYNC
FIG. 59B DVD SYNC

FIG. 76

| JITTER METER OF THIS EMBODIMENT ||||| KNOWN JITTER METER ||
|---|---|---|---|---|---|---|
| 1T/16 PHASE CONTROL || 1T/32 PHASE CONTROL |||||
| | PHASE ERROR | AMOUNT OF ERRORS ACCUMULATED | | PHASE ERROR | AMOUNT OF ERRORS ACCUMULATED | PHASE ERROR | AMOUNT OF ERRORS ACCUMULATED |
| CaseI | 0T/16 | 14 | CaseI | 0T/32 | 15 | 0T/8 | 1 |
| | | | CaseI' | 1T/32 | 14 | | |
| CaseJ | 1T/16 | 12 | CaseJ | 2T/32 | 13 | 1T/8 | 1 |
| | | | CaseJ' | 3T/32 | 12 | | |
| CaseK | 2T/16 | 10 | CaseK | 4T/32 | 11 | | |
| | | | CaseK' | 5T/32 | 10 | | |
| CaseL | 3T/16 | 8 | CaseL | 6T/32 | 9 | 2T/8 | 1 |
| | | | CaseL' | 7T/32 | 8 | | |
| CaseM | 4T/16 | 6 | CaseM | 8T/32 | 7 | | |
| | | | CaseM' | 9T/32 | 6 | | |
| CaseN | 5T/16 | 4 | CaseN | 10T/32 | 5 | 3T/8 | 1 |
| | | | CaseN' | 11T/32 | 4 | | |
| CaseO | 6T/16 | 2 | CaseO | 12T/32 | 3 | | |
| | | | CaseO | 13T/32 | 2 | | |
| CaseP | 7T/16 | 0 | CaseO' | 14T/32 | 1 | 4T/8 | 0 |
| | | | CaseP' | 15T/32 | 0 | | |
| CaseA | 8T/16 | 0 | CaseA | 16T/32 | 0 | | |
| | | | CaseA' | 17T/32 | 1 | | |
| CaseB | 9T/16 | 2 | CaseB | 18T/32 | 2 | 5T/8 | 1 |
| | | | CaseB' | 19T/32 | 3 | | |
| CaseC | 10T/16 | 4 | CaseC | 20T/32 | 4 | | |
| | | | CaseC' | 21T/32 | 5 | | |
| CaseD | 11T/16 | 6 | CaseD | 22T/32 | 6 | 6T/8 | 1 |
| | | | CaseD' | 23T/32 | 7 | | |
| CaseE | 12T/16 | 8 | CaseE | 24T/32 | 8 | | |
| | | | CaseE' | 25T/32 | 9 | | |
| CaseF | 13T/16 | 10 | CaseF | 26T/32 | 10 | 7T/8 | 1 |
| | | | CaseF' | 27T/32 | 11 | | |
| CaseG | 14T/16 | 12 | CaseG | 28T/32 | 12 | | |
| | | | CaseG' | 29T/32 | 13 | | |
| CaseH | 15T/16 | 14 | CaseH | 30T/32 | 14 | 0T/8 | 1 |
| | | | CaseH' | 31T/32 | 15 | | |

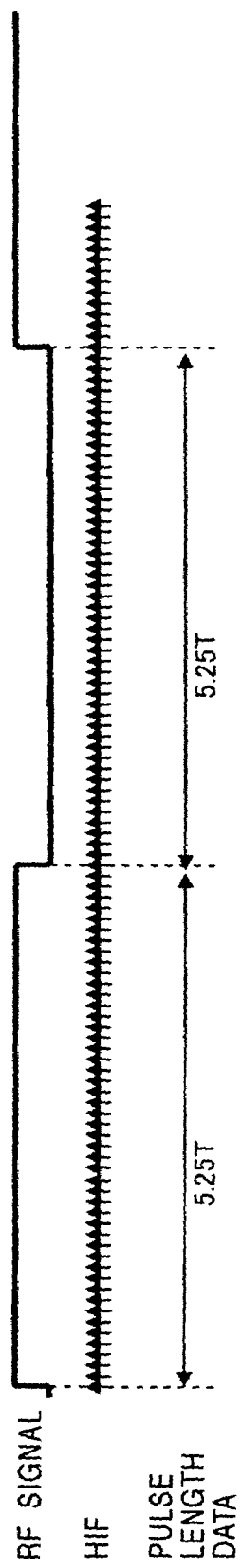
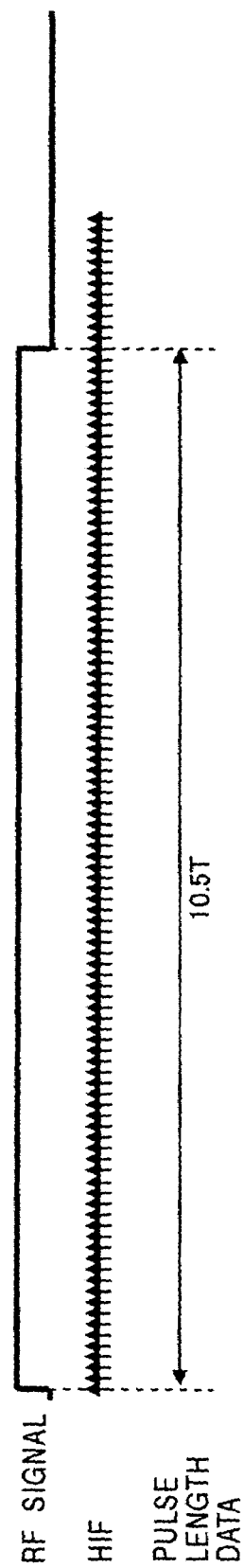

PHASE ERROR DETERMINATION METHOD AND DIGITAL PHASE-LOCKED LOOP SYSTEM

The subject matter of application Ser. No. 10/882,121, is incorporated herein by reference. The present application is a divisional of U.S. Ser. No. 10/882,121, filed Jun. 30, 2004, which claims priority to Japanese Patent Application Number 2003-190302 filed Jul. 2, 2003, all of which are incorporated herein by reference.

BACKGROUND OF THE INVENTION

1. Field of the Invention

The present invention relates to a digital phase-locked loop (PLL) system provided in a playback apparatus, for example, a disk drive, and also to an N-phase clock phase error determination method used in the digital PLL system.

2. Description of the Related Art

As disclosed in, for example, Japanese Unexamined Patent Application Publication Nos. 11-341306 and 9-247137, a digital PLL system is used in a data recording/playback apparatus, such as a disk drive. For playback information read from, for example, a disk, a clock synchronized with the playback information is generated by a PLL circuit, and data is extracted as the playback information (radio frequency (RF) signal) by using this clock.

An example of the configuration of a digital-PLL data extraction system in a disk playback apparatus using, for example, a compact disc (CD) or a digital versatile disk (DVD), is shown in FIG. 84.

In the digital PLL system shown in FIG. 84, a playback RF signal generated by reflected light detected by an optical head of the disk playback apparatus is input, and then, run-length data is generated from the playback RF signal as playback information.

The RF signal is input into an asymmetry correction circuit 61 and is binarized therein. The binarized RF signal is then supplied to a master PLL control circuit 65. By using the binarized RF signal, the master PLL control circuit 65 generates a reference clock which is the same as the frequency of 1T of the RF signal, and outputs the reference clock to a voltage controlled oscillator (VCO) control circuit 66.

The VCO control circuit 66 controls a VCO 67 so that the oscillation frequency of the VCO 67 becomes equal to the reference clock. Under the control of the VCO control circuit 66, the clock (high frequency clock) is output from the VCO 67 as the oscillation output.

A frequency control circuit 68 receives the binarized RF signal and the high frequency clock from the VCO 67. The frequency control circuit 68 then performs sampling by using the binarized RF signal and the high frequency clock so as to detect a difference between the RF signal and the oscillation frequency of the VCO 67.

A phase-control/run-length-determination circuit 62 receives the binarized RF signal, the RF clock of the VCO 67, and a frequency deviation signal from the frequency control circuit 68. By using the frequency deviation signal and the binarized RF signal from the frequency control circuit 68, the phase-control/run-length-determination circuit 62 generates a channel clock synchronized with the RF signal, and then, extracts the run-length data from the RF signal by using this channel clock. The phase-control/run-length-determination circuit 62 also outputs a phase error.

The extracted run-length data and the phase error are supplied to a run-length correction circuit (hereinafter also referred to as the "RLL circuit") 63. The RLL circuit 63 then corrects the run-length data according to the run-length data and the corresponding phase error. The corrected run-length data is supplied to a decode circuit system (not shown) at the subsequent stage.

The phase error is also supplied to a jitter meter 64, and the jitter meter 64 measures the jitter value by using the phase error.

The run-length data from the phase-control/run-length-determination circuit 62 is also supplied to the master PLL control circuit 65.

In the above-described known digital PLL system, the following problems are presented.

In the asymmetry correction circuit 61, it is important that the signal for slicing an analog RF signal be maintained at a correct level. In practice, however, external disturbances are imposed on the signal due to various factors, such as the characteristic of a signal source, the performance of the PLL system, noise in the transmission system, scratches or stains on physical recording media, for example, disk media, or physical reasons, for example, vibration, in which case, the slice level cannot be maintained at a correct level.

Conventionally, a system that feeds back the average of an input signal (RF signal) and setting the average as the slice level when performing asymmetry correction on the RF signal is implemented by an analog circuit. For example, an RF signal is input into a comparator 71 via a capacitor C and resistors R1 and R2, as shown in FIG. 85. The comparator 71 compares the RF signal with a slice level input from an amplifier 73, and outputs a binarized RF signal. The binarized RF signal is averaged in a low-pass filter 72, and is input into the comparator 71 via the amplifier 73 as the slice level.

According to this system, there is no problem when the quality of the input signal (RF signal) is high. However, if the level of the input signal deviates from a correct level due to, for example, an external disturbance, it is very difficult for the analog circuit to quickly respond to the signal deviation and to correct for such a deviation, since the source of the external disturbance is not known.

Additionally, the signal speed varies in a wide range even in the same system. This means that the response speed of the circuit must be controlled according to the signal speed even for the same type of external disturbance. In practice, it is very difficult to construct a system that can respond to such external disturbances by using an analog circuit, and effective measures have not been taken against various types of asymmetry deviations.

A known VCO is provided with only one control terminal. A change in the oscillation frequency with respect to the voltage in the VCO is shown in FIG. 86. In the diagram shown in FIG. 86, the horizontal axis represents the control voltage, while the vertical axis designates the oscillation frequency. In the VCO, the control voltage must oscillate the entire frequency range between VDD and VSS, in which case, the frequency sharply changes in accordance with the voltage change. The frequency change with respect to the voltage change can be represented by $\Delta f1/\Delta V$ in FIG. 86.

If the frequency change with respect to the voltage change is very large, a slight change in the control voltage due to, for example, noise, greatly changes the frequency, thereby influencing the playability (performance) of the circuit.

The time constant of a low-pass filter for the control voltage can be increased so as to suppress a very small change in the control voltage, thereby inhibiting the influence of noise. In this case, however, the oscillation frequency cannot be changed gently.

To lock a PLL with low jitter, the oscillation frequency must smoothly change with respect to a change in the control voltage of the VCO.

Accordingly, it can be considered that a plurality of VCOs optimal for the individual bands are provided and are selectively used. For example, FIG. 87 illustrates the frequency change (vertical axis) with respect to the voltage change (horizontal axis) when four VCOs, i.e., VCO-A, VCO-B, VCO-C, and VCO-D, are used.

The frequency characteristics of VCO-A, VCO-B, VCO-C, and VCO-D are represented by (a), (b), (c), and (d) of FIG. 87.

FIG. 87 shows that the frequency change with respect to the voltage change ($\Delta f2/\Delta V$) is smaller than $\Delta f1/\Delta V$ shown in FIG. 86.

In this method, however, every time the playback speed of a disk medium is changed, the VCO must also be switched, thereby hampering the seamless operation.

In FIG. 87, for example, when the oscillation frequency is changed from 100 MHz to 200 MHz, the point (e) must be changed to the point (f), and thus, VCO-A must be changed to VCO-C, thereby hampering the seamless operation.

In the known digital PLL system shown in FIG. 84, in the frequency control circuit 68 and the phase-control/run-length determination circuit 62, the length of the RF signal is measured by using the high frequency clock obtained in the VCO 67. Accordingly, if there is a fluctuation in the oscillation frequency of the VCO 67, the length of the RF signal cannot be correctly measured, thereby significantly decreasing the playability.

It is desirable that the oscillation frequency of the VCO 67 changes linearly ($\Delta f1/\Delta V$ is constant) with respect to the voltage change, as shown in FIG. 86. In actuality, however, the oscillation frequency change is not linear with respect to the voltage change, as shown in FIG. 88, due to the circuit configuration or the process variations of the VCO. Accordingly, the frequency characteristic has a small gradient, such as $\Delta f3/\Delta V$, and a large gradient, such as $\Delta f4/\Delta V$, as shown in FIG. 88.

If noise is added to the control voltage at a portion of a large gradient, such as $\Delta f4/\Delta V$, the oscillation frequency significantly changes.

Conventionally, no measure has been taken against the non-linearity of the frequency characteristic of the VCO by using a digital circuit.

The master PLL circuit 65 and the VCO control circuit 66 control the VCO 67 so that the oscillation frequency of the VCO 67 coincides with the frequency of 1T of the RF signal (4.3218 MHz×n(speed) for a CD, and 26.16 MHz×n(speed) for a DVD).

However, when a disk is started or if the disk is an eccentric disk, there is a temporal frequency deviation between the RF signal and the oscillation frequency of the VCO 67. There are two types of frequency deviations.

One type of frequency deviation occurs when the playback speed of a disk is significantly changed due to the start of the rotation of the disk or a long track jump. In this case, the RF signal and the VCO frequency, which are totally out of phase with each other (unlocking state), must be in phase with each other (locking state).

The other type of frequency deviation occurs because of an eccentric disk or a fluctuation of a spindle motor for rotating a disk. In the case of an eccentric disk, a frequency deviation occurs when the RF signal frequency gradually becomes out of phase with the VCO frequency. In the case of a fluctuation of the spindle motor, a frequency deviation occurs when motor-control wow flutter influences the length of the RF signal.

To handle such frequency deviations, a wide capture range and a lock range are provided for the PLL system, thereby ensuring a high level of linearity of the frequency characteristics.

When the above-described frequency deviation occurs, it must be detected in a certain way. Conventionally, a frequency deviation is detected by using only pulse length data generated by measuring a binarized RF signal with a high frequency clock.

However, if the pulse length data is 10.5T, it cannot be determined whether 10T measures more or 11T measures less. Accordingly, ambivalent pulse length data must be set to be a dead zone.

FIGS. 89A and 89B illustrate cases where the same frequency deviation occurs in different pulse lengths. In FIG. 89A, since the pulse length data measures, 5.25T, it can be determined that the pulse length data 5T measures more. In FIG. 89B, however, since the pulse length data measures, 10.5T, it cannot be determined whether the pulse data 10T measures more or 11T measures less.

FIGS. 89A and 89B show that the frequency deviation produces a greater influence larger pulse data, and thus, larger pulse data must have a longer dead zone.

However, if the dead zone is increased, the number of pulse length data from which frequency deviations can be recognized is decreased, thereby decreasing the speed in recognizing the frequency deviation.

In order to increase the range of frequency deviations that can be detected, small pulse length data from which frequency deviations can be correctly recognized must be used. The RF signal is, as shown in FIG. 90, an analog signal having certain gradients, and the amplitude varies according to the pulse length data. The small pulse length data is vulnerable to the influence of external disturbances since the amplitude of the RF signal is small. Thus, the reliability of measured frequency deviations also becomes low.

When playing back information according to a known technique, a channel clock synchronized with a binarized RF signal is generated in a digital PLL. The binarized RF signal and the channel clock are shown in (a) and (b) of FIG. 19. To match the phase and the frequency of the RF signal and the channel clock, the digital PLL scales the high frequency clock (Hif) by 7.5, 8.0, and 8.5 while also using the reverse edges of the high frequency clock (Hif) so as to lead or lag the phase, as shown in FIG. 20, thereby generating a channel clock.

The operating frequency of a digital PLL when playing back, for example, a DVD at ×1, is 209.28 MHz, which is 8 times as high as the channel clock 26.16 MHz required for ×1 DVD. The operating frequency of a digital PLL when playing back a DVD at ×20 is 4.185 GHz, which is 20 times as high as 209.28 MHz. It is difficult to generate a frequency of 4 GHz or higher by an existing CMOS process. Even if such a high frequency is generated, the fast operation increases power consumption, decreases the life of LSIs, or decreases the yield of LSIs since they do not satisfy the specifications.

For increasing the playability by using a known technique, the resolution of the channel clock can be increased. However, this further increases the frequency of the high frequency clock, and thus, fast playback operation cannot performed.

When playing back a CD or a DVD, run-length data which does not exist is sometimes read due to factors, such as noise, scratches on a disk, or a defective disk.

In the known RLL circuit 63, among data having an inversion interval of 3T to 11T, only data having a minimum inversion interval less than 3T is corrected, and corrections are conducted by comparing the level of run-length data before and after incorrect data or by comparing the level of phase errors. In this correction method, run-length data less than 3T is merely erased or expanded (for example, 2T, which does not exist, is expanded to 3T, which is the minimum inversion interval). Thus, correction is not based on the type of incorrect run-length data.

No considerations are taken for correcting continuous run-length data which does not comply with the format. Accordingly, the reliability of corrections is low.

Additionally, no corrections are conducted on run-length data exceeding 1T, and thus, drawbacks by such large run-length data cannot be overcome.

No considerations are taken for sync patterns, and a pseudo sync is sometimes generated accidentally by corrections, thereby decreasing the playability.

The jitter meter 64 in a known circuit generates a jitter value by determining whether the phase error measured with the high frequency clock is 0 or 1. This is because measurements of binary values are difficult due to a high operating frequency even if the playback speed of a disk is low. In the known jitter meter 64, measurements at a speed exceeding ×8 for a CD or ×1.6 for a DVD is not possible.

Additionally, phase errors are not directly used for determining a jitter value, and instead, they are merely replaced by a simple signal representing the presence or the absence of errors. Accordingly, there is no correlation between jitter values measured with a commercially available jitter meter and data output from the jitter meter 64.

As described above, there are various problems unique to known digital PLL systems, a digital PLL system that can solve the above-described problems and also a testing method for ensuring suitable operation in such a digital PLL system are demanded.

SUMMARY OF THE INVENTION

Accordingly, it is an object of the present invention to achieve a fast playback operation and to exhibit excellent playability by implementing a digital PLL system in a disk playback apparatus by using a novel algorithm, and also to provide a suitable testing method for such a digital PLL system.

In order to achieve the above object, a phase error determination method for N phase clocks according to the present invention is used in a digital PLL system which includes: a clock generator for generating a reference clock based on the frequency of an input signal and the frequency of run-length data so as to generate the N phase clocks by using the reference clock; a pulse-length measuring device for measuring the pulse length of a playback signal generated by binarizing the input signal by using the N phase clocks so as to output pulse-length data; and a run-length extracting device for extracting run-length data by counting the pulse-length data with a virtual channel clock. The phase error determination method includes the steps of: inputting a signal asynchronous with the N phase clocks as the input signal; detecting the number of changing points of the asynchronous signal during an interval between adjacent clocks of the N phase clocks; and determining phase errors of the N phase clocks from the detected number of changing points.

Another phase error determination method for N phase clocks according to the present invention is also used in the above-described digital PLL system. The phase error determining method includes the steps of: inputting a signal synchronized with the N phase clocks as the input signal; detecting the timing relationship between changing points of the synchronized signal and each clock of the N phase clocks; and determining phase errors of the N phase clocks from the detected timing relationship.

In the above-described phase error determination method, the synchronized signal may be generated by selecting and scaling one of the N phase clocks, and the timing relationship between the changing points of the synchronized signal and each clock of the N phase clocks may be detected while sequentially switching the clock to be selected.

A digital PLL system of the present invention includes: a clock generator for generating a reference clock based on the frequency of an input signal and the frequency of run-length data so as to generate N phase clocks by using the reference clock; a pulse-length measuring device for measuring the pulse length of a playback signal, which is generated by binarizing the input signal, by using the N phase clocks so as to output pulse-length data; a run-length extracting device for extracting run-length data by counting the pulse-length data with a virtual channel clock; an input selector for selecting a signal asynchronous with the N phase clocks or a signal synchronized with the N phase clocks as the input signal; and a changing-point detector for detecting changing points of the input signal selected by the input selector in relation to each clock of the N phase clocks.

In the above-described digital PLL system, the changing-point detector may detect the number of changing points of the asynchronous signal during an interval between adjacent clocks of the N phase clocks.

Alternatively, the changing-point detector may detect the timing relationship between the changing points of the synchronous signal and each clock of the N phase clocks.

The digital PLL system may further include a clock selector for selecting one of the N phase clocks; and a synchronized-signal generator for generating the synchronized signal by scaling the clock selected by the clock selector.

In the digital PLL system of the present invention, instead of measuring a binarized input signal (playback signal) with a high frequency clock, pulse-length data is generated by using N phase clocks (for example, 16 phase clocks) having the same frequency as, for example, that of 1T of the playback signal. In other words, it is not necessary to generate a high frequency clock in a PLL.

The pulse-length data is counted with a virtual channel clock, which is not an actual clock, so as to extract run-length data. That is, in a known PLL, a channel clock synchronized with a playback signal is generated so as to determine the length T of the playback signal. In contrast, in the present invention, the number of Ts is determined from the pulse-length data of the playback signal.

By using the N phase clocks, a seamless playback operation can be performed on disks from a low speed to a high speed (for example, about ×0.5 to ×48 for a CD, and about ×0.5 to ×16 for a DVD) while keeping the internal operating frequency low.

Additionally, a two-terminal control VCO is used. More specifically, a rough control terminal and a fine control terminal are provided for controlling the VCO. With this arrangement, the capability of seamlessly following a fluctuation in the time domain of an RF signal can be enhanced while suppressing the influence of noise added to control voltages.

Because of the measurements of the pulse-length with a 1/N precision by the N phase clocks, the pulse length of the playback signal can be measured with higher precision.

By decreasing the operating frequency compared to that in a known digital PLL, the life and yield of an LSI implementing the present invention can be improved.

In the above-configured digital PLL system, it is demanded that phase differences of the N phase clocks be maintained at uniform to enhance the playability. Accordingly, a signal asynchronous with the N phase clocks is input as the input signal, and the number of changing points of the asynchronous signal in an interval between adjacent clocks of the N phase clocks is detected. In this case, if there is no phase error, the numbers of changing points between the clocks should be uniform. Thus, by checking the numbers of changing points of the asynchronous signal between the clocks, constant phase errors of the N phase clocks can be determined.

Also, as the input signal, a signal synchronized with the N phase clocks is input so as to detect the timing relationship between the changing points of the synchronized signal and each clock of the N phase clocks. If there is no fluctuation due to jitter, the timing relationship between the changing points of the synchronized signal and the individual clocks is fixed. Thus, by checking the timing relationship, a fluctuation in the clock phases due to jitter can be determined.

According to the above-described methods, phase errors of the N phase clocks can be easily and suitably determined.

In practice, a logic tester can be used for checking the values of the changing points, thereby reducing the cost for the test and also enhancing the efficiency of the test.

The digital PLL system of the present invention can be integrated into a chip. Thus, phase error determination can be facilitated without the need to add a special device or circuit to a logic tester.

BRIEF DESCRIPTION OF THE DRAWINGS

FIGS. 8A through 9B illustrate measurements of pulse lengths in this embodiment;

FIGS. 10A through 11B illustrate phase differences of 16 phase clocks in this embodiment;

FIGS. 12A, 12B, and 12C illustrate frequency deviations between an RF signal and a VCO frequency in this embodiment;

FIGS. 34 through 37 illustrate examples of corrections for a single error (0T) in this embodiment;

FIGS. 38 through 41 illustrate examples of corrections for a single error (1T) in this embodiment;

FIGS. 42 and 43 illustrate example of corrections for a single error (2T) in this embodiment;

FIGS. 44 through 47 illustrate examples of corrections for two consecutive errors in this embodiment;

FIGS. 48 through 54 illustrate examples of corrections for three consecutive errors in this embodiment;

FIGS. 55 and 56 illustrate examples of corrections for four or more consecutive errors in this embodiment;

FIGS. 57 and 58 illustrate examples of corrections for a 12T error in this embodiment;

FIGS. 59A and 59B illustrate sync patterns;

FIG. 76 illustrates phase error conversion by a jitter meter of this embodiment and a known jitter meter;

FIGS. 89A and 89B illustrate the influence of a frequency deviation on the pulse length.

DESCRIPTION OF THE PREFERRED EMBODIMENTS

Figure 1:
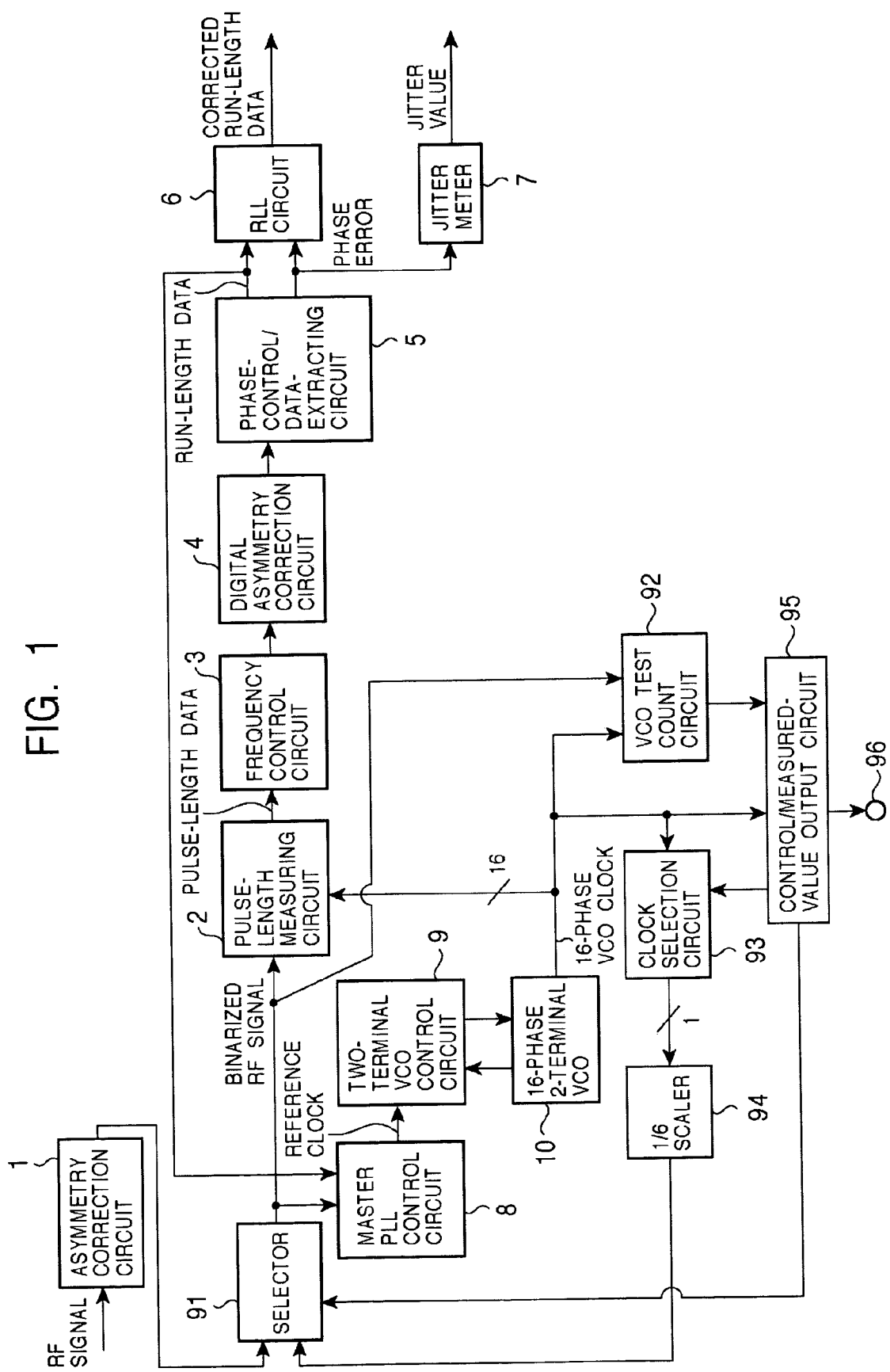
FIG. 1 is a block diagram illustrating a digital PLL system according to an embodiment of the present invention.

The present invention is described in detail below with reference to the accompanying drawings through illustration of preferred embodiments.

Details of a digital PLL system according to the present invention are given first, and then a 16-phase clock phase error determination method is described. The present invention is discussed below in the following order.
1. Overall configuration of digital PLL system
2. Pulse-length measuring circuit
3. Frequency control circuit
4. Digital asymmetry correction circuit
5. Clock-phase-control/run-length-generating circuit
6. RLL circuit
7. Two-terminal control VCO
8. Jitter meter
9. Advantages of digital PLL system
10. Phase error determination of 16-phase VCO
   1. Overall Configuration of Digital PLL System The overall configuration of a digital PLL system according to an embodiment of the present invention is described below with reference to FIG. 1.

The digital PLL system shown in FIG. 1 is provided in a disk (for example, CD or DVD) playback apparatus. In this digital PLL system, a playback RF signal, which is generated based on reflected light detected by an optical head of the playback apparatus, is input, and run-length data is obtained from the playback RF signal as playback information.

The digital PLL system includes, as shown in FIG. 1, an asymmetry correction circuit 1, a pulse-length measuring circuit 2, a frequency control circuit 3, a digital asymmetry correction circuit 4, clock-phase-control/run-length-data extracting circuit (hereinafter sometimes referred to as the "phase-control/data-extracting circuit") 5, a run-length correction circuit (hereinafter referred to as the "RLL circuit") 6, a 16-phase two-terminal VCO 10, a master PLL control circuit 8, a two-terminal VCO control circuit 9, a jitter meter 7, a selector 91, a VCO test count circuit 92, a clock selection circuit 93, a ⅙ scaler 94, and a control/measured-value output circuit 95.

The elements represented by reference number beginning with 9, i.e., the selector 91, the VCO test count circuit 92, the clock selection circuit 93, the ⅙ scaler 94, and the control/measured-value output circuit 95, are used for determining phase errors of 16 phase clocks: an explanation of the elements is given later when describing a phase error determination method, and is not given here in the description of the configuration and operation of the digital PLL system. Under normal PLL operation, the selector 91 selects the output from the asymmetry correction circuit 1.

A playback RF signal supplied via an optical pickup or a matrix computation circuit of the disk playback apparatus is input into the asymmetry correction circuit 1, and is binarized therein.

The binarized RF signal is then input into the pulse-length measuring circuit 2. Upon receiving 16 clocks from the 16-phase 2-terminal VCO 10, the pulse-length measuring circuit 2 measures the pulse length of the RF signal in a built-in measuring circuit by using the 16 clocks, and outputs the resulting pulse-length data to the frequency control circuit 3.

The pulse-length data obtained in the pulse-length measuring circuit 2 is measured to be longer or shorter than the actual length due to a frequency deviation between the 1T frequency of the RF signal and the 16 phase clocks supplied from the 16-phase 2-terminal VCO 10.

Accordingly, the frequency control circuit 3 detects a frequency deviation from the pulse-length data, corrects the pulse-length data for the frequency deviation, and then outputs the corrected pulse-length data to the digital asymmetry correction circuit 4.

The digital asymmetry correction circuit 4 detects an asymmetry deviation from the pulse-length data, corrects the pulse-length data for the asymmetry deviation, and then outputs the corrected pulse-length data to the phase-control/data-extracting circuit 5.

The phase-control/data-extracting circuit 5 generates a virtual channel clock, counts the pulse-length data with the virtual channel clock, and sets the counted value as the run-length data. The phase-control/data-extracting circuit 5 also extracts phase errors.

The run-length data and the phase errors are output to the RLL circuit 6. The RLL circuit 6 corrects the run-length data that does not comply with the format, based on the run-length data and the phase errors extracted by the phase-control/data-extracting circuit 5.

The phase errors are also supplied to the jitter meter 7, and the jitter meter 7 measures jitter contained in the RF signal based on the phase errors.

The 16-phase 2-terminal VCO 10 is controlled by the master PLL control circuit 8 and the two-terminal VCO control circuit 9.

The master PLL control circuit 8 receives the binarized RF signal and the run-length data from the phase-control/data-extracting circuit 5, and generates a reference clock from the RF signal and the run-length data.

The oscillation frequency of the reference clock is the same as or a multiple of the 1T frequency of the RF signal (4.3218 MHz×n(speed) for a CD, and 26.16 MHz×n(speed) for a DVD). By using this reference clock, the two-terminal VCO control circuit 9 performs control so that the frequency of the reference clock coincides with the frequency of the 16-phase two-terminal VCO 10. That is, the two-terminal VCO control circuit 9 performs control so that the frequency of the VCO is the same as or a multiple of the frequency of the RF signal. In this embodiment, it is assumed that the frequency of the VCO is equal to the frequency of the RF signal, except in the "nTap Model", which is discussed below.

In the digital PLL system configured as described above, because the circuit uses the 16-phase 2-terminal VCO 10 and a novel algorithm, it is possible to provide a PLL that can seamlessly perform a playback operation on disks from a low speed to a high speed (for example, about ×0.5 to ×48 for a CD, and about ×0.5 to ×16 for a DVD) while keeping the internal operating frequency low.

In a known PLL, a channel clock synchronized with an RF signal is generated to determine the length of T. In contrast, by using the novel algorithm, the number of Ts is determined from the pulse-length data of an RF signal. That is, the length of T is not measured by using a high frequency clock, in other words, a high frequency clock for measuring the length of T is not generated, and instead, 16 phase clocks, each being equivalent to 1T of the RF signal, are used.

Additionally, by processing the pulse-length data as digital data, excellent playability can be exhibited and a high-precision jitter meter can be obtained.

Details of the elements forming the digital PLL system, i.e., the pulse-length measuring circuit 2, the frequency control circuit 3, the digital asymmetry correction circuit 4, the phase-control/data-extracting circuit 5, the RLL circuit 6, the 16-phase 2-terminal VCO 10, the two-terminal VCO control circuit 9, and the jitter meter 7 are discussed in turn below.

2. Pulse-Length Measuring Circuit

The pulse-length measuring circuit 2 measures pulse-length data of an RF signal by using a digital PLL at a low operating frequency.

The pulse-length measuring circuit 2 performs sampling on the RF signal with a precision of T/16 per 1T for 16 times, which is one set of sampling operations, and repeats a plurality of sets, thereby measuring the pulse-length data.

To achieve the same level of precision in a known algorithm, sampling must be performed by using a clock which toggles 1T 16 times. Then, the frequency of the clock itself becomes very high. Accordingly, the following method can be used for measuring the pulse-length data of the RF signal at a low operating frequency.

Figure 2:
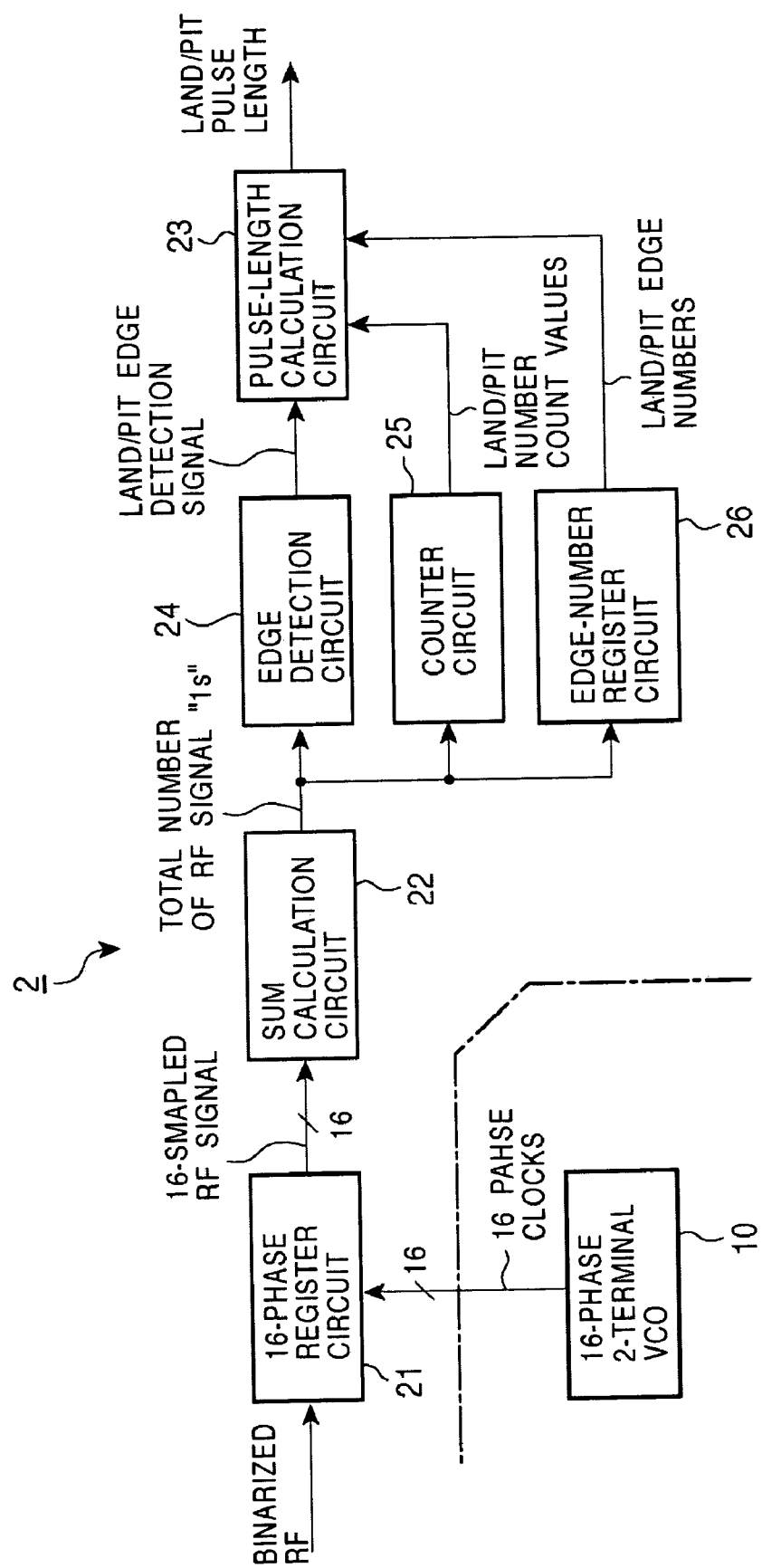
FIG. 2 is a block diagram illustrating a pulse-length measuring circuit 2 shown in FIG. 1.

The schematic circuit configuration of the pulse-length measuring circuit 2 is shown in FIG. 2.

The pulse-length measuring circuit 2 includes a 16-phase register circuit 21, a sum calculation circuit 22, an edge-detection circuit 24, a counter circuit 25, an edge-number register circuit 26, and a pulse-length calculation circuit 23.

The binarized RF signal supplied from the asymmetry correction circuit 1 to the pulse-length measuring circuit 2 represents the polarities of lands and pits on a disk recording track. A description is given below, assuming that 0 designates pits, and 1 represents lands. As is known, data is recorded on the disk in the form of pits, and lands are portions located between pits in the track direction (areas without pits).

Figure 16:
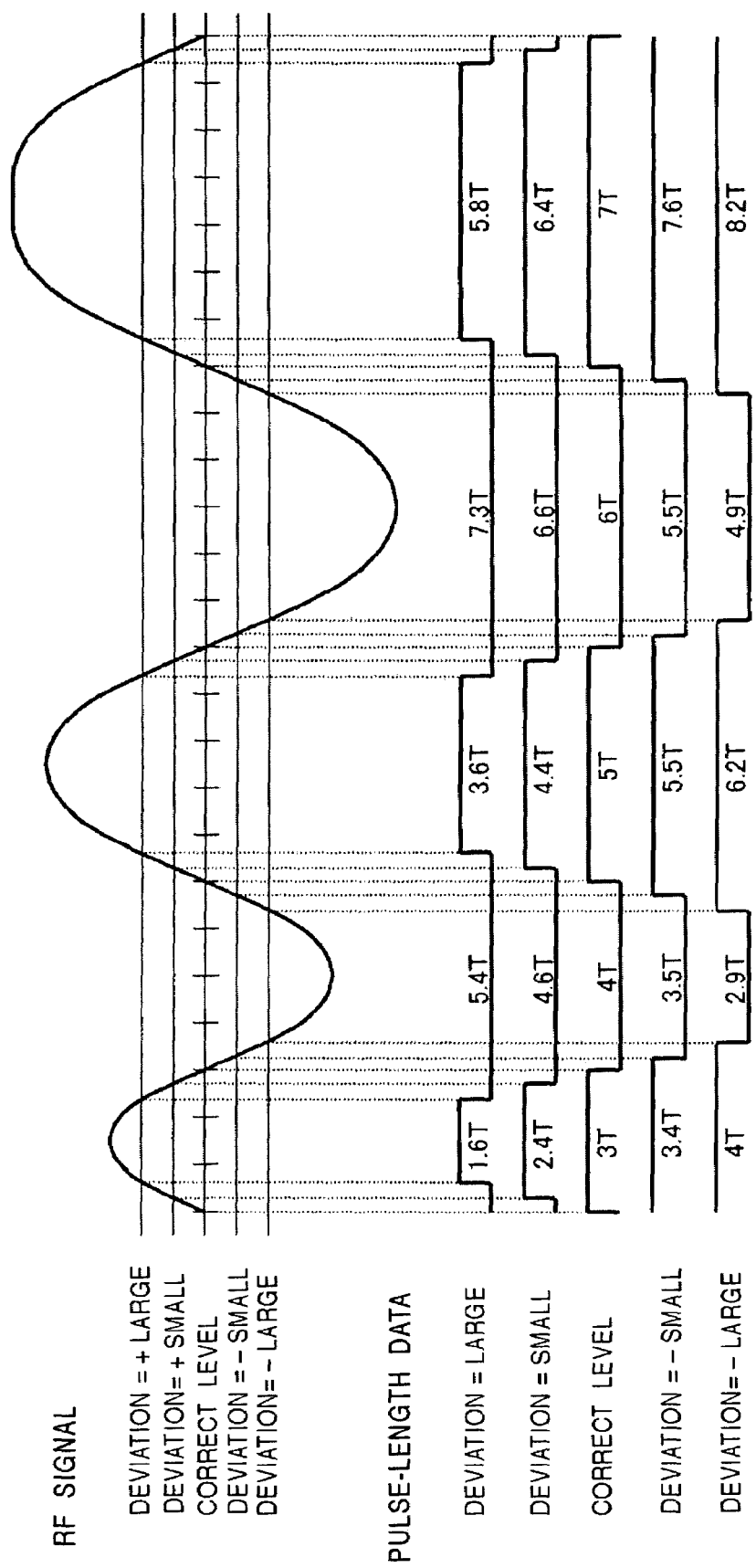
FIG. 16 illustrates the influence of asymmetry deviation on the binarization of an RF signal.

The binarized RF signal is supplied to the 16-phase register circuit 21 shown in FIG. 2, and 16 phase clocks from the 16-phase two-terminal VCO 10 are also supplied to the 16-phase register circuit 21. As stated above, the 16-phase 2-terminal VCO 10 is controlled by the master PLL control circuit 8 and the two-terminal VCO control circuit 9 such that the frequency of the RF signal and the frequency of the VCO coincide with each other.

Figure 4:
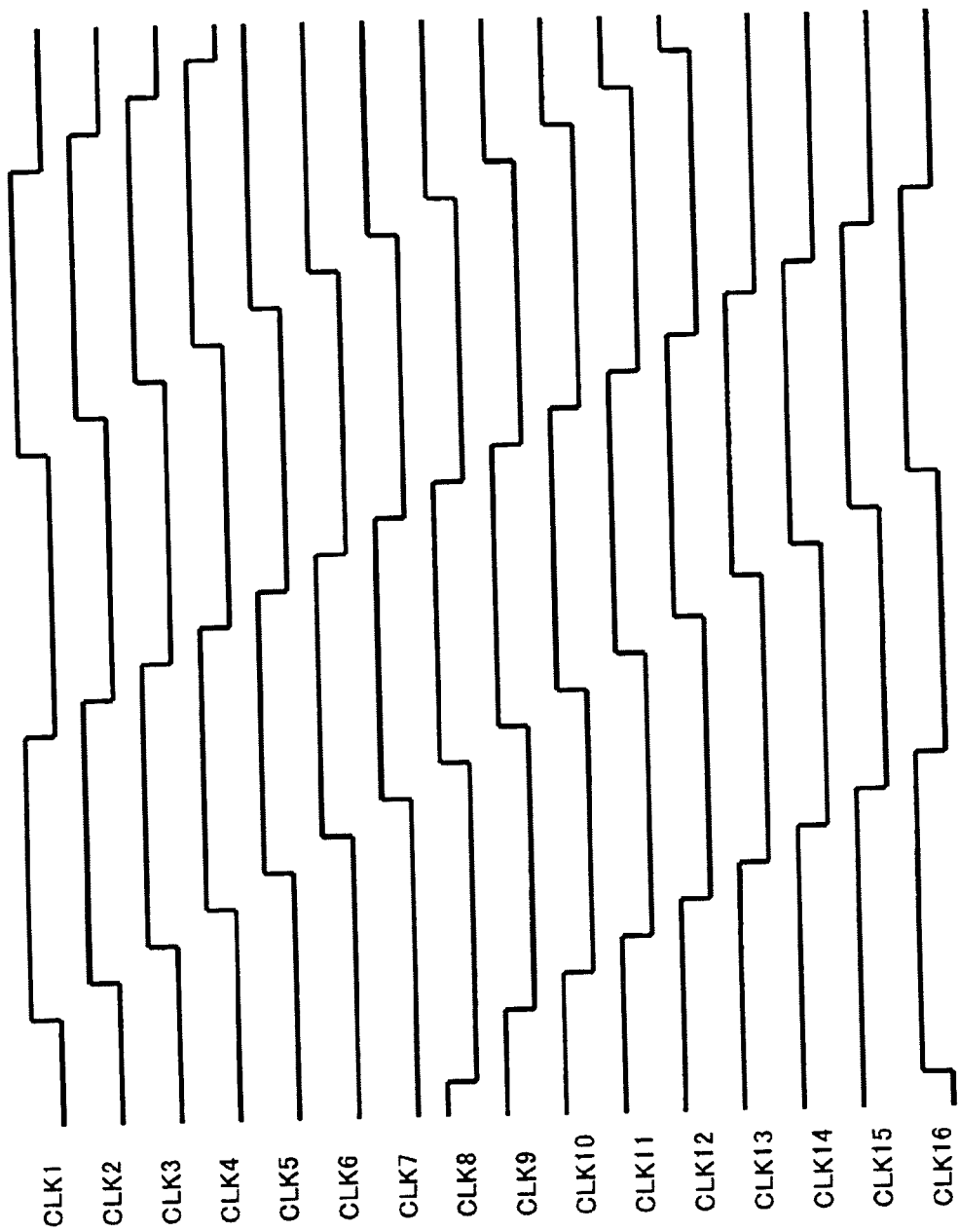
FIG. 4 is a waveform diagram illustrating 16 phase clocks in this embodiment.

The 16 clocks (16 phase clocks) output from the 16-phase 2-terminal VCO 10 are clocks each having a phase difference of 1/16 the cycle of the VCO, as indicated by CLK1 through CLK16 shown in FIG. 4.

Figure 5:
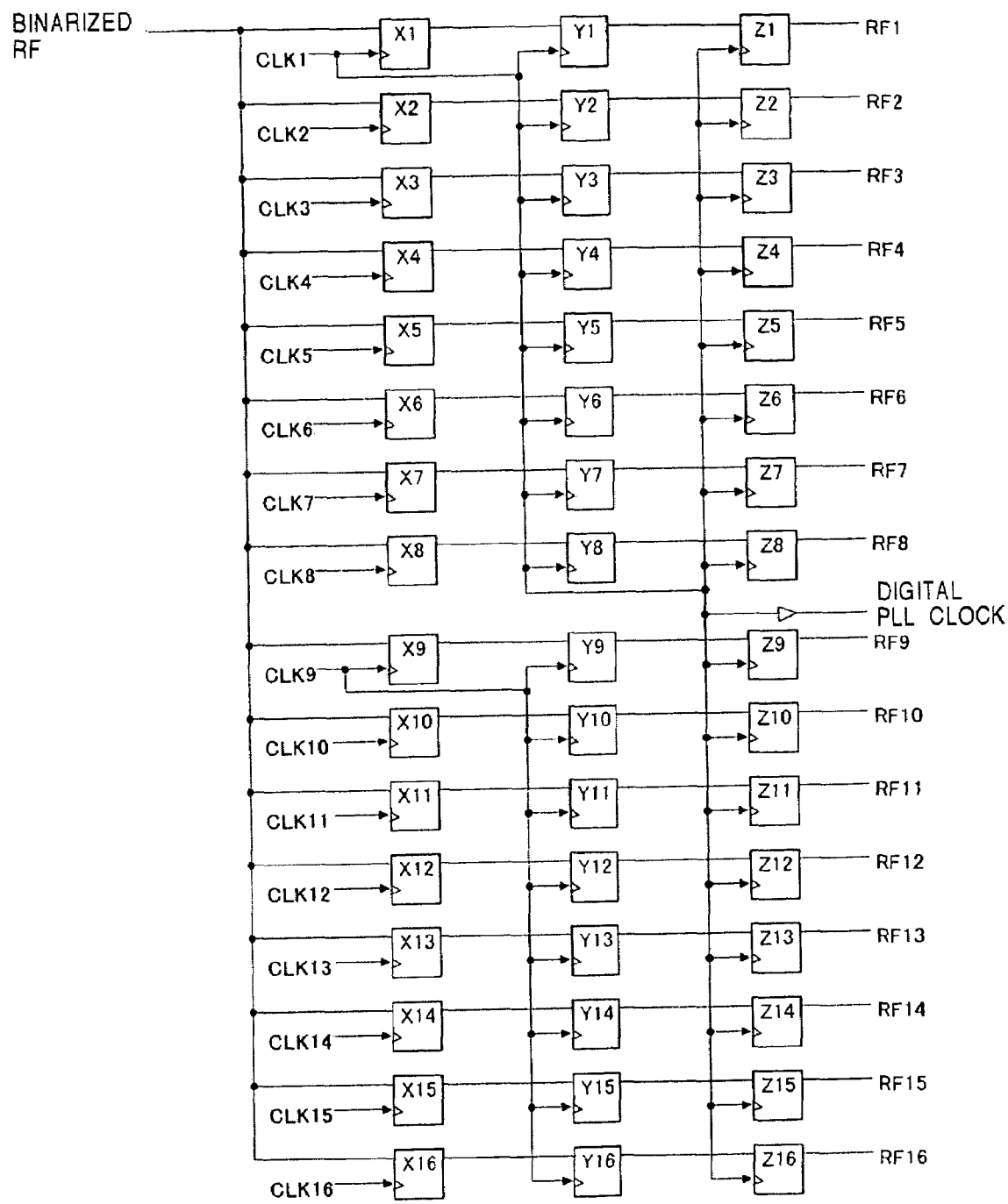
FIG. 5 is a block diagram illustrating a 16-phase register circuit in this embodiment.

The 16-phase register circuit 21 to which the 16 phase clocks are supplied is configured as shown in FIG. 5. The 16-phase register circuit 21 includes first-stage registers X1 through X16, second-stage registers Y1 through Y16, and third-stage registers Z1 through Z16. The 16 phase clocks CLK1 through CLK16 are input into the clock terminals of the first-stage registers X1 through X16.

Accordingly, the binarized RF signal is supplied to the first-stage registers X1 through X16 in synchronization with the 16 phase clocks CLK1 through CLK16. That is, the binarized RF signal is latched by the first-stage registers X1 through X16, thereby performing sampling on the RF signal for a 1T cycle with a precision of T/16 for 16 times.

The clock CLK1 is input into the clock terminals of the second-stage registers Y1 through Y8, while the clock CLK9 is input into the clock terminals of the second-stage registers Y9 through Y16.

The clock CLK1 is input into the clock terminals of the third-stage registers Z1 through Z16. Based on the input of the clocks described above, the second-stage registers Y1 through Y16 and the third-stage registers Z1 through Z16 latch the RF signal.

The RF signal subjected to sampling in the first-stage registers X1 through X16 is ultimately latched by using the clock CLK1 (hereinafter sometimes referred to as "MSCK") of the 16 phase clocks, and is output as data RF1 through RF16 while being synchronized with the clock MSCK. The clock MSCK is used as the clock of the digital PLL system in this embodiment.

The RF signal (RF1 through RF16) output from the 16-phase register circuit 21 is input into the sum calculation circuit 22.

A process for determining the status of the 1T cycle (hereinafter referred to as the "MSCK cycle") of the input RF signal (RF1 through RF16) by the sum calculation circuit 22 is described below with reference to FIG. 3.

Figure 3:
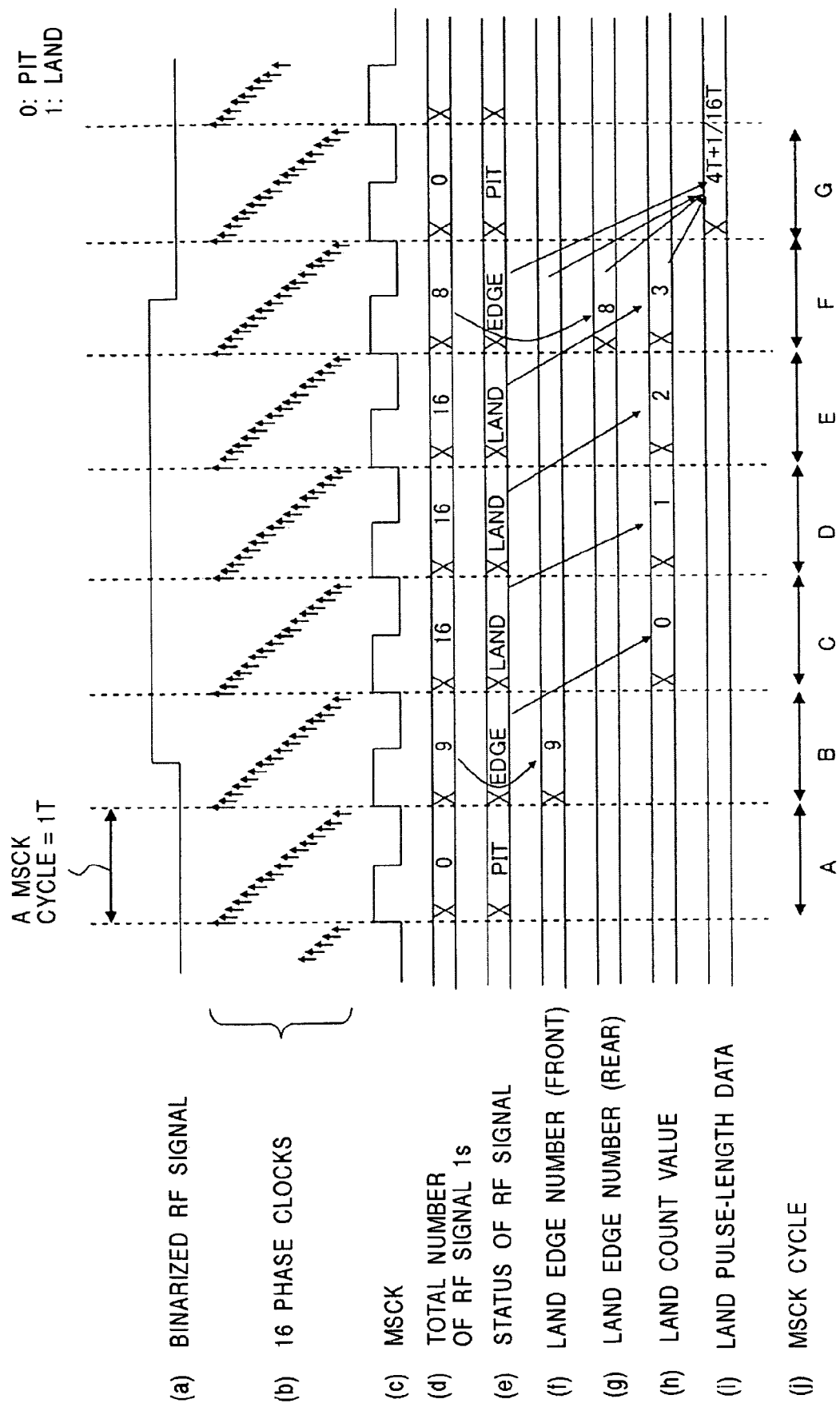
FIG. 3 illustrates a run-length data generating process in this embodiment.

Upon receiving the RF signal (RF1 through RF16) subjected to sampling in the 16-phase register circuit 21, the sum calculation circuit 22 sums the number of 1s of the RF signal (RF1 through RF16) sampled 16 times in each SCK cycle shown in (j) of FIG. 3, and outputs the calculated number as the value shown in (d) of FIG. 3.

The binarized RF signal is shown in (a) of FIG. 3, and is subjected to sampling in the 16-phase register circuit 21 by using the 16 phase clocks indicated in (b) of FIG. 3. As stated above, the clock MSCK is output as shown in (c) of FIG. 3.

In the sum calculation circuit 22, to sum the number of is of the RF signal (RF1 through RF16) in every MSCK cycle, the total number is first set to be 0, for example, in the MSCK cycle A in FIG. 3. That is, in the MSCK cycle A, the binarized RF signal is at level L, and all the RF signal components RF1 through RF16 are 0. In the MSCK cycle B, the total number of 1s is 9. That is, in the MSCK cycle B, the level of the binarized RF signal is shifted from L to H, and the second half of the RF signal components, i.e., RF8 through RF16, are changed to 1.

As shown in (d) of FIG. 3, the total number of 1s of the RF signal components (RF1 through RF16) in each MSCK cycle is output. Accordingly, the number of land components in each MSCK cycle can be set in a range from (0T/16) to (16T/16).

In the pulse-length calculation circuit 2 configured as shown in FIG. 2, the number determined in the sum calculation circuit 22 is processed in each MSCK cycle, thereby calculating the pulse length.

The status of the RF signal determined from the number indicated in (d) of FIG. 3 is shown in (e) of FIG. 3.

For example, in the MSCK cycle C in FIG. 3, the total number of 1s of the RF signal indicated in (d) of FIG. 3 is 16T/16. Accordingly, there are lands for 1.0T in the MSCK cycle C, and the status of the RF signal in the MSCK cycle C is thus determined to be "LAND".

In the MSCK cycle A, since the total number of 1s of the RF signal indicated in (d) of FIG. 3 is 0T/16, there are pits for 1.0T in the MSCK cycle A, and the status of the RF signal in the MSCK cycle A is determined to be "PIT".

As in the MSCK cycles B and F, when the total number of 1s of the RF signal indicated in (d) of FIG. 3 is 1T/16 to 15T/16, there are land components and pit components, in which case, there is an edge between a pit and a land adjacent to each other. In this case, the status of the RF signal in such a cycle is determined to be "EDGE".

The data (d) and (e) in FIG. 3, i.e., the total number of 1s and the status information of the RF signal, are output from the sum calculation circuit 22 to the edge detection circuit 24, the counter circuit 25, and the edge-number register circuit 26.

The edge detection circuit 24 is discussed below. The pulse-length data of lands or pits can be determined by measuring the length from an edge to the next edge. Accordingly, the pulse-length measuring circuit 2 must detect an edge between a land and a pit from the RF signal, and this detection is assigned to the edge detection circuit 24 within the pulse-length measuring circuit 2.

The edge detection circuit 24 detects edges by the transition of the status of the RF signal.

When the status of the RF signal indicated in (e) of FIG. 3 changes as "LAND"→"PIT", "PIT"→"LAND", "LAND"→"EDGE"→"PIT", or "PIT"→"EDGE"→"LAND", the edge detection circuit 24 determines that there is an edge in the RF signal.

For example, the status of the RF signal changes as "PIT"→"EDGE"→"LAND" in the MSCK cycles A→B→C in FIG. 3. Accordingly, the edge detection circuit 24 can determine that there is an edge in the MSCK cycle B.

Then, in the MSCK cycle E→F→G, the status of the RF signal changes as "LAND"→"EDGE"→"PIT", and the edge detection circuit 24 can determine that there is an edge in the MSCK cycle F.

Figure 6:
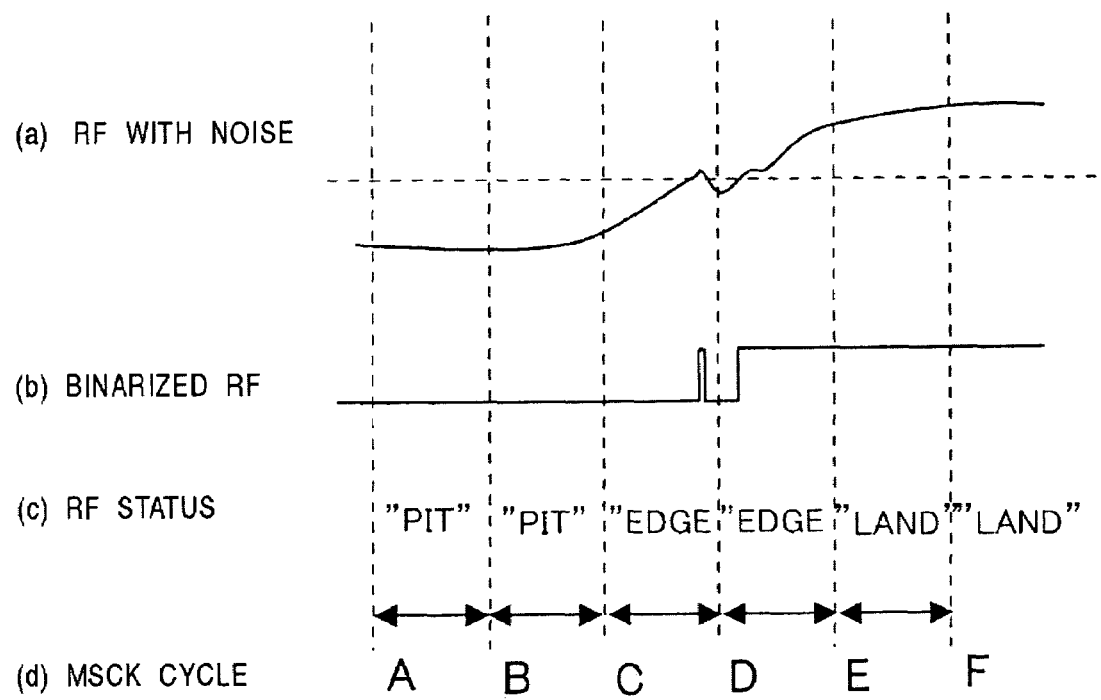
FIG. 6 illustrates edge detection when noise occurs in this embodiment.

The edge detection pattern when noise occurs in the RF signal is shown in FIG. 6. When noise occurs in the RF signal, as indicated in (a) of FIG. 6, the binarized RF signal is represented by (b) of FIG. 6, and the status of the RF signal is designated by (c) of FIG. 6.

In this case, the status of the RF signal changes as "PIT"→"EDGE"→"EDGE"→"LAND" in the MSCK cycle B→C→D→E in (d) of FIG. 6. In this manner, the edge detection circuit 24 can detect edges based on the transition of the status even in the occurrence of noise.

The counter circuit 25 counts the number of lands or pits between edges of the RF signal so as to measure the pulse-length data of lands and pits.

The land count value is shown in (h) of FIG. 3. When the edge detection circuit 24 detects an edge from a pit to a land, the counter circuit 25 sets the land count value to 0, and increments the land count value by one every time the status of the RF signal indicates "LAND".

Accordingly, as indicated in (h) of FIG. 3, when the edge detection circuit 24 detects an edge from a pit to a land, the land count value is set to 0 in the MSCK cycle C. Then, since the status of the RF signal in the MSCK cycles C, D, and E is "LAND", the land count value is incremented by one in each cycle. That is, the pulse-length data of lands without edges can be measured.

When an edge from a land to a pit is detected in the MSCK cycle F, the land count value is determined.

Counting of pits is performed similarly to counting of lands described above, though it is not shown.

More specifically, when the edge detection circuit 24 detects an edge from a land to a pit, the counter circuit 25 sets the pit count value to 0, and then increments the pit count value by one every time the status of the RF signal indicates "PIT". When an edge from a pit to a land is detected, the pit count value is determined.

The edge-number register circuit 26 is now discussed below. In FIG. 3, the pulse-length data of lands is determined by the sum of land components in the edges in the MSCK cycles B and F and lands in the MSCK cycles C, D, and E. Accordingly, the land components in the MSCK cycles B and F must be retained. Then, the edge-number register circuit 26 retains land components contained in edges.

For example, as indicated in (f) in FIG. 3, the total number 9 of is of the RF signal in the MSCK cycle B is retained as the edge number at the front edge of lands. As indicated in (g) of FIG. 3, the total number 8 of 1s of the RF signal in the MSCK cycle F is retained as the edge number at the rear edge of lands.

When the status of the RF signal consecutively indicates "EDGE" due to the occurrence of noise in the RF signal, as shown in FIG. 6, the edge-number register 26 retains land components contained in the two edges as the total number of 1s.

The pit edge number is retained similarly to the land edge number.

The total number 7 of 0s of the RF signal in the MSCK cycle B in FIG. 3 is retained as the edge number at the rear edge of pits, and the total number 8 of 0s of the RF signal in the MSCK cycle F is retained as the edge number at the front edge of pits.

Since the pit edge number can be obtained by subtracting the land edge number from 16, it does not have to be retained separately from the land edge number.

In this manner, a land/pit edge detection signal is output from the edge detection circuit 24, land/pit count values are output from the counter circuit 25, and land/pit edge numbers are output from the edge-number register circuit 26, and they are supplied to the pulse-length calculation circuit 23.

The pulse-length calculation circuit 23 calculates the land/pit pulse-length data from the land/pit count values from the counter circuit 25 and the land/pit edge numbers from the edge-number register circuit 26.

More specifically, as shown in (i) of FIG. 3, the land pulse-length data is determined by adding the land edge numbers (9 in (f) of FIG. 3), the land count value (3 in (h) of FIG. 3), and the land edge numbers (8 in (g) of FIG. 3).

That is, the land pulse length can be determined by the following equation.

Land front edge number+land count value+land rear edge number=land pulse-length data In the example of FIG. 3, the land pulse-length data can be expressed by:

$$9T/16+3T+8T/16=4T+1T/16.$$

The resulting value is output as the land pulse-length data. The pit pulse-length data can be calculated similarly.

The pulse-length measuring circuit 2 configured as shown in FIG. 2 generates land/pit pulse-length data for the binarized RF signal as described above, and outputs the data to the frequency control circuit 3.

The pulse-length measuring circuit 2 is provided with an nTap Mode. The provision of this mode is to solve the problem of the non-linearity of the oscillation frequency characteristic of a VCO, which is discussed in the related art.

The nTap Mode used in this embodiment is as follows.

In the digital PLL system of this embodiment, the oscillation frequency of the VCO is controlled to be equal to the frequency of the RF signal as stated above.

As discussed below in a description of the two-terminal VCO control circuit 9, the fine control voltage (hereinafter referred to as "VCF") of the 16-phase 2-terminal VCO 10 is controlled to be VDD/2. Accordingly, the oscillation frequency ($\Delta f/\Delta V$) of the VCO with respect to VCF is uniquely determined from the frequency of the RF signal.

Figure 7:
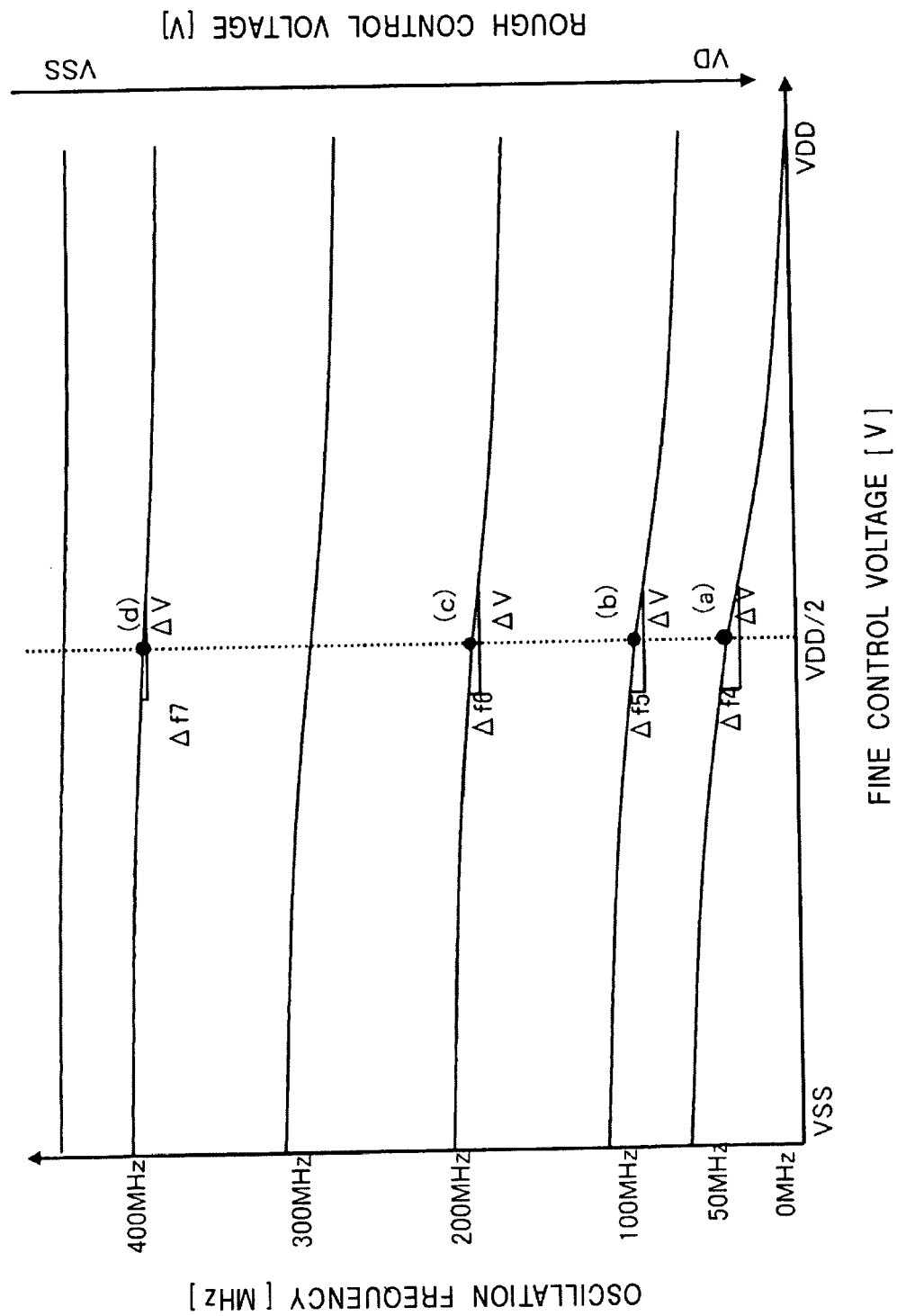
FIG. 7 illustrates characteristics of a two-terminal control VCO in this embodiment.

The frequency characteristic of the VCO used in the digital PLL system of this embodiment is shown in FIG. 7. The horizontal axis represents VCF, the left vertical axis designates the oscillation frequency, and the right vertical axis designates the rough control voltage (hereinafter referred to as "VCR"). FIG. 7 shows that the gradient ($\Delta f/\Delta V$) when VCF is VDD/2 is not uniform, depending on the value of VCR.

For example, the gradient (a) when the oscillation frequency of the VCO is 50 MHz is $\Delta f4/\Delta V$. The gradient (b) when the oscillation frequency of the VCO is 100 MHz is $\Delta f5/\Delta V$. By comparing the two gradients, the gradient (b) $\Delta f5/\Delta V$ is found to be smaller than the gradient (a) $\Delta f4/\Delta V$. The gradients (c) and (d) are even smaller than the gradient (b).

In this VCO, when the frequency of the RF signal is higher, an occurrence of noise in VCF does not seriously influence the playability. However, when the frequency of the RF signal is lower, an occurrence of noise in VCF considerably influences the playability. Accordingly, the influence of noise on the playability when the frequency is lower must be suppressed.

As stated above, when measuring the pulse-length data of the RF signal, the RF signal is latched by 16 phase clocks of the 16-phase two-terminal VCO 10. In the nTap Mode, the frequency of the VCO is multiplied by 2, 4, 8, and 16 of the RF signal, and then, the RF signal is latched by using some of the 16 phase clocks, thereby determining the pulse-length data.

In this method, the oscillation frequency of the VCO is increased so that the gradient $\Delta f/\Delta V$ becomes smaller, thereby inhibiting the influence of noise. Details are given below with reference to FIGS. 8A through 9B.

FIG. 8A illustrates the measured pulse-length data when the oscillation frequency of the VCO is equal to the frequency of the RF signal. In FIG. 8A, the RF signal is subjected to sampling by using the 16 phase clocks CLK1 through CLK16 so as to measure the pulse-length data. The resulting pulse-length data is 2T+14T/16.

If the oscillation frequency of the VCO is doubled, as shown in FIG. 8B, to determine the pulse-length data of the RF signal, the pulse-length data measures 5T+12T/16, which is twice as long as the pulse-length data shown in FIG. 8A.

Figure 9A:
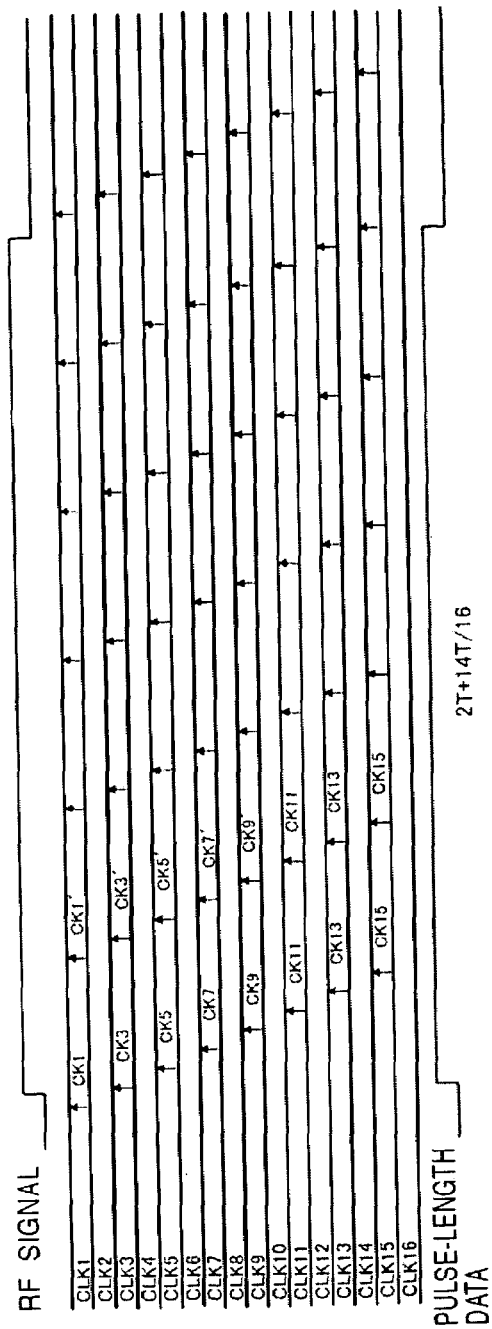

Then, if the pulse-length data is determined by using only odd-numbered clocks (CLK1, CLK3, CLK5, ..., CLK15) of the 16 clocks, as shown in FIG. 9A, the pulse-length data of the RF signal results in 2T+14T/16, which is the same length as that shown in FIG. 8A. A 1T cycle of the RF signal is subjected to sampling 16 times at the rising edges of CK, CK1', CK3, CK3', ..., CK15, CK15'. As MSCK, the 1/2 scaling clock of CLK1 is used.

In this manner, by doubling the frequency of the VCO and by using every other clock for measuring the pulse-length data, the pulse-length data of the RF signal can be correctly measured.

Figure 9B:
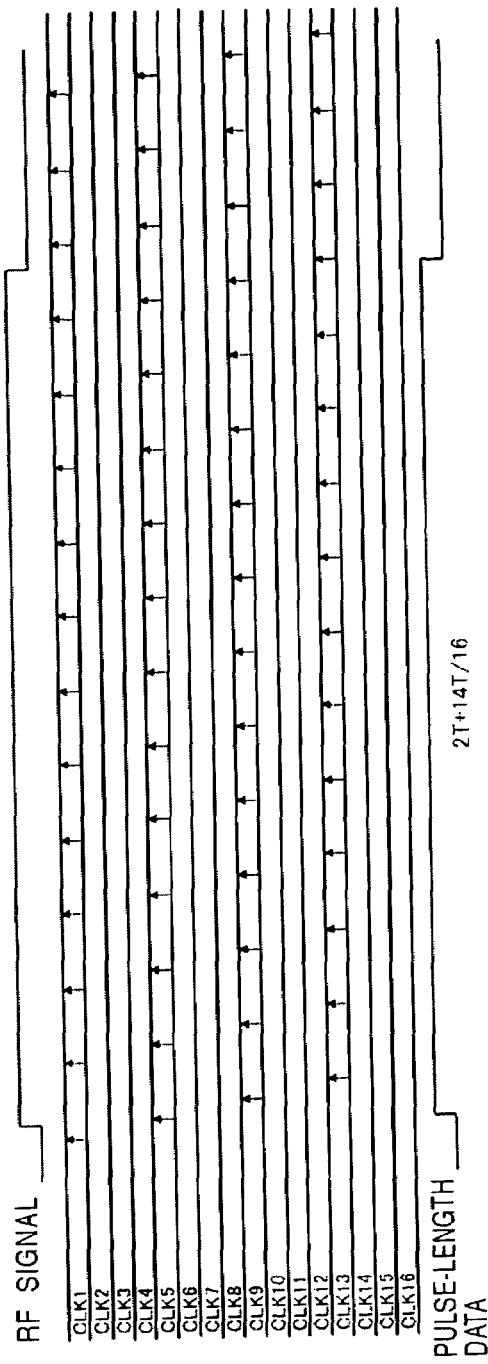

When the frequency of the VCO is increased four times, as shown in FIG. 9B, the pulse-length data can be correctly measured by using only four clocks CLK1, CLK5, CLK9, and CLK13. Similarly, when the frequency of the VCO is increased eight times, the pulse-length data can be correctly measured by using only two clocks CLK1 and CLK9. When the frequency of the VCO is increased 16 times, the pulse-length data can be correctly measured by using only one clock CLK1.

When the frequency of the RF signal is 50 MHz, the frequency of the VCO can be increased eight times to 400 MHz (small gradient $\Delta f7/\Delta V$) shown in (d) of FIG. 7 rather than to 50 MHz (large gradient $\Delta f4/\Delta V$) shown in (a) of FIG. 7. This makes it possible to decrease the oscillation frequency $\Delta f/\Delta V$ with respect to the control voltage, thereby suppressing the influence of noise occurring in the control voltage on the playability.

As shown in FIG. 10A, the 16 phase clocks of the 16-phase two-terminal VCO 10 are designed to have a uniform phase difference. For some reasons, however, the phase differences of the 16 clocks sometimes become non-uniform, as shown in FIG. 10B.

In this case, the pulse-length data of the RF signal cannot be correctly measured. However, when the frequency of the VCO is doubled, as stated above, only the odd-numbered clocks are used. Thus, even if the phase of CLK2 or CLK4 deviates from the ideal state, the measurement of the pulse-length data is not influenced. When the frequency of the VCO is increased 16 times, only the clock CLK1 is used. Accordingly, as long as the phase of CLK1 is correct, the pulse-length data can be correctly measured even if the phase differences of the other clocks deviate from the ideal state.

Phase differences of CLK1 deviating from the ideal state by 50%, as shown in FIGS. 11A and 11B, are now considered. The oscillation frequencies of the VCO in FIGS. 11A and 11B are 50 MHz and 100 MHz, respectively. FIGS. 11A and 11B show that, even though the phase differences deviate by the same percentage, i.e., 50%, the absolute deviation is smaller when the oscillation frequency is higher (FIG. 11B).

Thus, in the nTap Mode, the influence of a relative phase error in a clock used for measuring the pulse-length data can be suppressed, and thus, the RF signal can be read correctly.

3. Frequency Control Circuit 3-1 Frequency Deviation

As discussed above, the frequency control circuit 3 detects a frequency deviation from the pulse-length data supplied from the pulse-length measuring circuit 2 so as to correct the pulse-length data for the frequency deviation.

The definition of the frequency deviation is as follows. When there is a difference between the frequency of the VCO and the frequency of the RF signal, the resulting pulse-length data changes, as shown in FIGS. 12A, 12B, and 12C.

FIG. 12A illustrates a case where the frequency of the VCO coincides with the ideal RF signal for 3T; FIG. 12B illustrates a case where the frequency of the VCO is higher than the RF signal by 2%; and FIG. 12C illustrates a case where the frequency of the VCO is lower than the RF signal by 2%.

When the two frequencies coincide with each other, as shown in FIG. 12A, the pulse-length data correctly measures 3T (3T+0/16T).

However, when the frequency of the VCO is higher than the frequency of the RF signal, as shown in FIG. 12B, the pulse-length data measures more (3T+1/16T).

Conversely, when the frequency of the VCO is lower than the frequency of the RF signal, the pulse-length data measures less (2T+15/16T).

Accordingly, when the input pulse-length data more frequently measures more, it can be determined that the frequency of the VCO becomes higher than the frequency of the RF signal. Conversely, when the input pulse-length data more frequently measures less, it can be determined that the frequency of the VCO becomes lower than the frequency of the RF signal.

3-2 Algorithm for Correcting Frequency Deviation

3-2-1 Method for Detecting Frequency Deviation in Input Pulse-Length Data

A description is given below of a method for detecting the amount by and direction in which the frequency of each item of input pulse-length data is deviated, i.e., how much the frequency of the VCO becomes higher or lower than the RF signal.

Figure 13A:
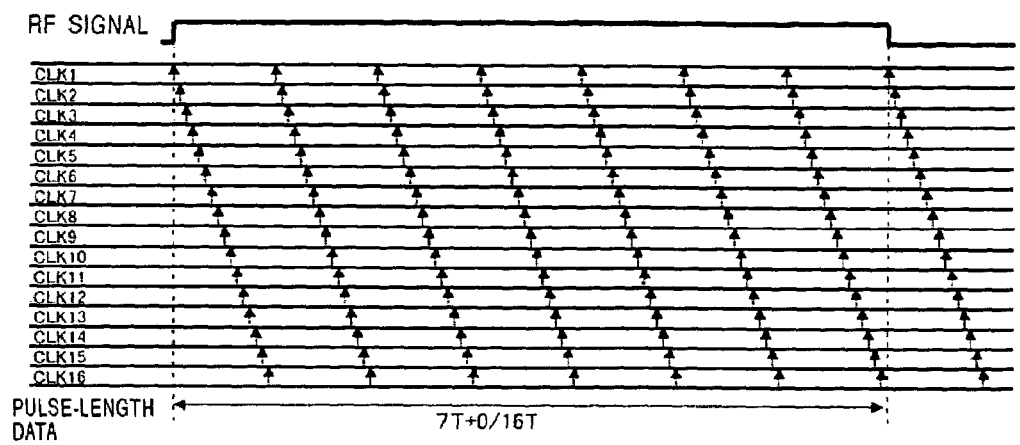
FIGS. 13A, 13B, and 13C illustrate pulse-length data when frequency deviation between an RF signal and a VCO frequency occurs in this embodiment.
Figure 13B:
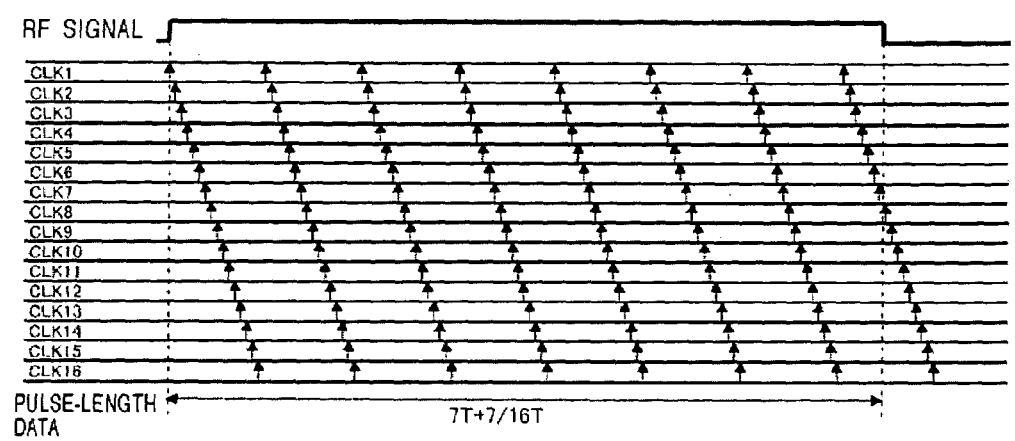
Figure 13C:
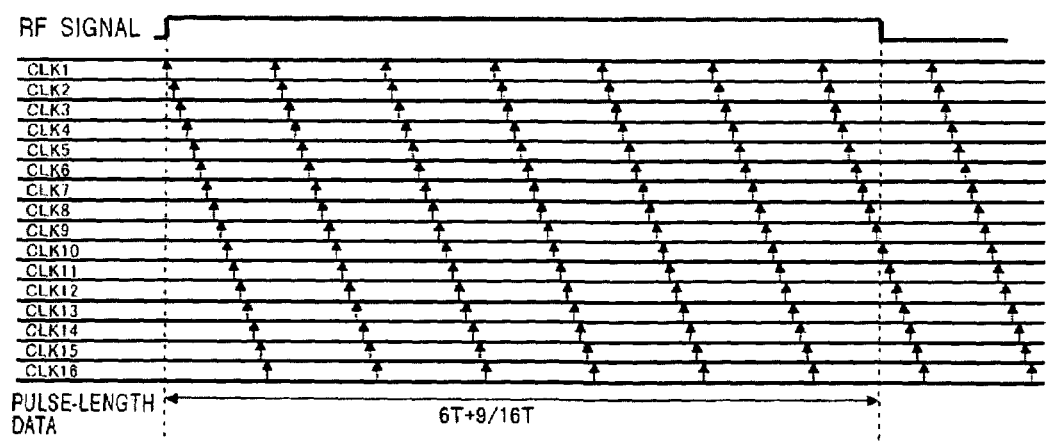

To discuss the method for detecting a frequency deviation, examples of the pulse-length data of the RF signal are shown in FIGS. 13A, 13B, and 13C.

FIG. 13A illustrates a case where the VCO frequency coincides with the frequency of the RF signal for 7T. In this ideal state, i.e., when the frequency of the RF signal is exactly the same as the frequency of the VCO, the pulse length becomes an integer (7T+0/16T).

However, when the frequency of the VCO becomes higher or lower than the frequency of the RF signal, the resulting pulse-length data has edge components. Because of the structure of the digital PLL, information indicating the polarity of a frequency deviation between the RF signal and the frequency of the VCO is not given. It is thus necessary to determine the direction of a frequency deviation from the input pulse length according to a certain algorithm. In this algorithm, the value of the overall frequency deviation calculated as discussed in the subsequent section, "3-2-2 Method for detecting the overall frequency deviation", is used.

FIG. 13B illustrates a case where the frequency of the VCO becomes higher than the frequency of the RF signal by 6%. In this case, the pulse length measures 7T+7/16T, and it cannot be determined whether 8T measures less because the frequency of the VCO becomes lower, or 7T measures more because the frequency of the VCO becomes higher.

However, if the value of the overall frequency deviation contains information that the frequency of the VCO is higher by 5%, it can be determined that the 7T measures more, 7T+7/16T, because the frequency of the VCO becomes higher. The frequency deviation of this pulse-length data can be calculated as (7T+7/16T)/7T=7.4375/7≈6.3%.

FIG. 13C illustrates a case where the frequency of the VCO becomes lower than the frequency of the RF signal by 6%. In this case, the pulse-length data measures 6T+9/16T, and it cannot be determined only from the pulse-length data in which direction the frequency is deviated, as in the case of FIG. 13B. If the value of the overall frequency deviation contains information that the frequency of the VCO is lower by 5%, 7T measures less, 6T+9/16T, because the frequency of the VCO becomes lower. The frequency deviation of this pulse-length data can be calculated as (6T+9/16T)/7T=6.5625/7≈−6.2%.

As described above, by using the pulse length and the value of the overall frequency deviation, the frequency deviation of the input pulse-length data can be detected.

3-2-2 Method for Detecting the Overall Frequency Deviation

When calculating the frequency deviation of each item of input pulse-length data, the overall frequency deviation can be determined. However, even if there is no frequency deviation, it is sometimes determined that the input-pulse data has a frequency deviation due to jitter or an accidental error. As a measure to overcome this drawback, noise components, for example, jitter, are removed by allowing each input pulse-length data to pass through an infinite impulse response (IIR) digital filter, thereby calculating the amount and the direction of the overall frequency deviation. The time constant of the IIR digital filter can be externally controlled. Accordingly, the time constant can be increased to suppress the influence of noise, and conversely, the time constant can be decreased to increase the recognition speed of the frequency deviation.

3-2-3 Method for Correcting Frequency Deviation

The amount by which a frequency deviation should be corrected can be determined by the input pulse-length data, the overall frequency deviation, and the direction of the frequency deviation.

Figure 14A:
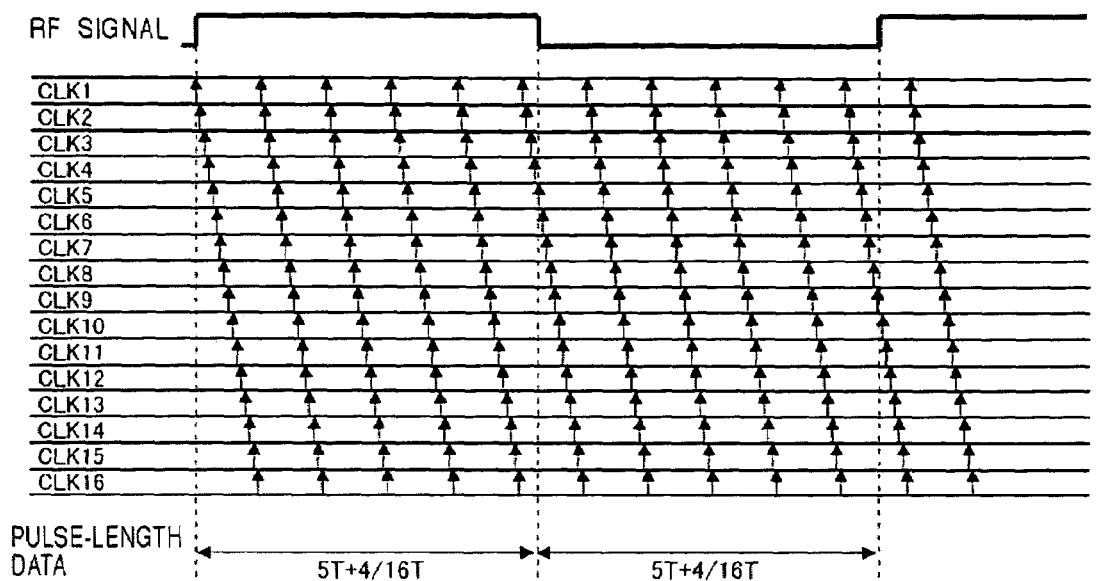
FIGS. 14A and 14B illustrate the influence of frequency deviation on pulse lengths.
Figure 14B:
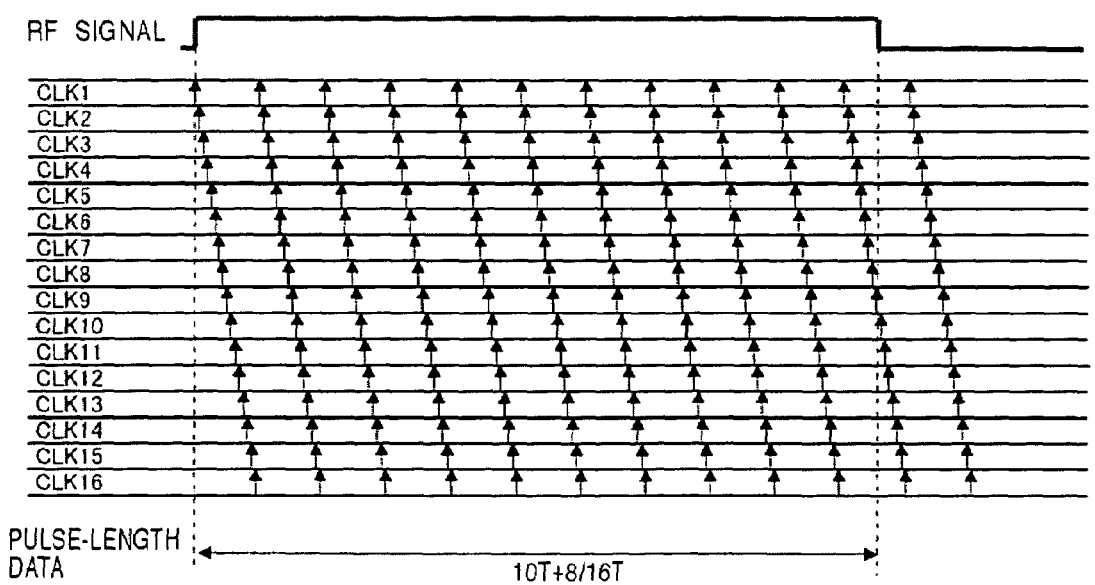

When the frequency of the VCO is higher than the frequency of the RF signal by 5%, the RF signal of 5T measures 5T+4T/16, as shown in FIG. 14A, and the RF signal of 10T measures 10T+8T/16, as shown in FIG. 14B.

However, the actual pulse-length data has a fluctuation, that is, 5T+3T/16 and 5T+5T/16, due to noise, for example, jitter.

The object of the frequency control circuit 3 is to correct input pulse-length data only for frequency deviation components, and thus, the influence of external disturbances is ignored. That is, the amount by which the frequency deviation should be corrected can be determined only by calculations from the overall frequency deviation. For example, when the frequency of the VCO is higher than the frequency of the RF signal by 5%, the amount of correction is −4T/16 when the pulse-length data is 5T, and the amount of correction is −8T/16 when the pulse-length data is 10T.

4. Digital Asymmetry Correction Circuit

4-1 Asymmetry Deviation

As discussed above, the digital asymmetry correction circuit 4 detects an asymmetry deviation from pulse-length data so as to correct the pulse-length data.

The definition of asymmetry deviation is as follows. An example of a mechanism generating an asymmetry deviation due to defects in an optical signal is shown in FIG. 15.

Figure 84:
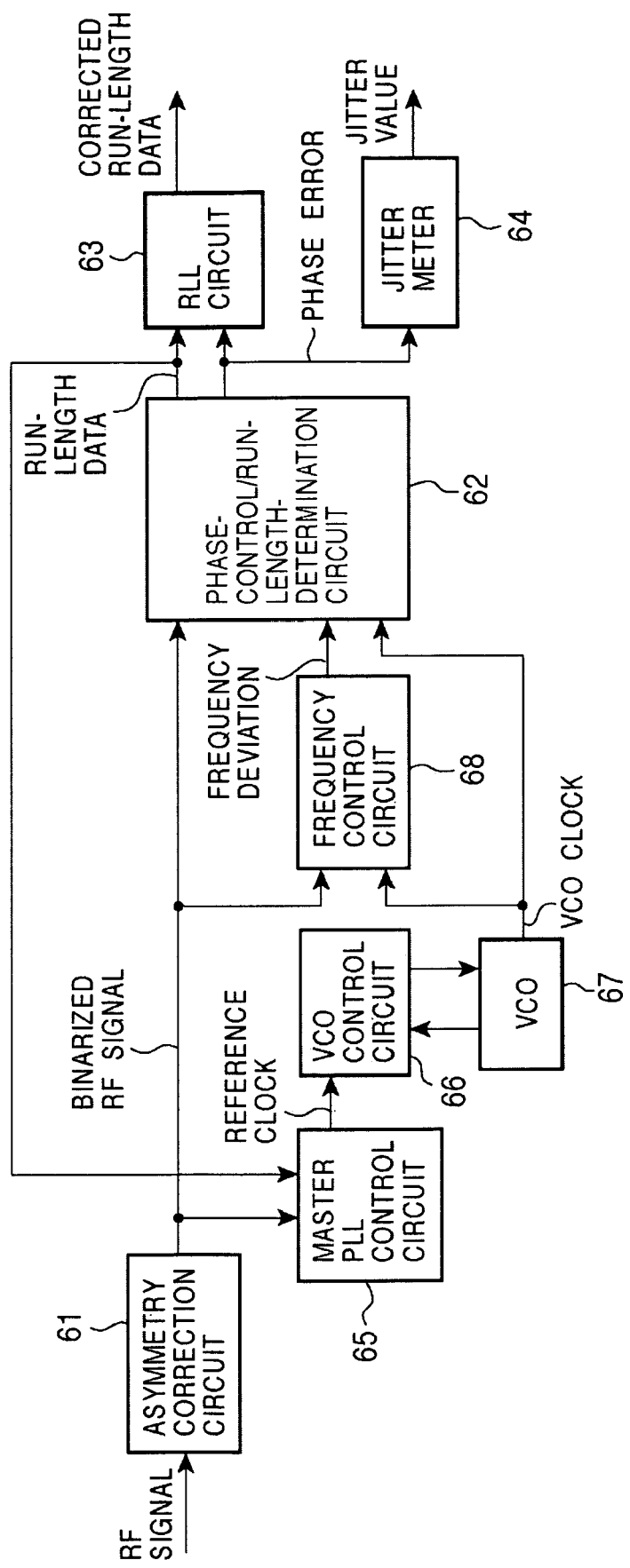
FIG. 84 is a block diagram illustrating a known digital PLL system.
Figure 85:
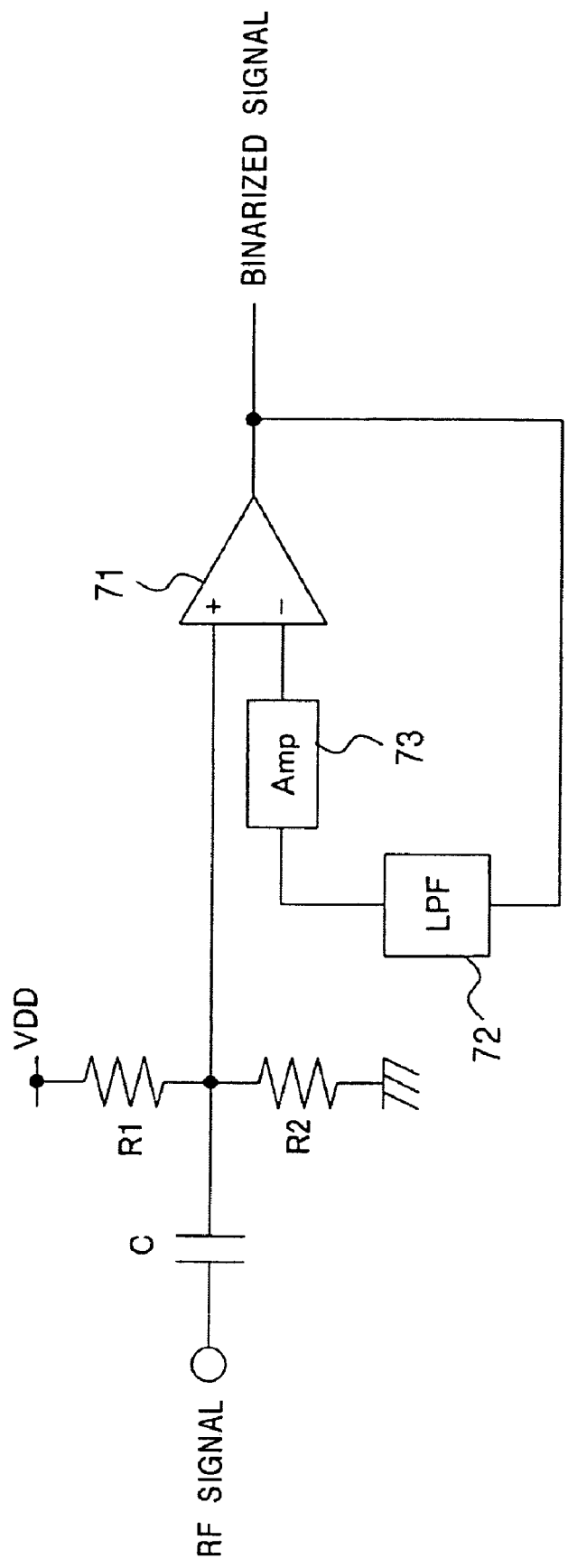
FIG. 85 is an asymmetry correction circuit diagram implemented by an analog circuit.

In an RF signal of an optical disc, the average value of the RF signal itself can be used as the slice level, as discussed in the circuit diagram of FIG. 84. This is because the positive side and the negative side of the amplitude are balanced so that the DC components (average value) of the RF signal can become the center level of the RF signal.

Figure 15:
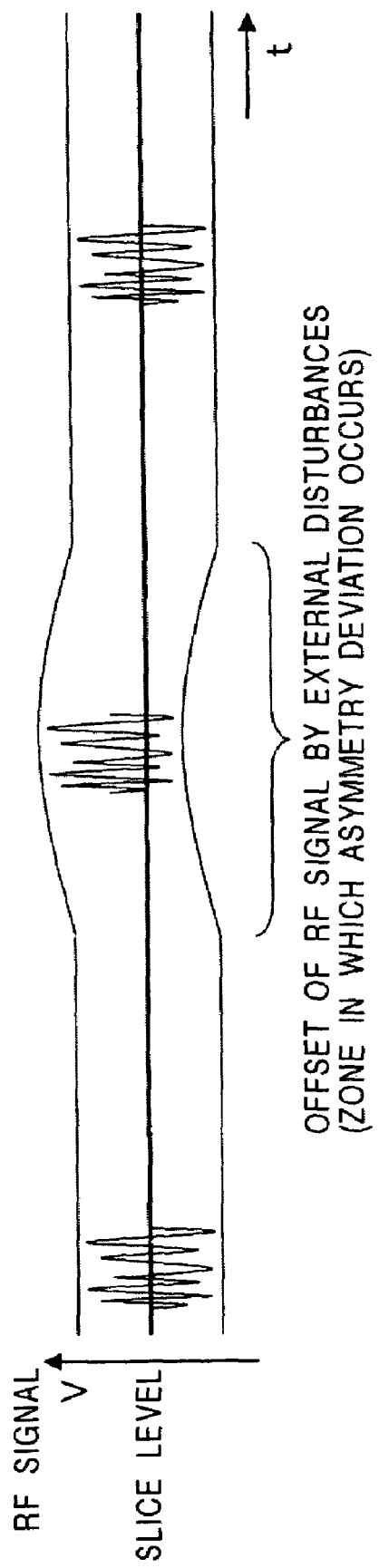
FIG. 15 illustrates asymmetry deviation due to defects.

However, since the RF signal is generated by reflected light at the surface of a disc, it is temporarily offset, as shown in FIG. 15, due to defects, for example, stains or flaws, on the disc surface. The slice level has a sufficiently long time constant compared to the frequency of the RF signal so that it is not influenced by temporary imbalances between the positive side and negative side, which are contained in the normal RF signal. Accordingly, if the generation of an offset due to defects is sufficiently shorter than the time constant for generating the slice level, the slice level cannot follow the center level of the RF signal.

This state is referred to as an "asymmetry deviation", and the RF signal cannot be correctly binarized in a zone in which the asymmetry deviation occurs. As a result, the playability is decreased, and the PLL operation becomes unstable. This mechanism is described in detail below with reference to FIG. 16.

As shown in FIG. 16, an RF signal of an optical disc is an analog signal having a certain gradient, and the amplitude thereof varies according to the pulse-length data. Ideally, therefore, the slice level should be maintained at the center level to binarize the RF signal.

However, if the slice level deviates from the center level due to an asymmetry deviation, the pulse-length data is biased toward the positive side or the negative side.

For example, if the slice level is biased toward the positive side, as indicated by "deviation+small" or "deviation+large" in FIG. 16, in the pulse-length data, the signal on the positive side becomes less and the signal on the negative side becomes more.

On the other hand, if the slice level is deviated toward the negative side, as indicated by "deviation−small" or "deviation−large" in FIG. 16, in the pulse-length data, the signal on the negative side becomes less and the signal on the positive side becomes more.

In other words, when pulse-length data alternately contains more and less error components, it can be considered that an asymmetry deviation is occurring.

4-2 Algorithm for Correcting Digital Asymmetry 4-2-1 Method for Detecting Asymmetry Deviation A description is given below of a method for detecting the amount and direction of an asymmetry deviation, i.e., whether the slice level is biased toward the positive side or the negative side.

Figure 17:
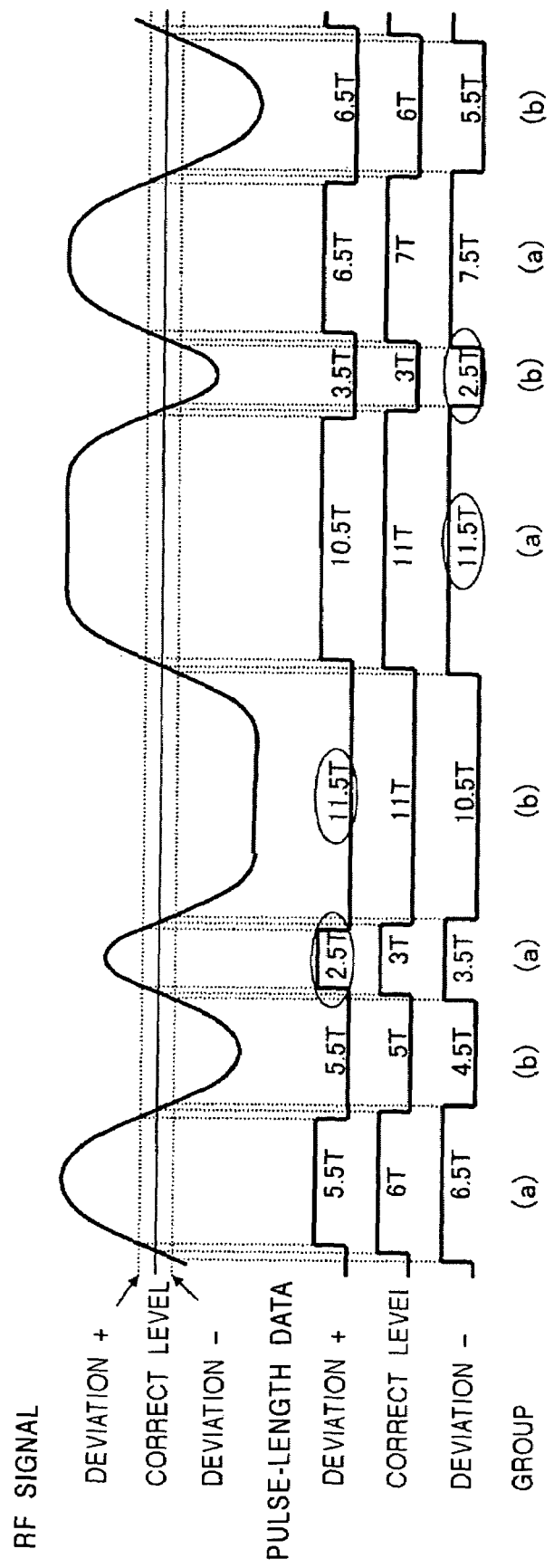
FIG. 17 illustrates an algorithm for detecting asymmetry deviation in this embodiment.

To discuss the method for detecting an asymmetry deviation, examples of an RF signal, the slice level, and pulse-length data are shown in FIG. 17.

In the ideal RF signal, when the slice level is maintained at the correct level, i.e., the center, the pulse-length data can become an integer.

However, if the slice level is biased toward the positive side or the negative side, the pulse-length data contains edge components, and the edge components are increased or decreased from the correct pulse-length data according to the direction of the deviation of the slice level and the polarity of the RF signal. If the slice level is biased toward the positive side, the pulse-length data on the positive side becomes less and the pulse-length data on the negative side becomes more. Conversely, if the slice level is biased toward the negative side, the pulse-length data on the positive side becomes more and the pulse-length data on the negative side becomes less.

It is thus necessary to determine the polarity of an asymmetry deviation from the input pulse-length data according to a certain algorithm. In this algorithm, the fact that the pulse-length data can be an integer only in a range of 3T to 11T and 14T as the format of an RF signal of a CD or DVD is utilized.

For example, in FIG. 17, when the slice level is biased toward the positive side, the edge components of the resulting pulse-length data are 0.5T, i.e., half of the unit of pulse-length data. In this case, the amounts by which the first pulse-length data 5.5T and the second pulse-length data 5.5T deviate are 0.5T. It can be simply estimated that one data should be 5T, and the other data should be 6T. However, it cannot be determined which of the data, i.e., the first data or the second data, should be corrected to 5T or 6T.

The third pulse-length data is 2.5T. Since components 2T do not exist in an RF signal of a CD, this pulse-length data is generated as a result of the pulse-length data 3T measuring less due to an asymmetry deviation. Similarly, the fourth-pulse data is 11.5T, and since components 12T do not exist in a CD, this pulse-length data is generated as a result of pulse-length data 11T measuring more.

It is now assumed that pulse-length data components are alternately divided into Group a and Group b. Then, each group is a set of pulse-length data components having either polarity of the RF signal. This concept is now considered by applying pulse-length data having an asymmetry deviation shown in FIG. 17.

When the slice level is biased toward the positive side, it can be determined that an asymmetry deviation occurs in the direction in which the data in Group a measures less because the third pulse-length data is 2.5T.

When the slice level is biased toward the negative side, the polarity of the asymmetry deviation cannot be determined from the third pulse-length data 3.5T. However, since the fifth pulse-length data is 11.5T, it can be determined that an asymmetry deviation occurs in the direction in which the data in Group a measures more.

As discussed above, by detecting the pulse-length data 3T or less or 11T or more, the direction of an asymmetry deviation can be determined.

4-2-2 Conditions for Starting Asymmetry Correction

When detecting an asymmetry deviation, it can be corrected immediately.

However, while handling an RF signal, an error similar to an asymmetry deviation sometimes occurs due to jitter or an accidental error. More specifically, edge components in the positive side and in the negative side are alternately generated accidentally, which can be erroneously recognized as an asymmetry deviation.

To avoid such an erroneous recognition, a lower limit of the number of alternate inversions of the signs of edge components is provided. When the signs of edge components are inverted in excess of this lower limit, the occurrence of an asymmetry deviation is determined.

If jitter constantly occurs in an RF signal, probabilistically, an asymmetry deviation is erroneously recognized even if the above-described lower limit of the number of alternate inversions is rather high. To overcome this drawback, the presence of a certain number of edge components is given as a condition for starting asymmetry correction, thereby reducing the possibility of erroneous correction for small errors, for example, a small level of jitter.

Accordingly, a minimum number of alternate inversions of edge components and a minimum number of edge components are given as conditions for starting asymmetry correction, thereby achieving high-precision detection of asymmetry deviations. Specific values of the above-described minimum number of alternate inversions and minimum number of edge components can be set as desired.

4-2-3 Detection of Asymmetry Deviation and Determination of Amount of Correction In the digital asymmetry correction circuit 4, the amount of correction is generated from a detected asymmetry deviation, thereby conducting a suitable amount of correction.

Figure 18:
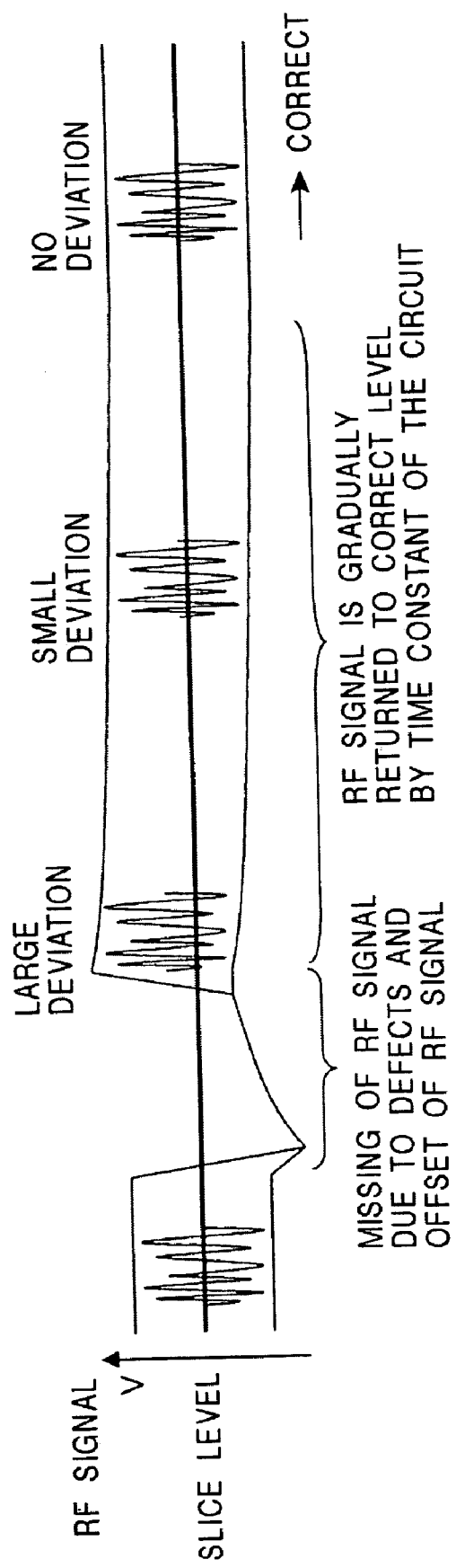
FIG. 18 illustrates a change in asymmetry deviation over time.

A specific example of a process of generating an asymmetry deviation due to defects is shown in FIG. 18. In FIG. 18, a change in an RF signal when the RF signal disappears due to stains on an optical disc is shown.

In this case, the RF signal disappears and is offset due to defects, and it reappears after the defects.

Thereafter, the asymmetry deviation reaches the highest level and gradually becomes smaller over time. In order to precisely correct this RF signal, it is necessary to vary the amount of correction in accordance with a change in the asymmetry deviation. That is, the detected amount of asymmetry deviation is appropriately fed back to the pulse-length data. It is thus possible to correct for an asymmetry deviation which changes over time.

The amount of correction can be generated by a very simple algorithm.

As discussed with reference to FIG. 17, the influence on edge components of pulse-length data due to an asymmetry deviation can be uniquely determined by the polarity of the RF signal and the polarity of the asymmetry deviation. That is, the amount of asymmetry deviation can be calculated by accumulating edge components of the pulse-length data with alternate signs.

In accumulating edge components, if the number of accumulations is too small, components of accidental errors, for example, jitter, which are irrelevant to an asymmetry deviation, are likely to be added. Conversely, if the number of accumulations is too large, it is difficult to follow a fast change in the asymmetry deviation, and the precise amount of correction cannot be fed back.

In an actual system, the number of accumulations is made variable, and it is changed by firmware depending on the hardware configuration. With this arrangement, the optimal number of accumulations in the system can be selected.

4-2-4 Conditions for Finishing Asymmetry Correction

After asymmetry correction is started, it can be finished if certain conditions are satisfied.

As a first condition, a lower limit is given for the amount of asymmetry correction, and when the amount of correction reaches the lower limit, asymmetry correction is terminated. The reason for this is that only a small amount of asymmetry deviation does not have to be corrected. The specific value of the lower limit can be set as desired.

As a second condition, correction is terminated when pulse-length data is generated outside a specific range. The reason is as follows. If an input signal has values excessively deviating from a prescribed format, it is very difficult for the asymmetry correction circuit 4 to precisely detect the amount of deviation. Accordingly, it is possible that the asymmetry correction circuit 4 erroneously detects the amount of deviation and thus erroneously corrects for the deviation.

5. Clock-Phase-Control/Run-Length Generating Circuit 5-1 Overview of Clock-Phase-Control/Run-Length Generating Circuit (Phase-Control/Data-Extracting Circuit) 5

The phase-control/data-extracting circuit 5 generates a virtual channel clock, counts pulse-length data with the virtual channel clock, and then sets the counted value as run-length data. The phase-control/data-extracting circuit 5 also detects phase errors.

A known technique for generating a channel clock is briefly discussed below. An RF signal generated by reading data from an optical disc by applying laser light from an optical pickup has a fluctuation in the time domain.

Figure 19:
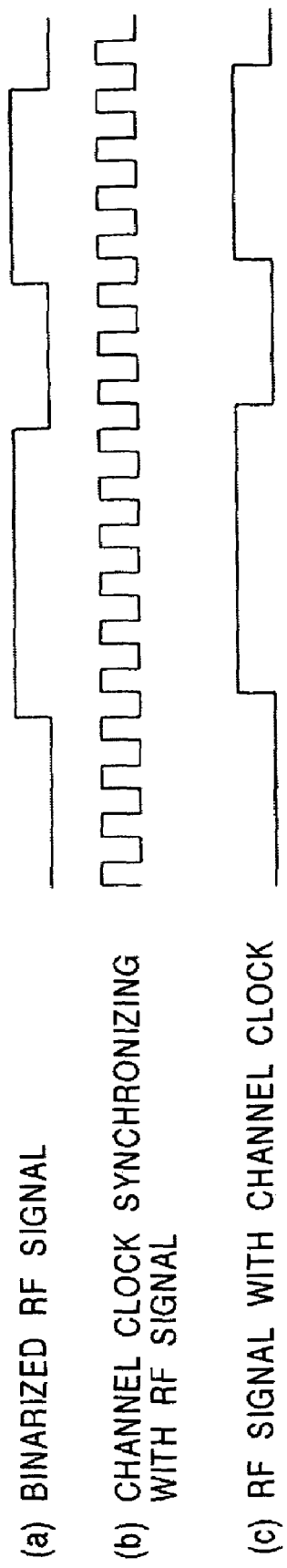
FIG. 19 illustrates an RF signal and a known channel clock.

To correctly read the RF signal having a fluctuation, a channel clock, such as that shown in (b) of FIG. 19, synchronized with the RF signal, such as that shown in (a) of FIG. 19, is required, and a digital PLL is used for generating this channel clock. When reading the binarized RF signal indicated by (a) of FIG. 19 with the channel clock, the RF signal indicated by (c) of FIG. 19 is obtained.

Figure 20:
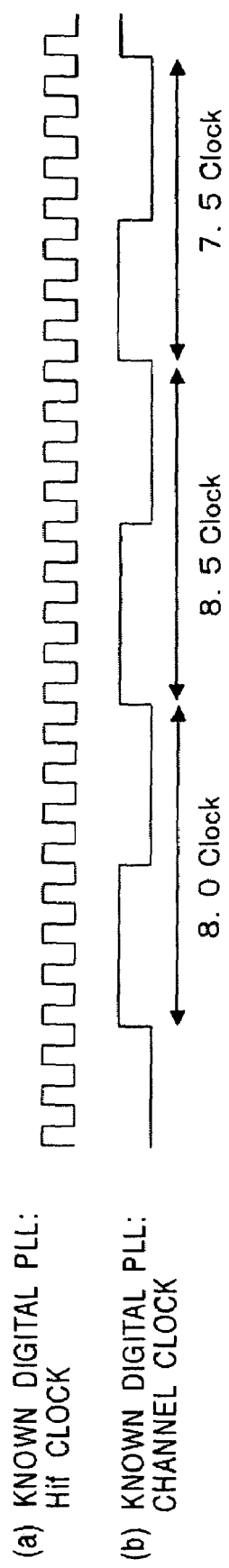
FIG. 20 illustrates the generation of a channel clock with a known digital PLL.

Conventionally, to generate a channel clock, a high frequency clock (Hif), such as that shown in (a) of FIG. 20, eight times higher than a regular channel clock, is used. Then, to match the phase and the frequency between the RF signal and the channel clock, the high frequency clock (Hif) is scaled by 7.5, 8.0, and 8.5 to lead or delay the phase of the channel clock, as shown in (b) of FIG. 20, also by using the reverse edges of the high frequency clock. Then, at the rising edge of the resulting channel clock, the RF signal is read, as indicated by (c) of FIG. 19, thereby measuring run-length data from the RF signal.

In contrast, according to this embodiment, instead of generating a clock in a digital PLL and by sampling the RF signal by using the generated clock, the phase relationship of the edges of the RF signal to the channel clock is digitized, and based on the digitized data, run-length data is generated from the pulse-length data of the RF signal. An algorithm for generating run-length data is described below.

5-2 Concept of Generation of Virtual Channel Clock and Run-Length Data

As stated above, land/pit pulse-length data measured with the pulse-length measuring circuit 2 is represented by the integer portion and the edge portion of a pulse length. For example, when the pulse-length data is 3T+2T/16 (=3.125T), the integer portion of the pulse length is 3T, and the edge portion of the pulse length is 2T/16.

Although details are given below, the phase difference from an edge of the RF signal to the virtual channel clock is calculated by using the pulse-length data. The virtual channel clock is not an actual channel clock. The binarized RF signal is represented by (a) of FIG. 21, and the virtual channel clock is represented by (b) of FIG. 21. In the example shown in (c) of FIG. 21, the distance from the edge A of the RF signal to the rising edge of the channel clock is the phase difference of the virtual channel clock, which is represented by 11T/16.

Figure 21:
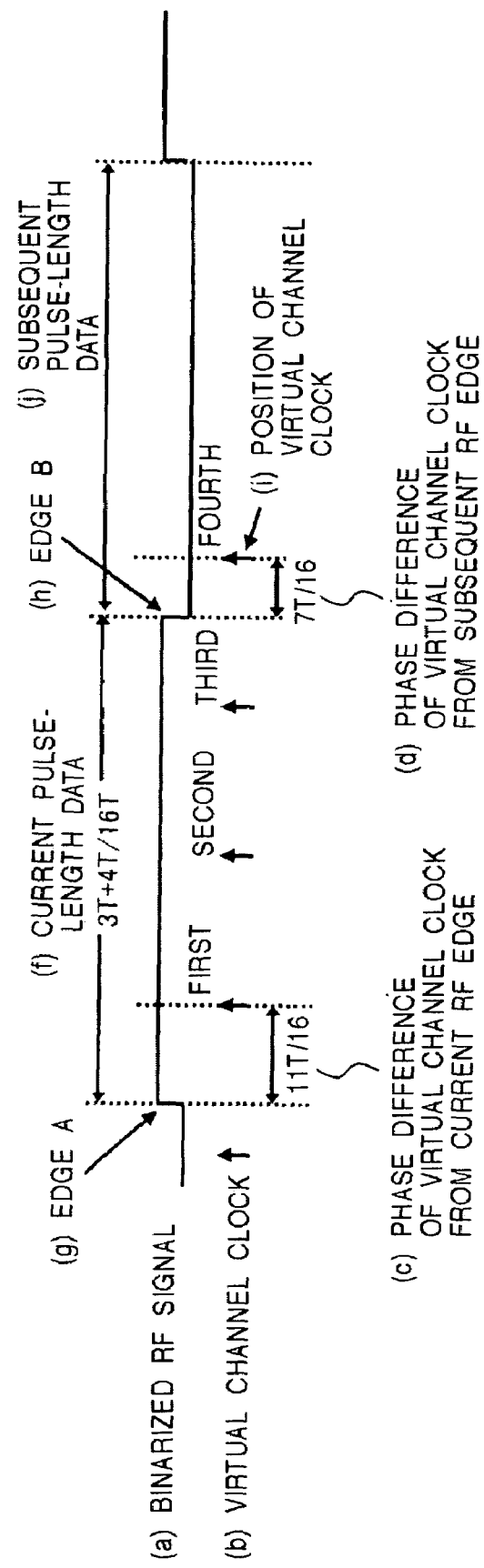
FIG. 21 illustrates a virtual channel clock in this embodiment.

The run-length data can be generated by calculating how many rising edges of the virtual channel clock can be contained in the pulse-length data of lands indicated by (f) of FIG. 21. In FIG. 21, three rising edges of the virtual channel clock can be contained in the pulse-length data of lands, and thus, the run-length data can be determined as 3T.

5-3 Algorithm for Determining Run-Length Data

A description is now given of a specific operation of generating run-length data from pulse-length data by the phase-control/data-extracting circuit 5.

A method for generating run-length data from the pulse-length data 3T+4T/16 represented by (f) of FIG. 21 is discussed below.

The first rising edge of the virtual channel clock designated by (b) of FIG. 21 is located at a portion delayed from the edge A indicated by (g) of FIG. 21 by 11T/16. The second rising edge of the virtual channel clock is located at a portion delayed from the edge A by 1T+11T/16, the third rising edge is located at a portion delayed from the edge A by 2T+11T/16, and the fourth rising edge is located at a portion delayed from the edge A by 3T+11T/16.

The pulse-length data designated by (f) of FIG. 21, which is 3T+4T/16, is more than the third rising edge 2T+11T/16 of the virtual channel clock and less than the fourth rising edge 3T+11T/16 of the virtual channel clock.

Accordingly, the three rising edges of the virtual channel clock count the distance from an edge of the RF signal to the next edge of the RF signal, and the run-length data of this pulse-length data can be determined as 3T.

A method for generating run-length data when the edge portion of the pulse-length data coincides with the rising edge of the virtual channel clock is described below.

Figure 22:
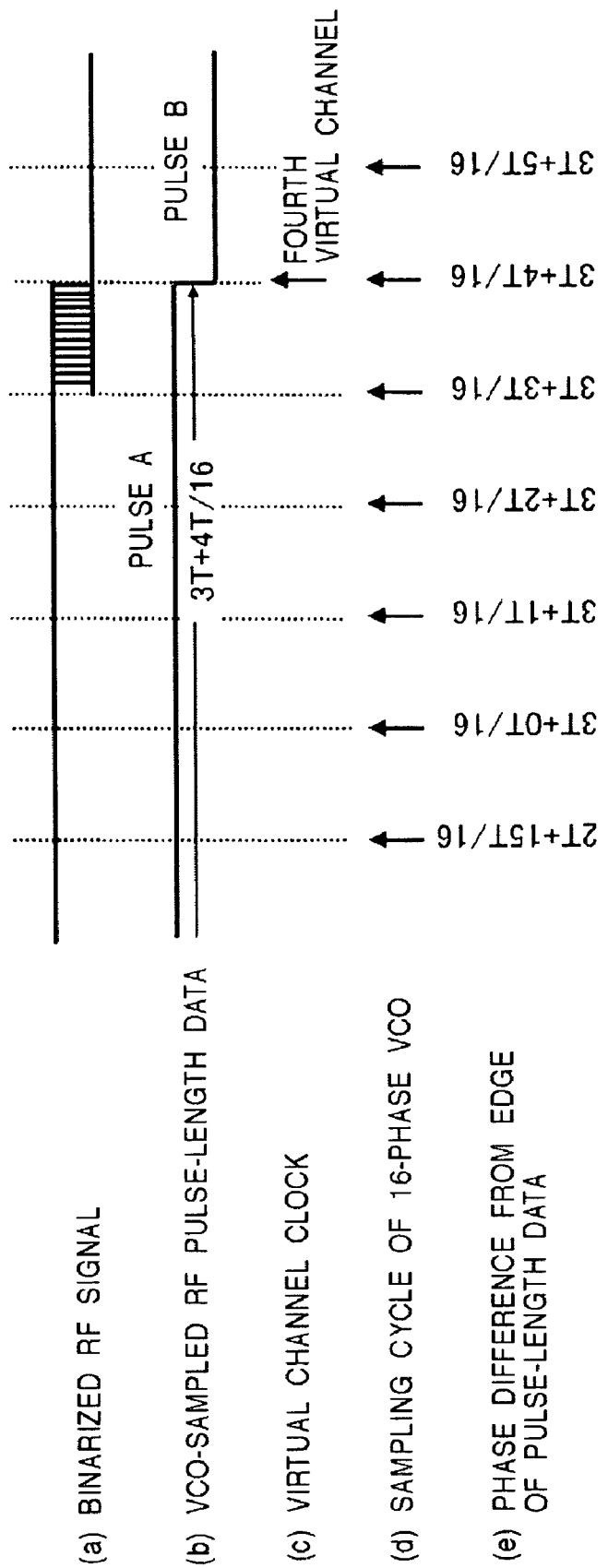
FIG. 22 illustrates the positions of rising edges of a virtual channel clock in this embodiment.

FIG. 22 shows a case where the pulse-length data is 3T+4T/16 and the virtual channel clock is 4T/16. The edge of the pulse-length data shown in (b) of FIG. 22 coincides with the fourth rising edge of the virtual channel clock. Thus, it cannot be determined whether the length of pulse A is 3T or 4T. This is because the virtual channel clock is compared with the binarized RF signal after sampling. Thus, the virtual channel clock has to be compared with the binarized RF signal before sampling.

The signal before sampling is a binarized RF signal having an edge indicated by (a) of FIG. 22 since the RF signal is asynchronous with the virtual channel clock. The edge of the binarized RF signal (a) of FIG. 22 is located before the rising edge of the virtual channel clock. Accordingly, the length of the pulse A can be determined to be less than the virtual channel clock located at the same position as the edge of the pulse A.

5-4 Algorithm for Generating Virtual Channel Clock

An algorithm for generating a virtual channel clock is discussed below with reference to FIG. 21. To determine the run-length data from the subsequent pulse-length data represented by (j) of FIG. 21, it is necessary to determine the phase difference of the subsequent virtual channel clock indicated by (d) of FIG. 21 from the edge B represented by (h) of FIG. 21.

The virtual channel clock used for determining the run-length data of the current pulse-length data (f) is delayed from the edge A indicated by (g) of FIG. 21 by 11T/16. Since the current pulse-length data is 3T+4T/16, the edge B is delayed from the current virtual channel clock by 4T/16. That is, the phase difference of the subsequent virtual channel clock indicated by (i) of FIG. 21 from the edge B can be calculated as 11T/16-4T/16=7T/16.

5-5 Phase Control Algorithm for Virtual Channel Clock

Figure 23:
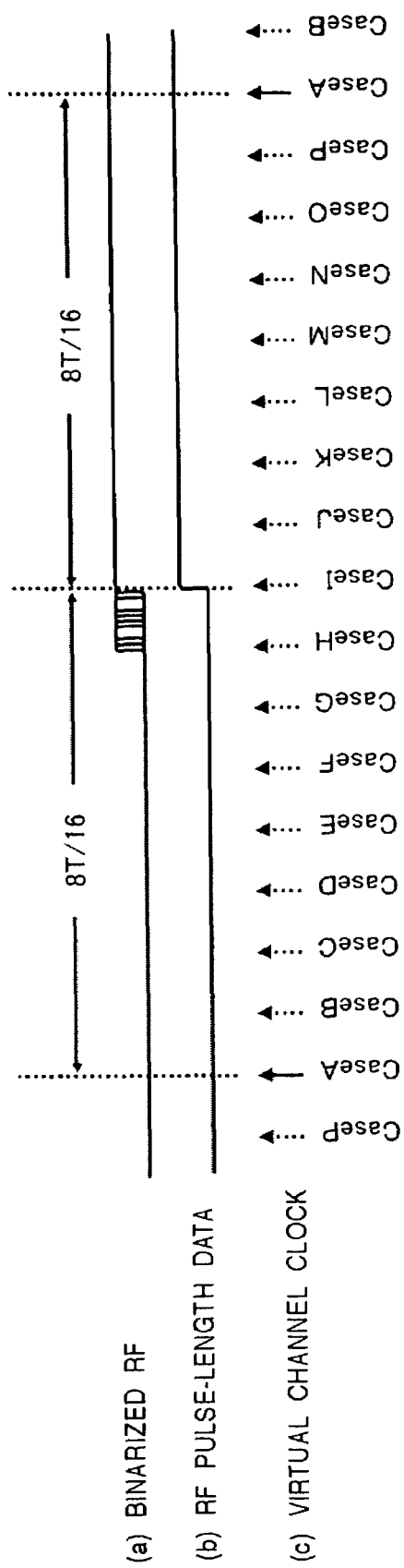
FIGS. 23 and 24 illustrate the phase relationship between pulse-length data and a virtual channel clock in this embodiment.

A phase control algorithm for the virtual channel clock is discussed below with reference to FIG. 23. FIG. 23 illustrates that there are phase differences from Case A to Case P of the virtual channel clock from the edges of the RF signal.

To correctly generate run-length data even if the RF signal contains a fluctuation in the time domain or noise, for example, jitter, the phase of the virtual channel clock must be controlled. Phase control is performed so that the phase difference is located in Case P and Case A to maximize the setup time and the hold time of the virtual channel clock with respect to the RF signal.

Figure 25:
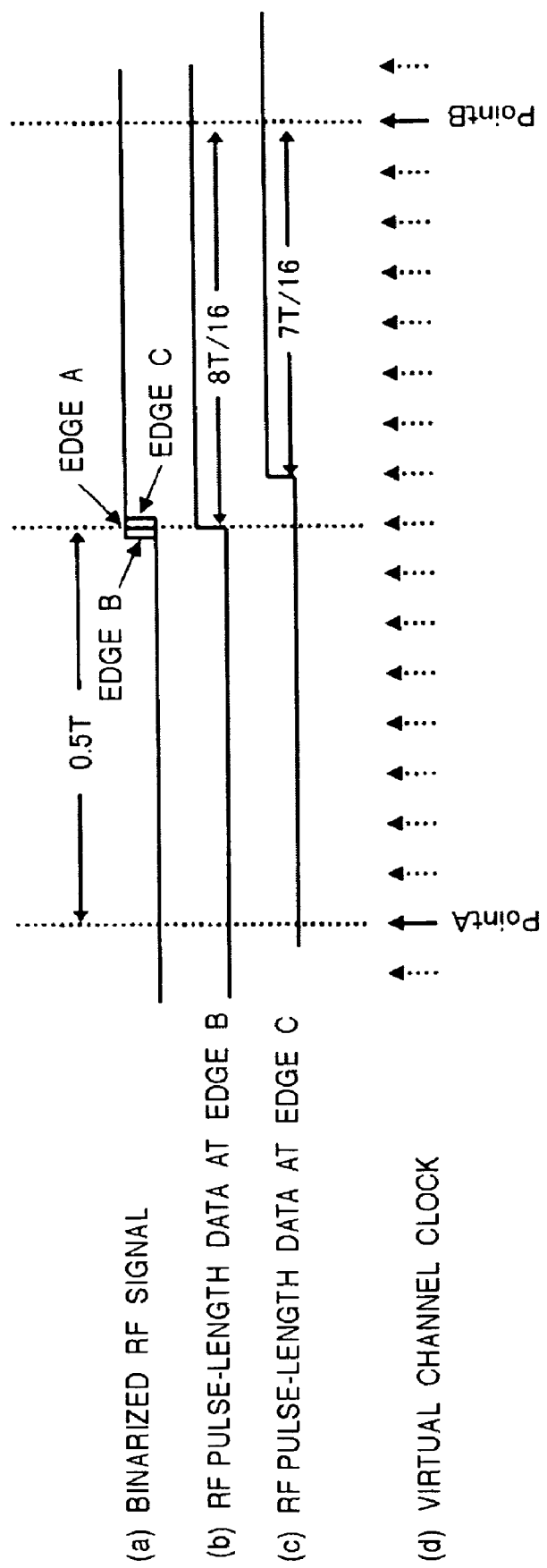
FIG. 25 illustrates the ideal phase state of pulse-length data and a virtual channel clock in this embodiment.

The reason for maximizing the setup time and the hold time when the phase difference is located at Case P and Case A is discussed below with reference to FIG. 25. The channel clock is located from Point A to Point B in FIG. 25. In this case, the edge of the ideal RF signal to maximize the setup time and the hold time is edge A shifted from Point A by 0.5T.

It is now considered that the edge of the RF signal is shifted to edge B or C. After the binarized RF signal having edge B or C is subjected to sampling by using 16 phase clocks from the 16-phase two-terminal VCO 10, and the resulting pulse-length data in as shown in (b) or (c) of FIG. 25, respectively. That is, when the phase difference between the RF signal and the virtual channel clock is ideal, the phase differences of the edges is (b) and (c) of FIG. 25 to Point B are 8T/16 and 7T/16, respectively. Accordingly, the phase difference 7T/16 or 8T/16 is determined as the ideal phase difference, and thus, it is not corrected (it is set as the dead zone). In FIG. 23, the dead zone corresponds to Case P and Case A.

Phase errors are determined as follows. When the rising edge of the virtual channel clock is from Case B to Case H, the deviation of each case from Case A is determined to be a phase error. When the rising edge of the virtual channel clock is from Case I to Case O, the deviation of each case from Case P is determined to be a phase error.

When the rising edge of the virtual channel clock shown in FIG. 23 is from Case B to Case H, the phase-control/data-extracting circuit 5 determines that the virtual channel clock is delayed from Case A or Case P. Conversely, when the rising edge of the virtual channel clock shown in FIG. 23 is from Case I to Case O, the phase-control/data-extracting circuit 5 determines that the virtual channel clock leads from Case A or Case P.

A criterion for determining whether the virtual channel clock leads or lags depends on the properties of the RF signal. There are some cases where it is better to handle Case B and Case O adjacent to Case A and Case P, respectively, as the dead zone, in which case, the playability becomes higher. It is thus preferable that a criterion for determining whether the virtual channel clock leads or lags be set as desired.

There are some cases where it is better not to determine whether the virtual channel clock at, for example, Case H and Case I, leads or lags, in which case, they can be set as the dead zone.

When a phase lead or phase lag of the virtual channel from the RF signal is detected, it is corrected as follows.

When a phase lead is detected, it is corrected so that the virtual channel clock is delayed with respect to the phase difference of the next virtual channel clock. For example, when the virtual channel clock is located at Case C, the phase is corrected by 1T/16 so that it can be located at Case B. If a phase lag is detected, it is corrected so that the virtual channel clock leads with respect to the phase difference of the next virtual channel clock.

Figure 24:
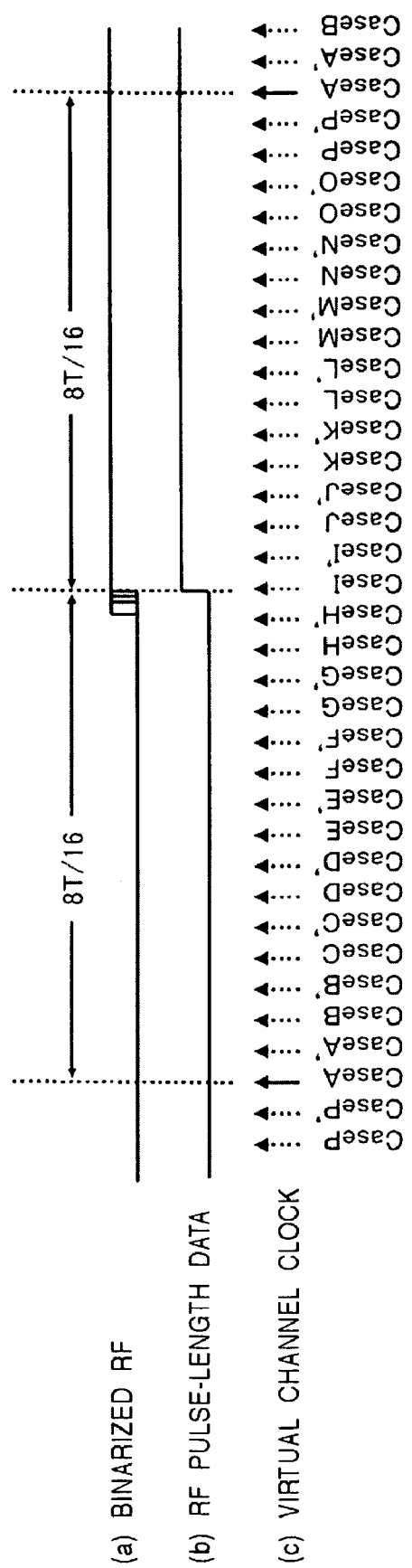

Although in FIG. 23 the amount by which the phase difference is corrected is 1T/16, it may be corrected by 1T/32, as shown in FIG. 24.

In the 1T/32 control mode shown in FIG. 24, the resolution is increased compared to the 1T/16 control mode in FIG. 23, and it is resistant to RF signals having high frequency jitter components. On the other hand, the phase control gain is decreased, thereby reducing the capability of following a frequency change of the RF signal.

Accordingly, it is preferable that the 1T/16 control mode and the 1T/32 control mode be automatically switched to exhibit both the high capability of following a frequency change and the jitter-resistant performance.

In this complex mode, the system is normally operated in the 1T/32 control mode, and when a phase lead or lag is detected three times consecutively, the system is automatically switched to 1T/16 control mode. When the ideal state resumes, the system is automatically returned to the 1T/32 control mode.

In performing phase control in this embodiment, when pulse-length data other than an eight-to-fourteen modulation (EFM) signal (CD) or an EFM+ signal (DVD) is input, phase correction is not conducted. The reason is as follows. Edges of the pulse-length data that does not comply with the above-described format are not reliable, and it is meaningless to perform phase control on the edges of such unreliable RF signals, since this may lead to erroneous phase control.

By setting the modes, the range of the dead zone, and the amount of correction as described above, the playability can be increased for any type of optical disc.

6. RLL Circuit

6-1 PLL System and RLL Circuit

When an RF signal does not comply with the format for some reasons, the RLL circuit 6 estimates the original data according to some rules and corrects the RF signal.

Figure 26:
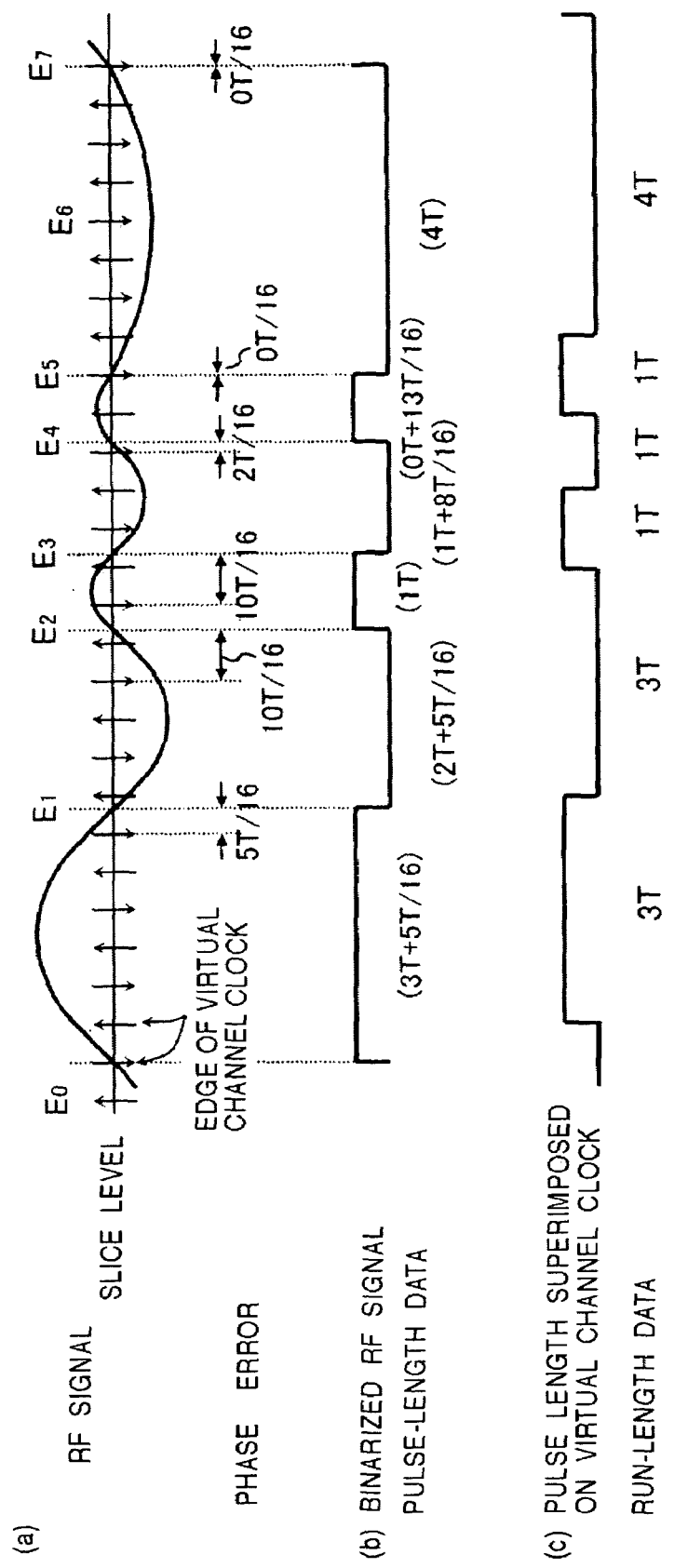
FIG. 26 illustrates an RF signal, run-length data, and phase errors in this embodiment.

The run-length data generated by the phase-control/data-extracting circuit 5 is shown in FIG. 26 in comparison with the original RF signal.

The RF signal indicated by (a) of FIG. 26 is binarized on the basis of the slice level. The intersections of the RF signal and the slice level become the edges of the binarized RF signal, and the distance between adjacent edges are calculated as pulse-length data in the above-described pulse-length measuring circuit 2, as indicated by (b) of FIG. 26.

Then, the run-length data and phase errors are calculated from the pulse-length data in the phase-control/data-extracting circuit 5, as described above, as represented by (c) of FIG. 26.

If the locking state of the PLL is correct, the above-described phase errors represent error components due to noise contained in each pulse-length data. Thus, the RLL circuit 6 corrects the run-length data by using the phase errors.

Figure 27:
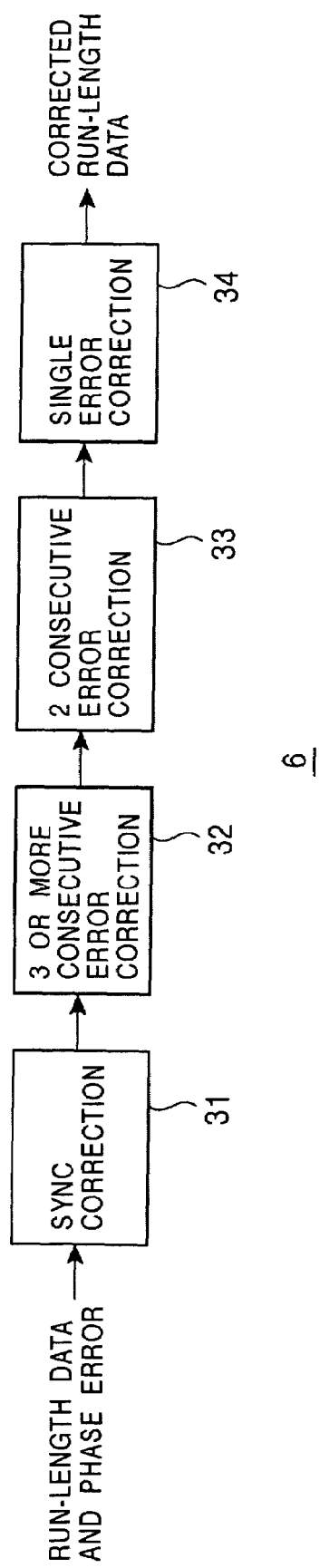
FIG. 27 is a block diagram illustrating the operation of an RLL circuit in this embodiment.

The order of correction processes by the RLL circuit 6 is as shown in FIG. 27. In the following description, short run-length data that does not comply with the format is referred to as an "error".

In a first process 31, a sync pattern and long run-length data that does not comply with the format are corrected.

Then, in a second process 32, three or more consecutive errors are corrected according to certain rules. Errors which cannot be corrected in the second process 32 are combined to two or less consecutive errors, and are corrected in a third process 33 or a fourth process 34.

In two-consecutive error correction in the third process 33, corrections are conducted both on two consecutive errors that are input into the RLL circuit 6 and two-consecutive errors generated from the three or more consecutive errors in the second process 32. An error that cannot be corrected in the third process 33 is corrected in the fourth process 34.

In single error correction in the fourth process 34, corrections are conducted on a single error input into the RLL circuit 6, an error generated from the three or more consecutive errors in the second process 32, and an error generated from the two consecutive errors in the third process 33.

According to the above-described processes, all items of run-length data less than 3T can be corrected to run-length data having 3T or more.

6-2 Error Pattern of Run-Length Data

Patterns of run-length errors are shown in FIGS. 28 through 33.

Figure 28:
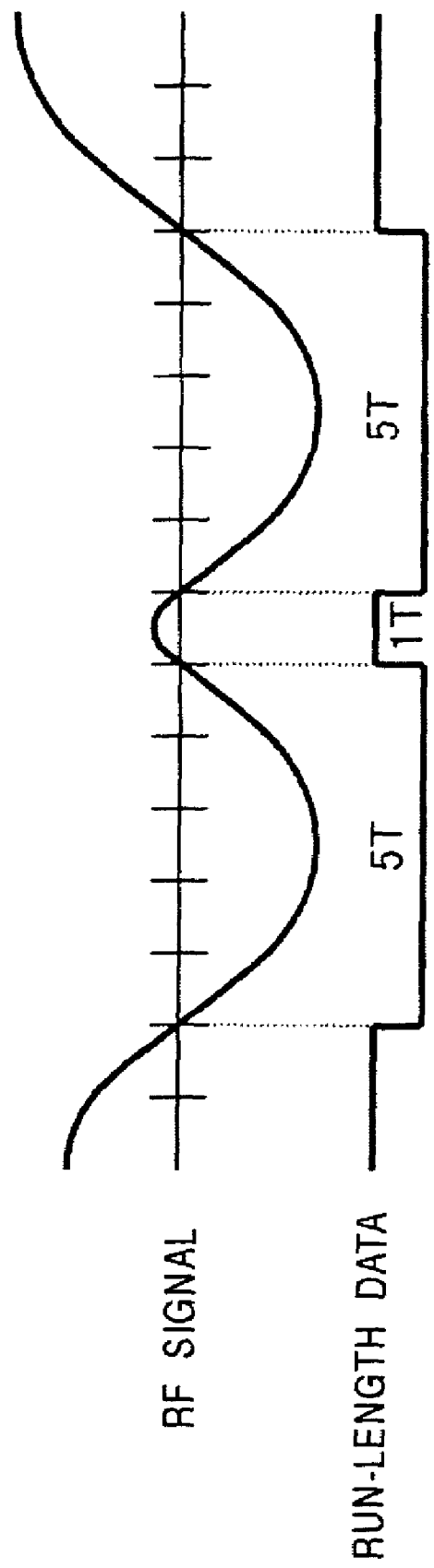
FIG. 28 illustrates an example of a single error of run-length data.

In the pattern shown in FIG. 28, one run-length data less than 3T is generated before and after run-length data having 3T or more.

This pattern is generated probably because of an error of short Ts, such as, 3Ts, due to, for example, an insufficient amplitude, the biased slice level, or jitter, or because of noise mixed into a long T, which is a combination of an error T and preceding and following Ts.

Figure 29:
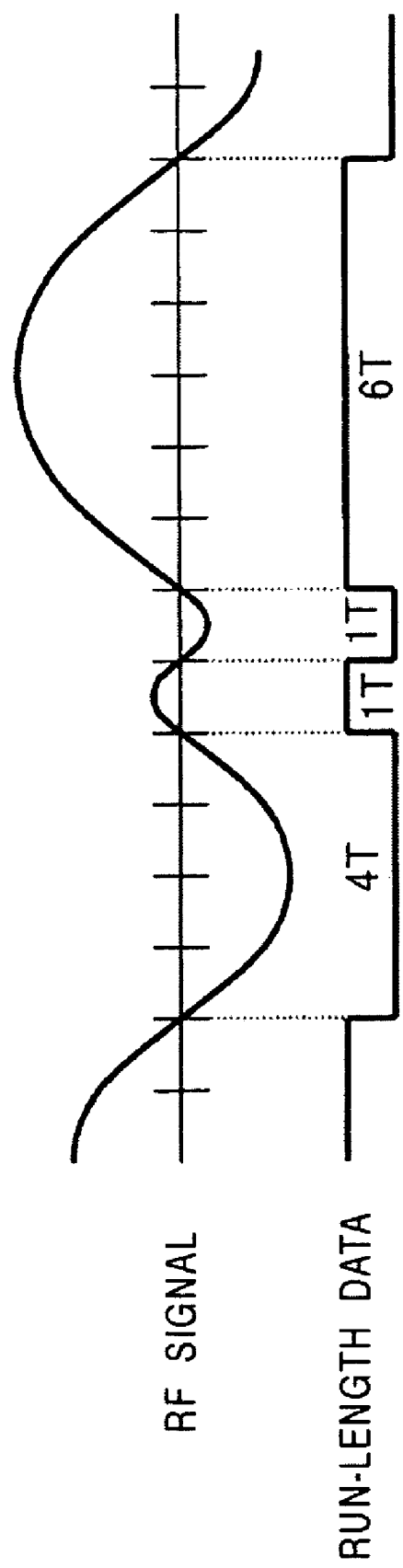
FIG. 29 illustrates an example of two consecutive errors of run-length data.

In the pattern shown in FIG. 29, two run-length data less than 3T are consecutively generated before and after run-length data having 3T or more. This pattern is generated probably because of the occurrence of chattering at the edges of the preceding and following run-length data. It is also possible that two short Ts, for example, consecutive run-length data 3T+3T, become two run-length data less than 3T according to the properties of a disk or the presence of large jitter.

Figure 30:
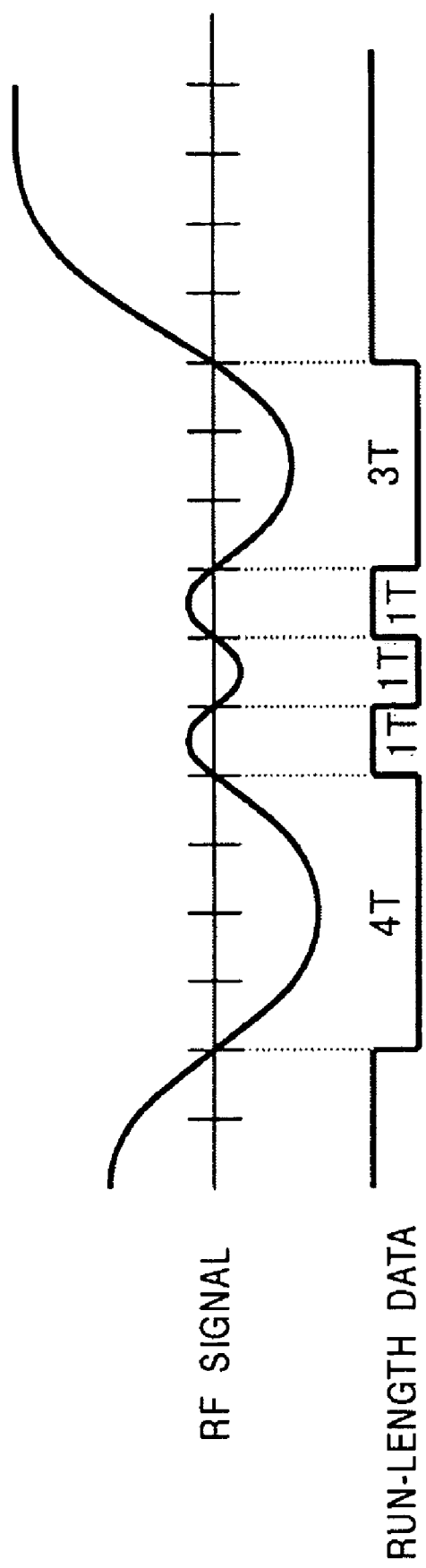
FIG. 30 illustrates an example of three consecutive errors of run-length data.

In the pattern shown in FIG. 30, three run-length data less than 3T are consecutively generated before and after run-length data having 3T or more. This is probably due to the fact that one run-length data is divided into three small run-length data because of an insufficient amplitude or noise.

Figure 31:
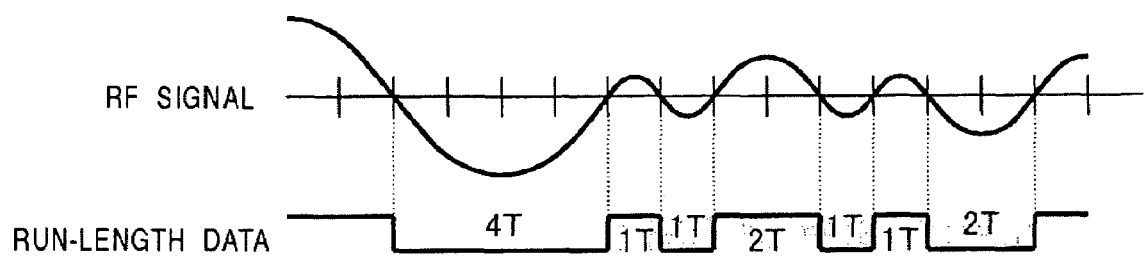
FIG. 31 illustrates an example of four or more consecutive errors of run-length data.

In the pattern shown in FIG. 31, four or more run-length data less than 3T are consecutively generated. The generation of such a pattern during a playback operation is probably due to the following reason. The RF signal disappears due to large defects, for example, large stains, and the RF signal having a very small amplitude becomes the same level as the slice level, thereby encouraging the generation of meaningless patterns.

Figure 32:
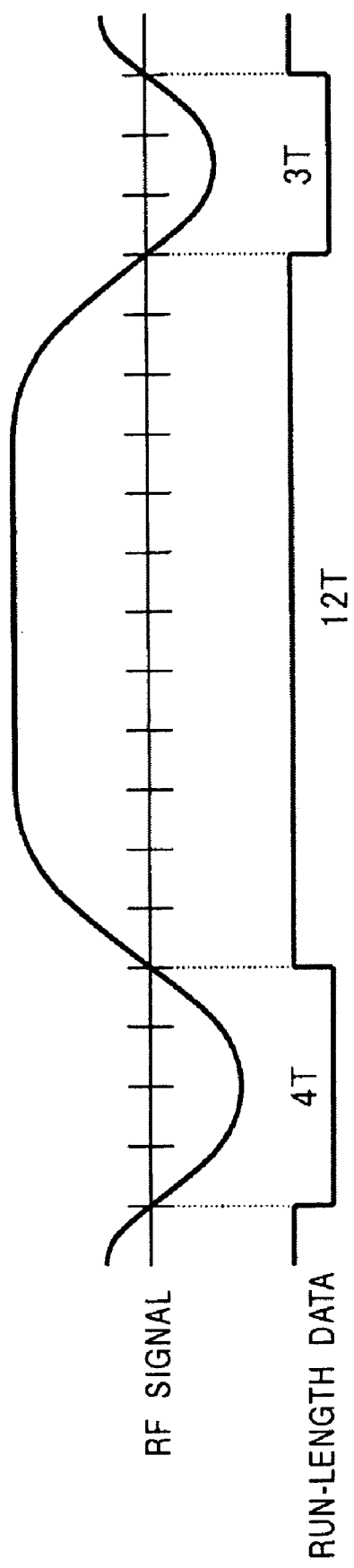
FIG. 32 illustrates an example of a 12T error of run-length data.

In the pattern shown in FIG. 32, run-length data having 12T or more is generated. This is probably due to the fact that run-length data having 11T or less becomes 12T, which is impossible as the CD format, because of noise, jitter or asymmetry deviation.

Figure 33:
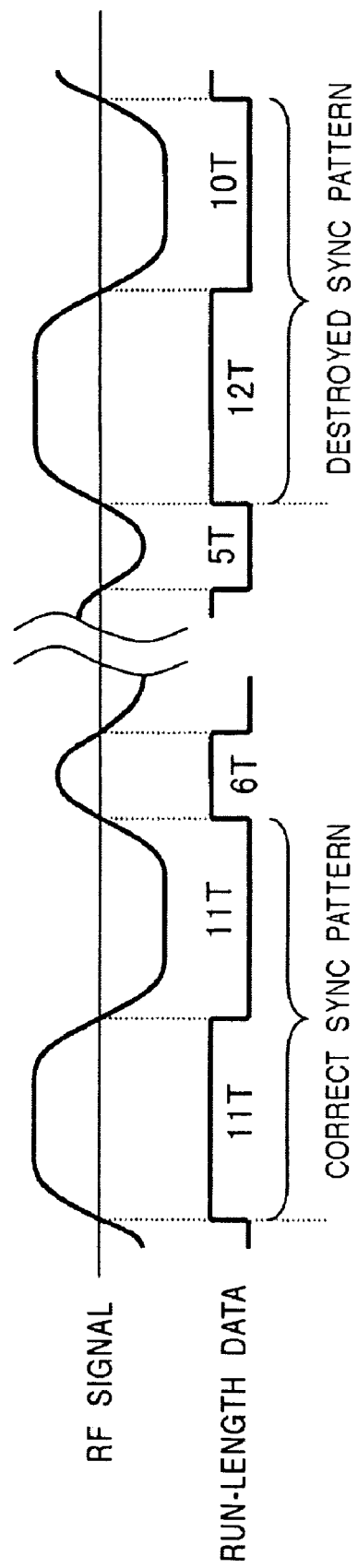
FIG. 33 illustrates an example of a sync error of run-length data.

FIG. 33 illustrates an example of a sync pattern destroyed, in which a sync pattern, which should be 11T+11T, cannot be maintained due to noise, jitter, or asymmetry deviation.

6-3 Overview of Run-Length Error Correction Methods

Error pattern correction methods are discussed below. For the sake of simplicity, run-length data are represented by integers. In actuality, however, run-length data have decimal points unless otherwise stated.

As discussed in the section, 5. "Clock-phase-control/run-length-generating circuit", in the digital PLL system of this embodiment, run-length data is determined by the number of edges of a virtual channel clock. Accordingly, even in run-length data represented by 0T, it has a certain length which does not reach the reference edge.

The direction in which T is corrected, i.e., whether corrections are conducted toward the preceding run-length data or the subsequent run-length data, is determined by the lengths L of the preceding run-length data and the subsequent run-length data and phase errors $\phi$ at both edges of the incorrect run-length data with respect to the virtual channel clock.

Correction conditions of phase errors $\phi$ are determined as follows. If the correction method is not restricted by conditions of the lengths L of the preceding and subsequent run-length data, not only a comparison of the levels of phase errors $\phi_1$ and $\phi_2$, but also whether $\phi=0$, i.e., whether the edges are located at the ideal positions, is sometimes taken into consideration. If phase errors $\phi$ are not into consideration, it means that the generation pattern of an error is determined only by the run-length data L, in which case, the error is corrected to a specific pattern. A combination of conditions used for correction can be systematically determined. Error correction methods for run-length data are specifically described below.

6-3-1 Single Error (0T) Correction Method

Figure 34:
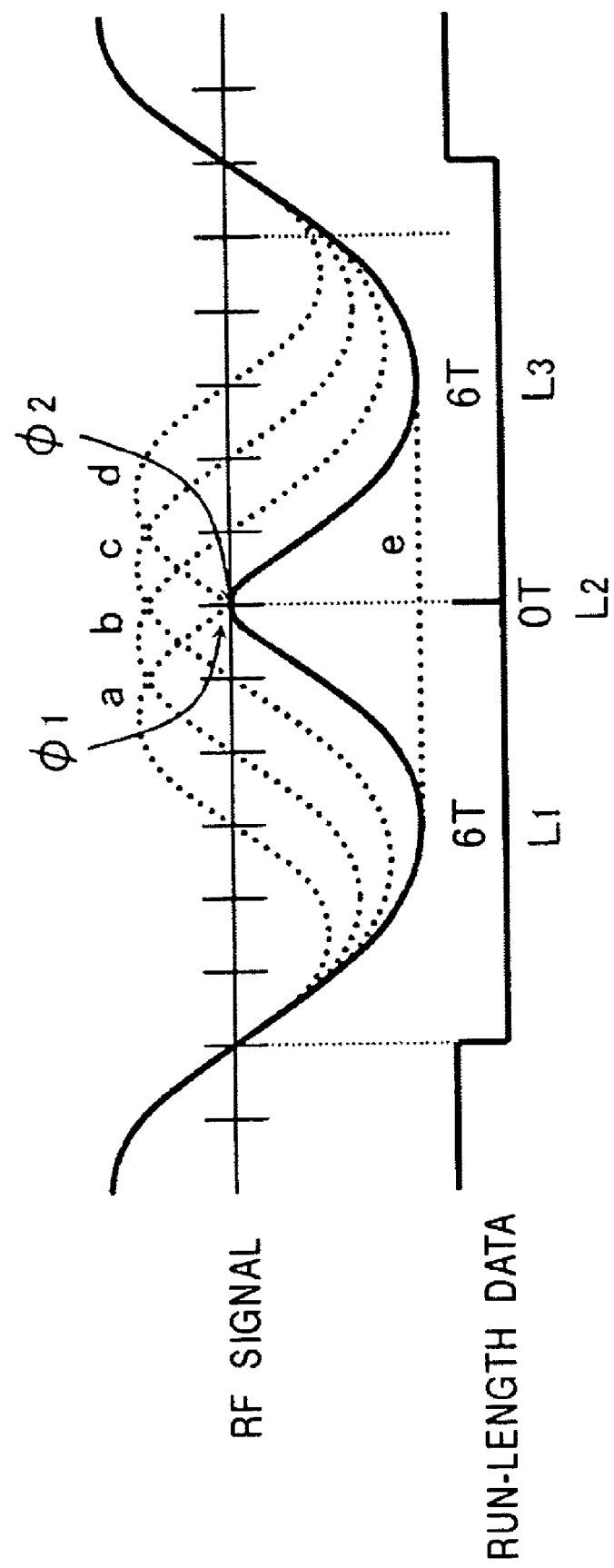

Methods for correcting a run-length error 0T (less than 1T) are shown in FIG. 34. Five patterns of corrections indicated by a through e in FIG. 34 can be considered.

In FIG. 34, three run-length data are represented by $L_1$, $L_2$, and $L_3$. When $L_2$ becomes 0T, four types of corrections, i.e., patterns a through d, can be considered for expanding 0T to 3T. In this case, the expanded 3T are offset from the preceding and subsequent run-length data $L_1$ and $L_2$ according to the correction pattern.

When erasing 0T, the three run-length data are combined into one run-length data as indicated by the pattern e, i.e., into one run-length data having a length $L_1+L_2+L_3$ (practically speaking, it is $L_1+L_3$ since $L_2=0$).

One of the correction methods using the phase errors $\phi_1$ and $\phi_2$ at the edges of incorrect run-length data and the lengths of the preceding and subsequent run-length data $L_1$ and $L_3$ is shown in FIG. 35. This is a method for attempting to reconstruct the error $L_2$ to 3T as much as possible.

In the correction method shown in FIG. 35, corrections are conducted according to the conditions indicated in cases (1) through (11).

For example, as indicated by case (1), only when $L_1+L_3 \leq 8$, the pattern e is used for erasing 0T, in which case, the resulting run-length data becomes $L_1+L_3$.

In cases (2) through (11), the error $L_2$ is reconstructed to 3T according to the conditions of $L_1$ and $L_3$ and $\phi_1$ and $\phi_2$ by using one of the patterns a through d.

Another method, such as that shown in FIG. 36, can also be considered. In this method, when the total of $L_1+L_2+L_3$ is 11T or less, $L_2$ is erased.

That is, when the conditions of case (1) are satisfied, the pattern e is used for erasing $L_2$, in which case, the corrected run-length data becomes $L_1+L_3$.

When the conditions in cases (2) through (5) are satisfied, the error $L_2$ is reconstructed to 3T according to one of the patterns a through d.

The correction method without using the conditions of phase errors φ can also be considered, as shown in FIG. 37. When analyzing actual random errors, many cases have been found in which $L_2$ and $L_3$ of correct data are 3T, such as nT+3T+3T (n≧3). Accordingly, the unique correction method, such as that shown in FIG. 37, is set.

In this case, the error $L_2$ is reconstructed to 3T according to the conditions in cases (1) through (4) by using one of the patterns a through d.

6-3-2 Single Error (1T) Correction Method

Figure 38:
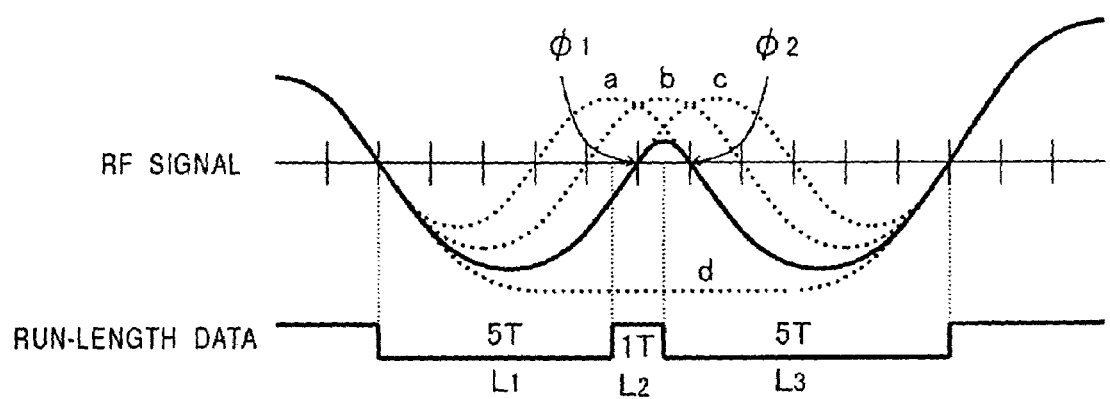

Methods for correcting run-length error having 1T or more and less than 2T (hereinafter assumed as "1T") are shown in FIG. 38. Four patterns of corrections indicated by a through d in FIG. 38 can be considered.

In FIG. 38, three run-length data are represented by $L_1$, $L_2$, and $L_3$. When $L_2$ becomes 1T, three types of corrections, i.e., patterns a through c, can be considered for expanding 1T to 3T. In this case, the expanded 2T are offset from the preceding and subsequent run-length data.

When erasing 1T, the three run-length data is combined into one run-length data, as indicated by pattern d, i.e., into one run-length data having a length of $L_1+L_2+L_3$.

One of the correction methods by using the conditions of phase errors $\phi_1$ and $\phi_2$ at the edges of incorrect run-length data and the lengths of the preceding and subsequent run-length data $L_1$ and $L_3$ is shown in FIG. 39. This is a method for attempting to reconstruct the error $L_2$ to 3T as much as possible.

For example, as indicated in case (1), only when $L_1+L_2+L_3 \leq 8$, the pattern d is used for erasing 1T, in which case, the corrected run-length data becomes $L_1+L_2+L_3$.

In cases (2) through (6), the error $L_2$ is reconstructed to 3T according to the conditions $L_1$ and $L_3$ and the phase errors $\phi_1$ and $\phi_2$ by using one of the patterns a through c.

The correction method shown in FIG. 40 can also be considered. In this method, when the total of $L_1+L_2+L_3$ is 11T or less, $L_2$ is erased.

That is, in case (1), the pattern d is used for combining the three run-length data into one run-length data $L_1+L_2+L_3$. In cases (2) through (4), the error $L_2$ is reconstructed to 3T by using one of the patterns a through c.

The correction method without using the phase error φ can be considered, as shown in FIG. 41. This is based on the concept described with reference to FIG. 37.

In this case, the error $L_2$ is reconstructed to 3T, as shown in FIG. 41, according to conditions of (1) through (3) by using one of the patterns a through c.

6-3-3 Single Error (2T) Correction Method

Figure 42:
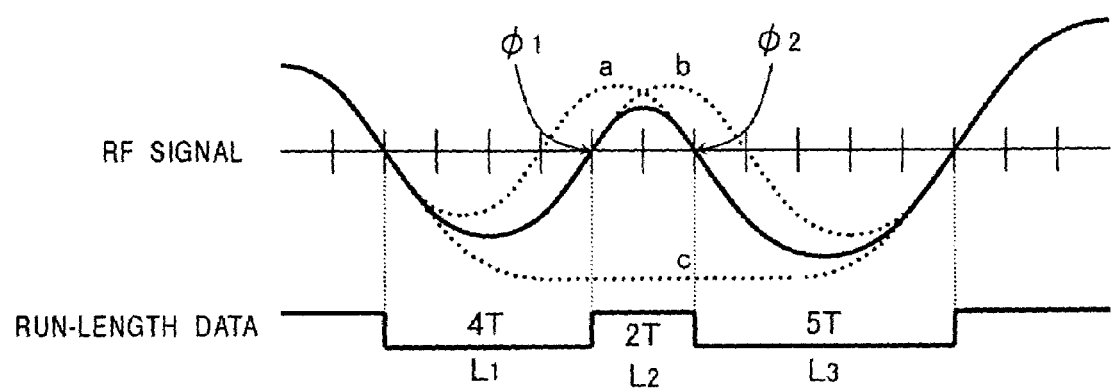

Methods for correcting a run-length error having 2T or more and less than 3T (hereinafter assumed "2T") are shown in FIG. 42. Three patterns of corrections indicated by a through c can be considered.

In FIG. 42, three run-length data are represented by $L_1$, $L_2$, and $L_3$. When $L_2$ becomes 2T, two types of corrections, i.e., patterns a and b, can be considered for expanding 2T to 3T. In this case, the expanded 1T is offset from the preceding and subsequent run-length data $L_1$ and $L_3$.

When erasing 2T, the three run-length data are combined into one run-length data, as indicated by the pattern c, i.e., into one run-length data $L_1+L_2+L_3$.

One of the methods for correcting the run-length data according to the conditions of phase errors $\phi_1$ and $\phi_2$ and the lengths of the preceding and subsequent run-length data $L_1$ and $L_3$ is shown in FIG. 43.

In this method, cases where one of or both the preceding and subsequent run-length data are 3T are handled as special cases, and in the other cases, 2T is reconstructed to 3T according to the conditions of $\phi_1$ and $\phi_2$.

In case (1), i.e., when both $L_1$ and $L_3$ are 3T, the pattern c is used for combining the three run-length data into one run-length data $L_1+L_2+L_3$ (=8T).

In case (2) or (3), when one of $L_1$ and $L_3$ is 3T, 1T is subtracted from the data which is not 3T, and is added to $L_2$ according to the pattern a or b, thereby reconstructing $L_2$ to 3T.

6-3-4 Methods for Correcting Two Consecutive Errors

Figure 44:
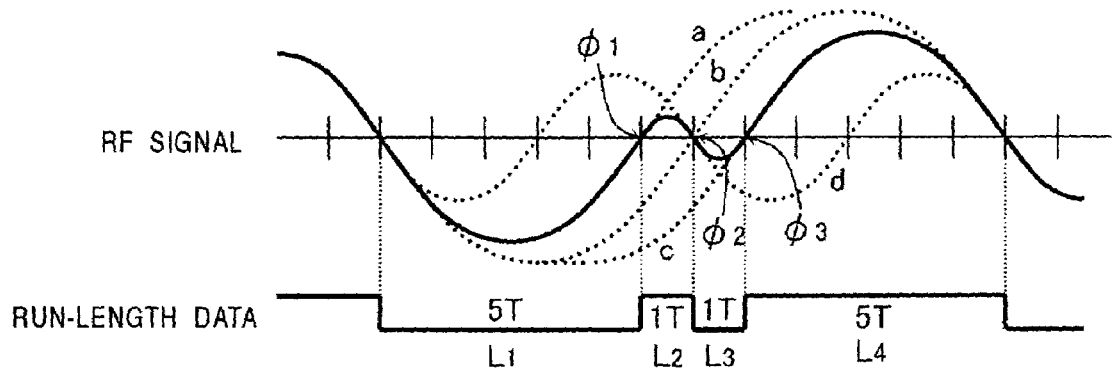

Methods for correcting two consecutive run-length errors, each of which is less than 3T, and correction patterns are shown in FIG. 44.

There are two types for correcting these errors. In one type, it is considered that errors are due to chattering between the preceding and subsequent run-length data $L_1$ and $L_4$, and the run-length data $L_2$ and $L_3$ are allocated to $L_1$ and $L_4$, as indicated by the patterns a through c. In the other pattern, the consecutive errors $L_2$ and $L_3$ are corrected to two consecutive 3Ts, as represented by the pattern d.

The selection of the correction patterns a through d is determined by the lengths of $L_1$, $L_2$, $L_3$, and $L_4$ and the phase errors $\phi_1$, $\phi_2$ and $\phi_3$ at the edges of $L_2$ and $L_3$.

FIGS. 45 and 46 illustrate correction methods for preferentially using the phase errors as conditions for correcting the run-length data.

FIG. 45 illustrates a case where the two run-length errors are set to be 3T+3T when the phase error $\phi_2$ becomes 0.

In contrast, FIG. 46 illustrates cases where, when the phase error $\phi_1$ or $\phi_3$ becomes 0, the run-length data $L_1$ through $L_4$ is formed into two run-length patterns while keeping the edge having no phase error.

FIG. 47 illustrates cases where the correction pattern is determined by a combination of the lengths of the run-length errors $L_2$ and $L_3$ and a combination of the lengths of the run-length data $L_1$ and $L_4$.

In this method, if $L_1$ or $L_4$ does not exceed 11T, $L_2+L_3$ is added to $L_1$ or $L_4$. If $L_1$ or $L_4$ exceeds 11T, $L_2+L_3$ is combined into one run-length data.

In this case, as shown in FIG. 47, $L_2+L_3$ may be less than 3T. However, at this point, $L_2+L_3$ less than 3T is maintained, and it is later corrected by single-error correction performed in the fourth process 34, which is subsequent to this process (third process 33), as discussed with reference to FIG. 27.

6-3-5 Method for Correcting Three Consecutive Errors Less than 3T

Figure 48:
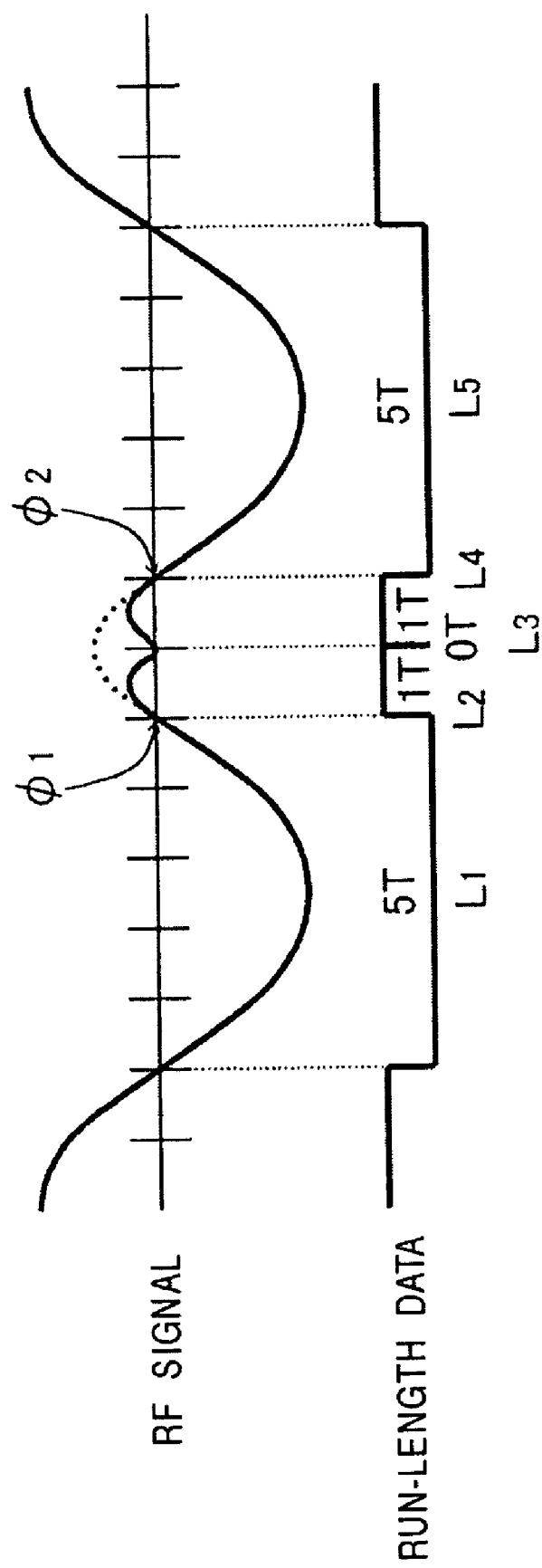

FIG. 48 illustrates a pattern of three consecutive run-length errors, each of which is less than 3T and the total of which is less than 3T, and a correction method for such errors.

In this case, regardless of the lengths of run-length data or the values of phase errors, the three run-length data are combined into one run-length data. More specifically, as shown in FIG. 49, $L_2+L_3+L_4$ is combined into one run-length data regardless of the conditions of $L_1$ and $L_5$ or $\phi_1$ and $\phi_2$.

In this case, although the value of $L_2+L_3+L_4$ becomes less than 3T, it is maintained and is later corrected in single-error correction performed in the fourth process 34, which is subsequent to this process (third process 33).

6-3-6 Method for Correcting Three Consecutive Errors Having 3T

Figure 50:
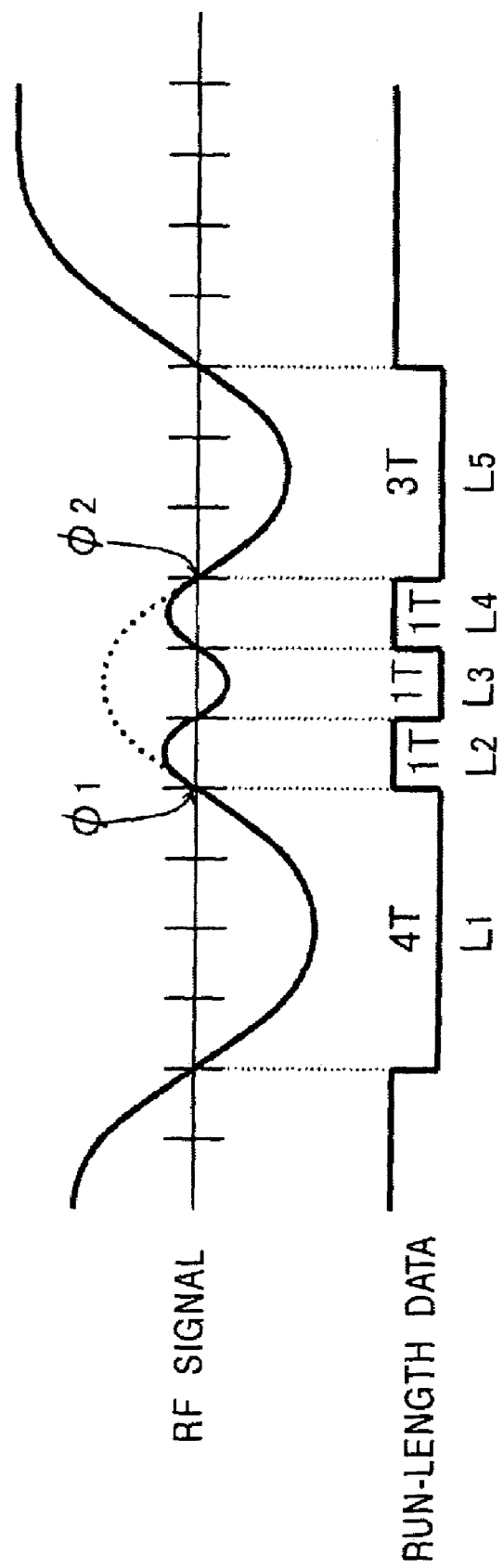

FIG. 50 illustrates a pattern of three consecutive run-length errors, each of which is less than 3T and the total of which is 3T, and a correction method for such errors.

Also in this case, regardless of the lengths of run-length data or the values of phase errors, the three run-length data are combined into one run-length data. More specifically, as shown in FIG. 51, $L_2+L_3+L_4$ is combined into one run-length data regardless of the conditions of $L_1$ and $L_5$ or $\phi_1$ and $\phi_2$, in which case, the total of the three errors $L_2+L_3+L_4$ becomes 3T.

6-3-7 Methods for Correcting Three Consecutive Errors More than 4T

Figure 52:
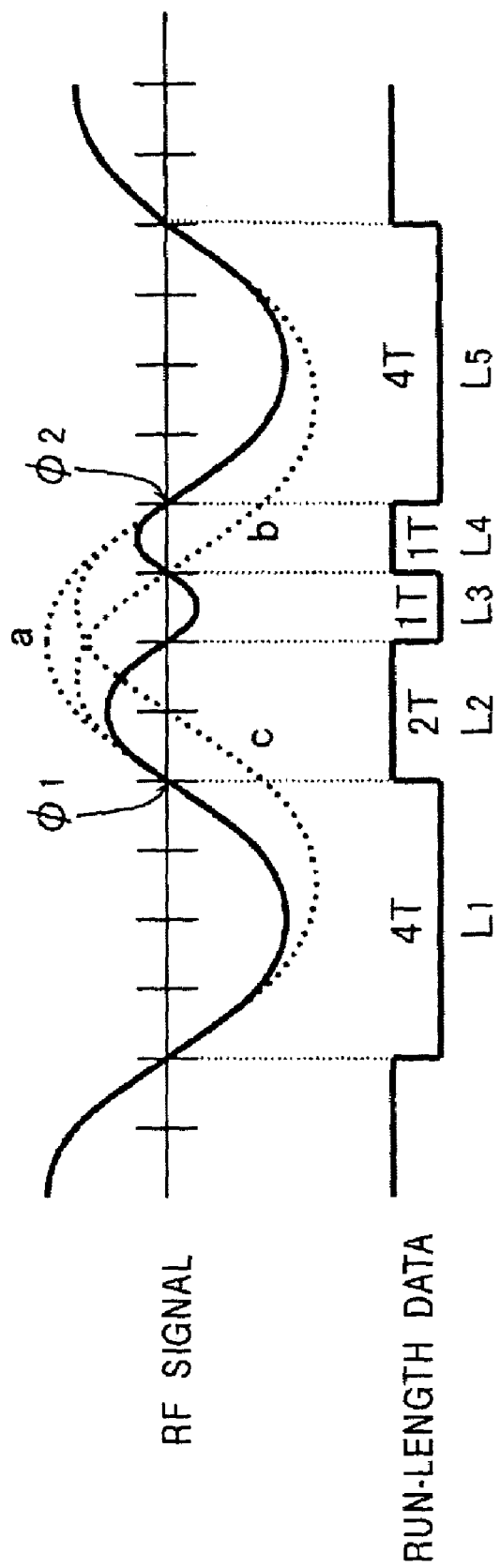

FIG. 52 illustrates a pattern of three consecutive run-length errors, each of which is less than 3T and the total of which is 4T or more, and a correction method for such errors.

There are two types of correction methods. FIG. 53 illustrates a correction method using the pattern a shown in FIG. 52. That is, as in the method shown in FIG. 49 or 51, $L_2+L_3+L_4$ is combined into one run-length data regardless of the conditions of $L_1$ and $L_5$ or $\phi_1$ and $\phi_2$. In this case, the total of the three errors $L_2+L_3+L_4$ becomes 4T or more.

The other correction method is shown in FIG. 54 in which the patterns a through c shown in FIG. 52 are selectively used.

More specifically, the levels of phase errors $\phi_1$ and $\phi_2$ at both edges of the three consecutive run-length errors are compared, and the three run-length errors are replaced by 3T according to the comparison result. In this case, the value obtained by subtracting 3 from the total of the three run-length errors is added to $L_1$ or $L_5$ depending on the comparison result. FIG. 54 illustrates cases (1) and (2) in which the patterns c and b are used depending on the comparison results.

6-3-8 Method for Correcting Four or More Consecutive Errors

Figure 55:
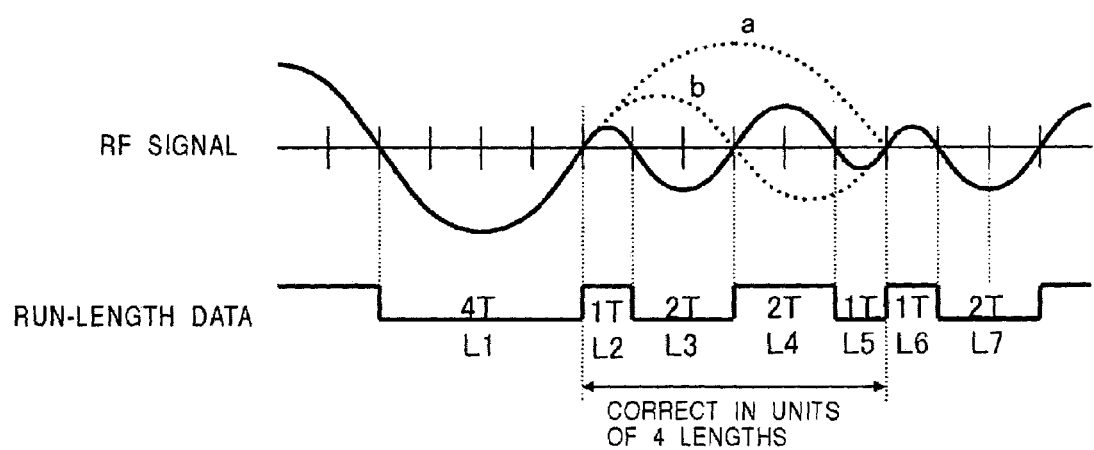

FIG. 55 illustrates a pattern of four or more consecutive errors, each of which is less than 3T, and a correction method for such errors.

In this case, it is almost impossible to predict the original run-length data, and thus, consecutive run-length data is converted into one or two run-length data according to simple patterns shown in FIG. 56. In this case, the correction pattern represented by a or b shown in FIG. 55 is used.

If the total value of errors become less than 3T, it is maintained and is later subjected to two consecutive error correction (third process 33 in FIG. 27) or single error correction (fourth process 34 in FIG. 27).

6-3-9 12T Correction Method

Figure 57:
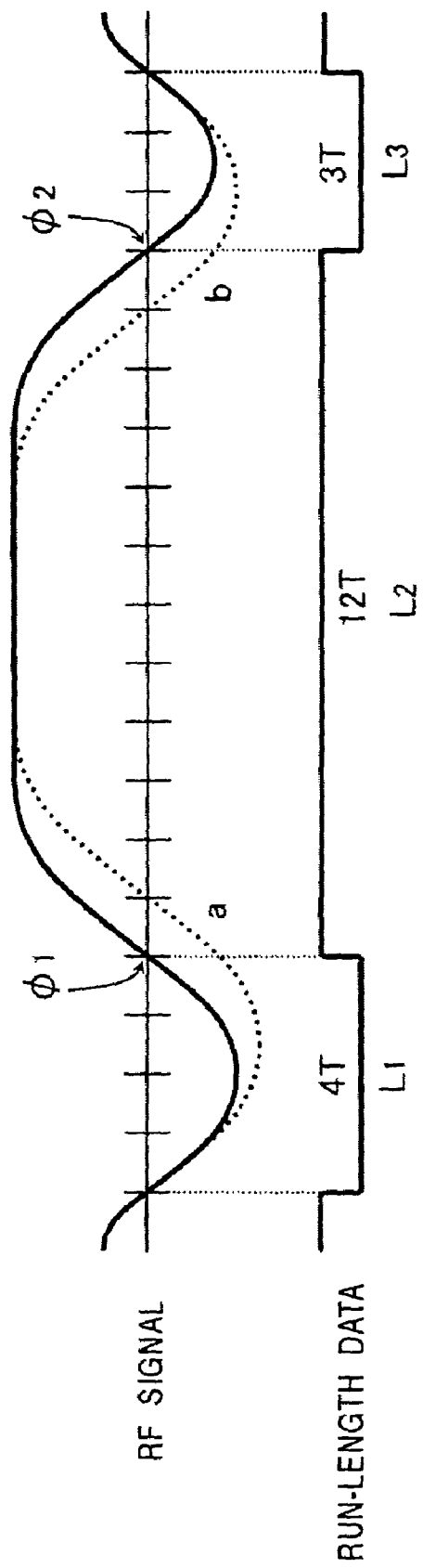

FIG. 57 illustrates the occurrence of an error 12T and a correction method for such an error.

It can be considered that an error 12T is generated from 11T, and thus, a correction pattern represented by a or b is used for correcting run-length data according to the conditions shown in FIG. 58.

However, if the conditions of $L_1$ and $L_3$ are not satisfied, as indicated by case (3) of FIG. 58, no corrections are made. This is to prevent the generation of a sync pattern, i.e., a pattern 11T+11T, at an incorrect position.

6-3-10 Sync Pattern Error Correction Methods

FIGS. 59A and 59B illustrate examples of a sync pattern of a CD and a sync pattern of a DVD, respectively.

As determined as the formats of a CD and a DVD, a fixed pattern 11T+11T is written into a CD and a fixed pattern 14T+4T is written into a DVD in regular cycles as the sync pattern. Correction methods can be considered according to how much a pattern deviates from the correct cycle and the sync pattern.

The correction method for a CD can be selected from five patterns shown in FIGS. 60, 62, 64, 66, and 68, and the correction method for a DVD can be selected from five patterns shown in FIGS. 61, 63, 65, 67, and 69.

There are 16 deviation patterns for a CD, as indicated by (1) through (16) in FIGS. 60, 62, 64, 66, and 68 and 14 deviation patterns for a DVD, as indicated by (1) through (14) in FIGS. 61, 63, 65, 67, and 69. In FIGS. 60 through 69, the patterns before correction are indicated by solid lines, and the patterns after correction are represented by broken lines. Patterns other than these deviation patterns are not corrected.

Figure 60:
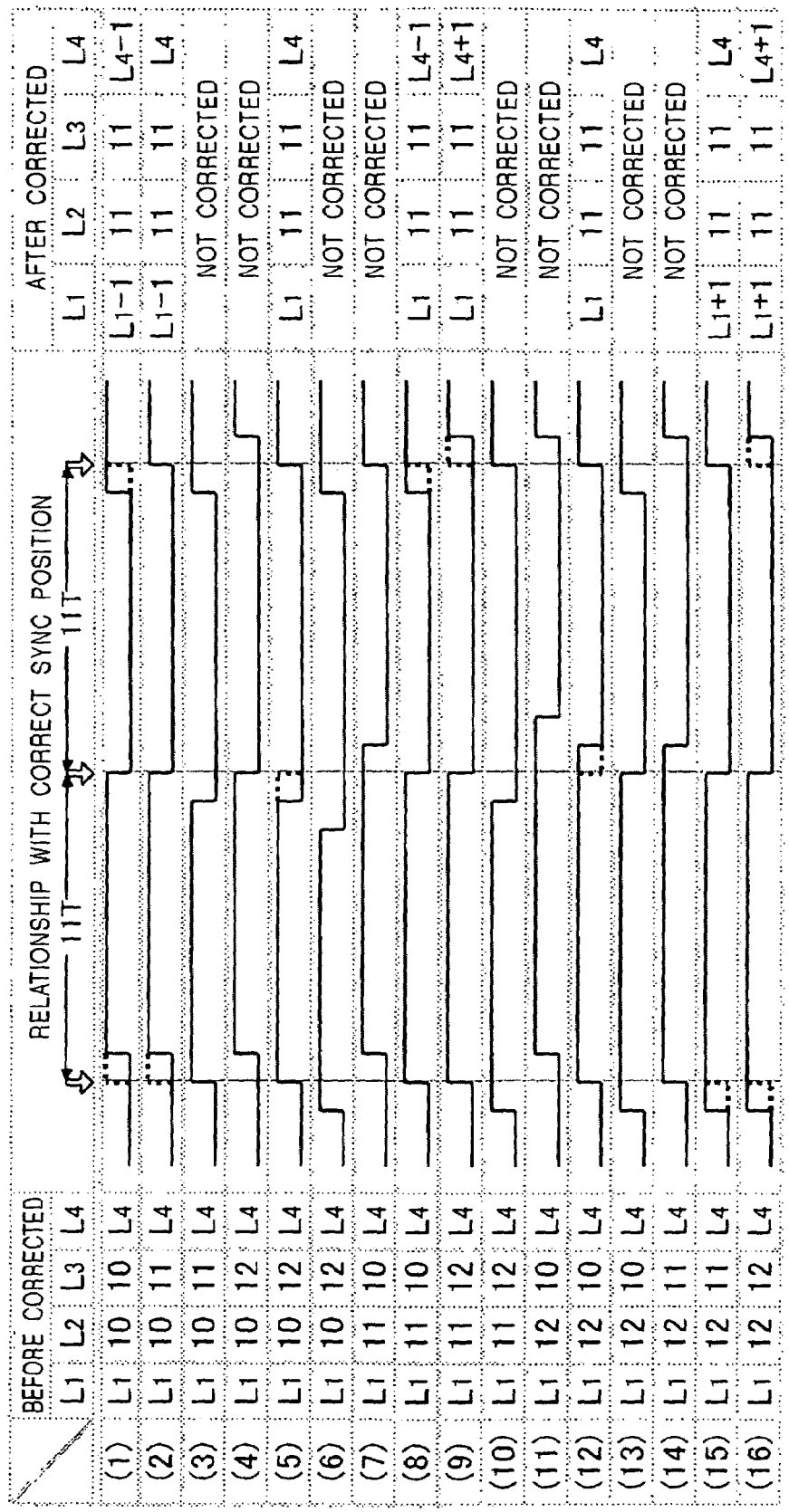
FIGS. 60 through 69 illustrate examples of corrections for sync errors.
Figure 61:
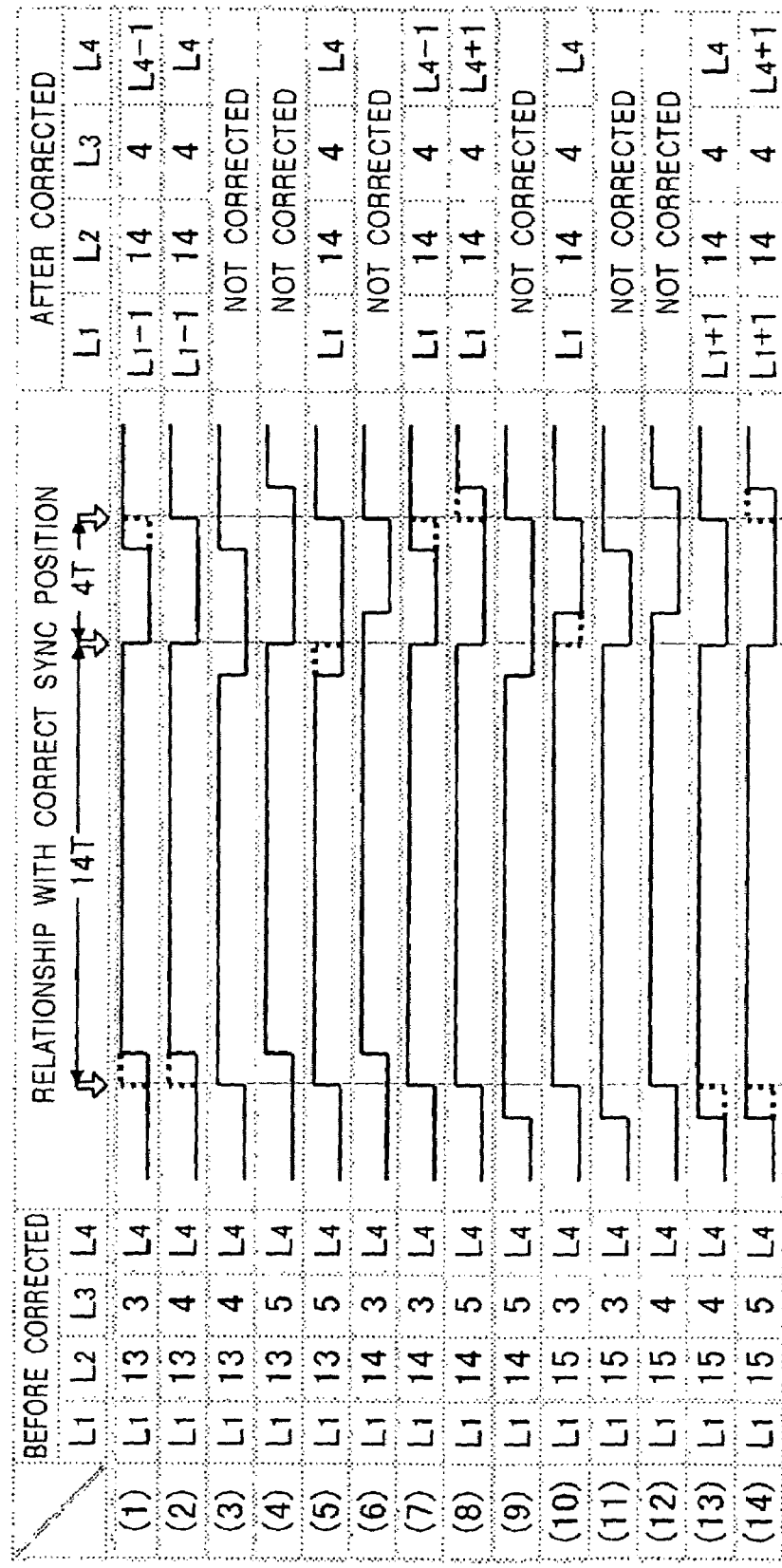

In the methods shown in FIGS. 60 and 61, patterns that cannot be corrected at a minimal number of processing are not corrected.

That is, except for cases (1) and (16) for a CD of FIG. 60 and cases (1) and (14) for a DVD of FIG. 61, corrections are conducted only when a deviation occurs in one edge of the three edges of the sync pattern.

Figure 62:
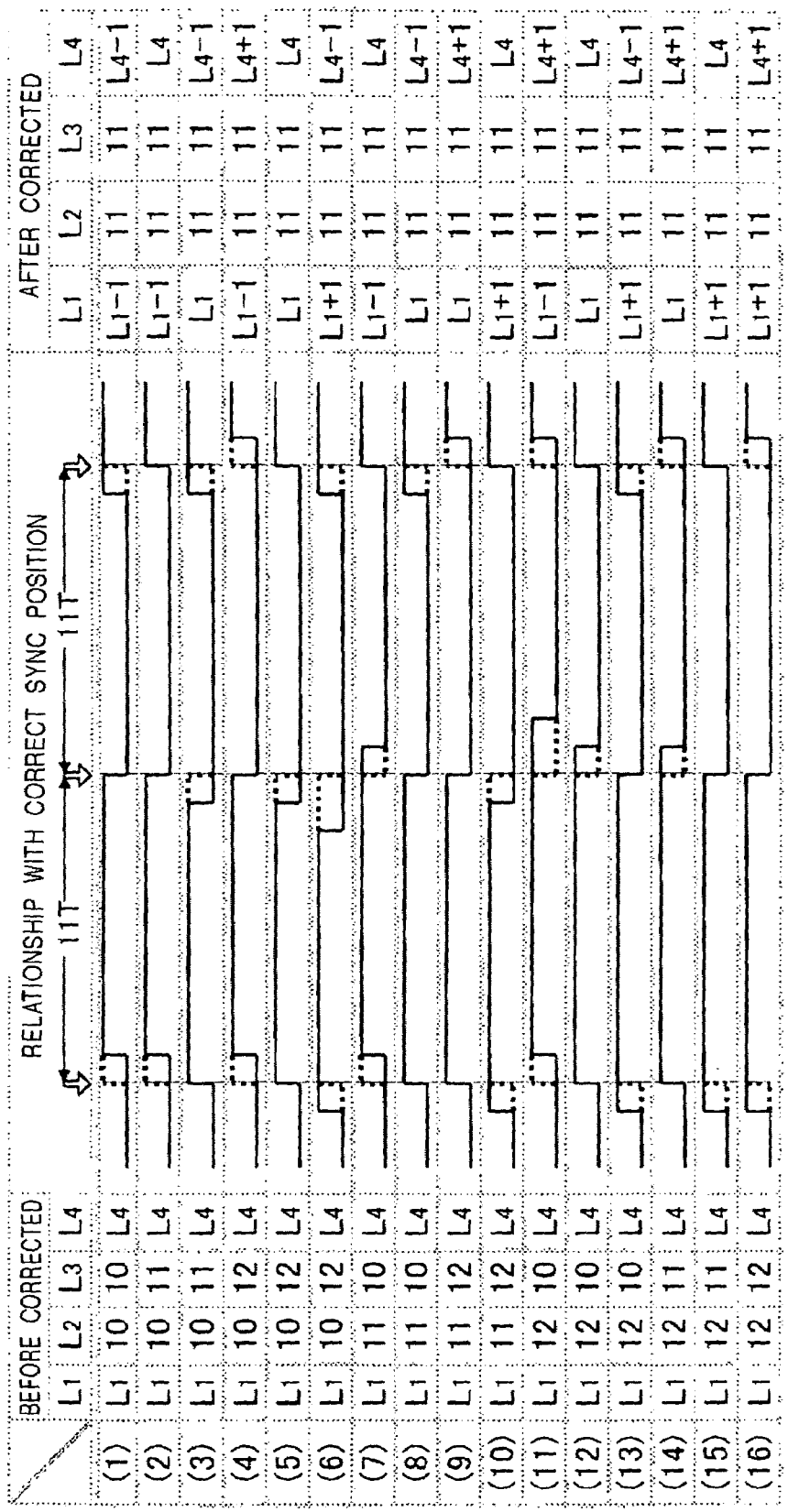
Figure 63:
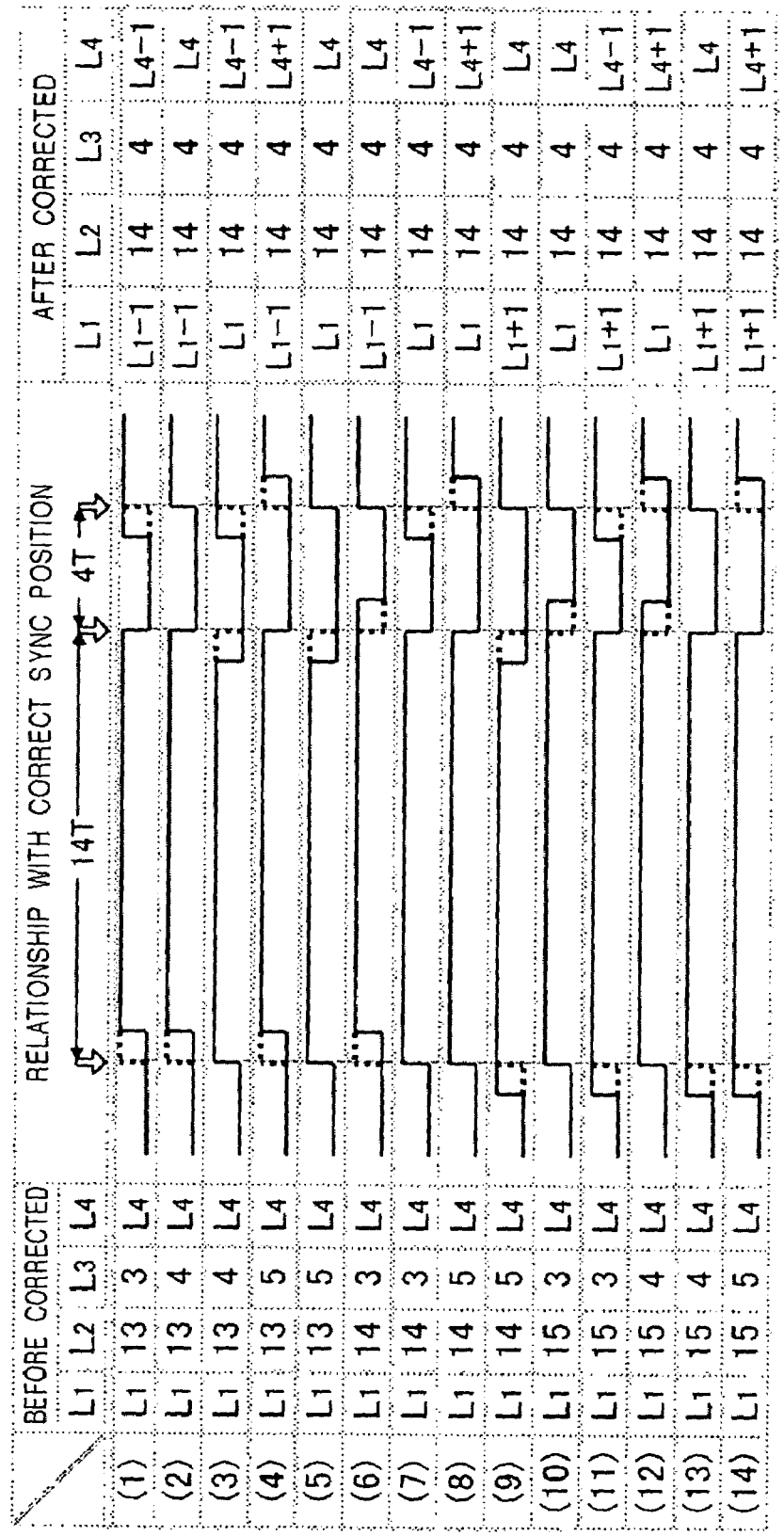

In the methods shown in FIGS. 62 and 63, corrections are conducted based on the concept that the correct position of a sync pattern is 588T for a CD and 1488T for a DVD from the position of the previous sync pattern.

More specifically, for a CD in FIG. 62, it is determined whether the edge position between 11T ($L_2$) and 11T ($L_3$) is 588T from the previous sync pattern. If not, a deviation is adjusted to this correct position, and if necessary, the previous and subsequent pulse lengths ($L_1$ and $L_4$) are increased or decreased.

For a DVD in FIG. 63, it is determined whether the edge position between 14T ($L_2$) and 4T ($L_3$) is 1488T from the previous sync pattern. If not, a deviation is adjusted to this correct position, and if necessary, the previous and subsequent pulse lengths ($L_1$ and $L_4$) are increased or decreased.

Figure 64:
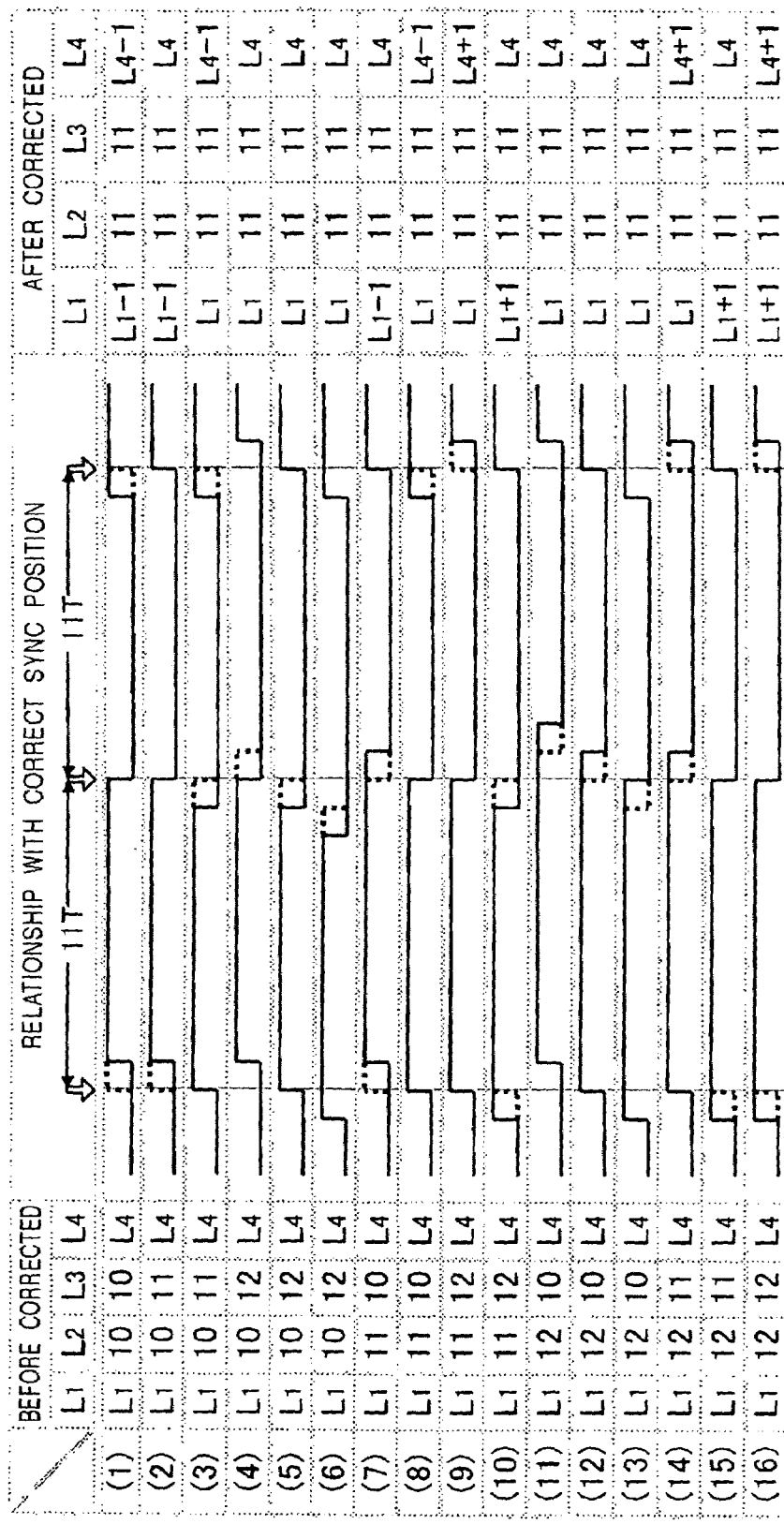
Figure 65:
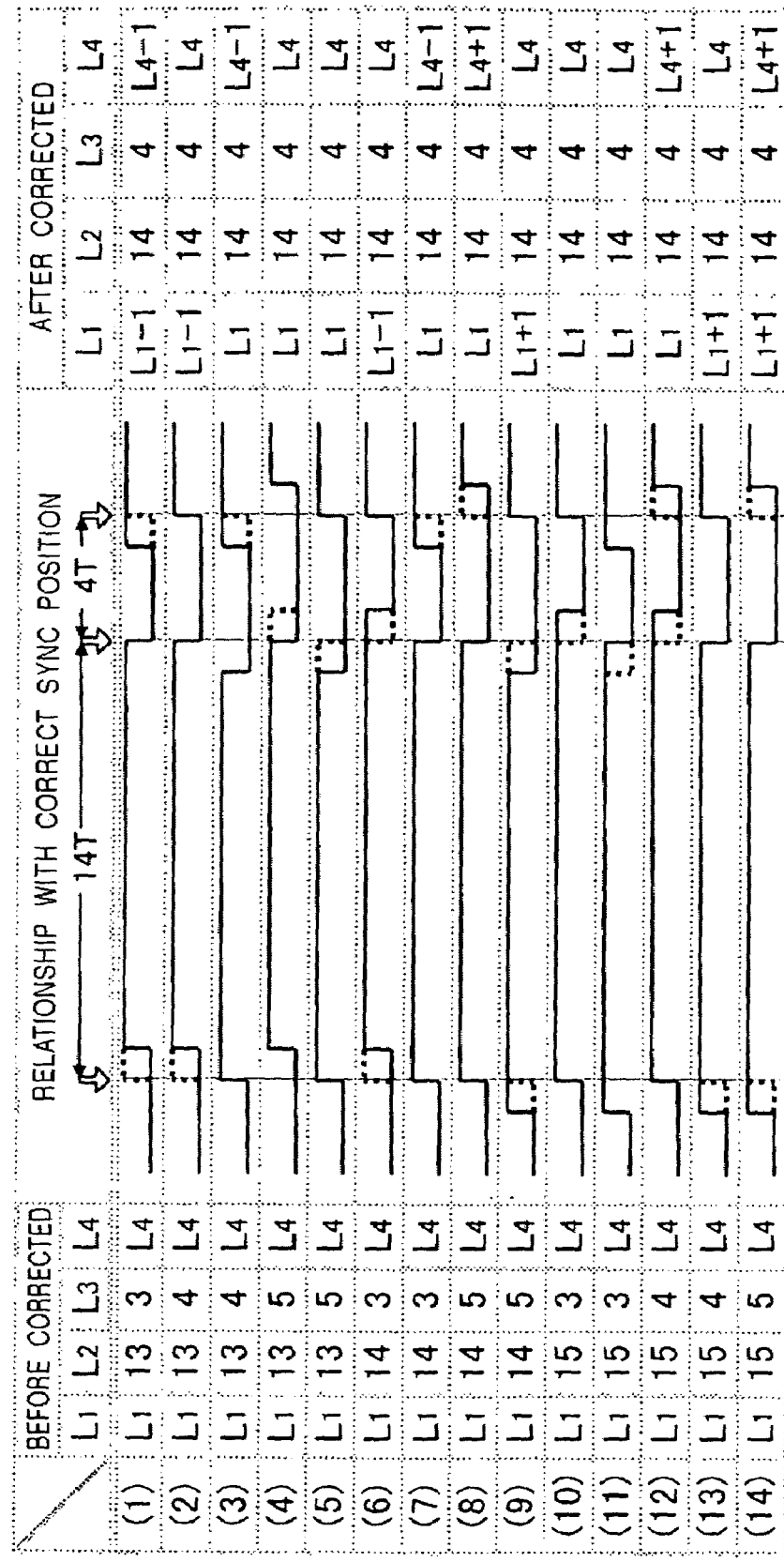

In the methods shown in FIGS. 64 and 65, corrections are conducted based on the concept of the cycle of sync patterns as in the methods in FIGS. 62 and 63. However, if deviations are large, corrections are not restricted by the above concept. For example, in cases (4), (6), and (11) for a CD in FIG. 64, corrections are conducted without considering the 588T cycle, and in cases (3) and (4) for a DVD in FIG. 65, corrections are conducted without considering the 1488T cycle.

Figure 66:
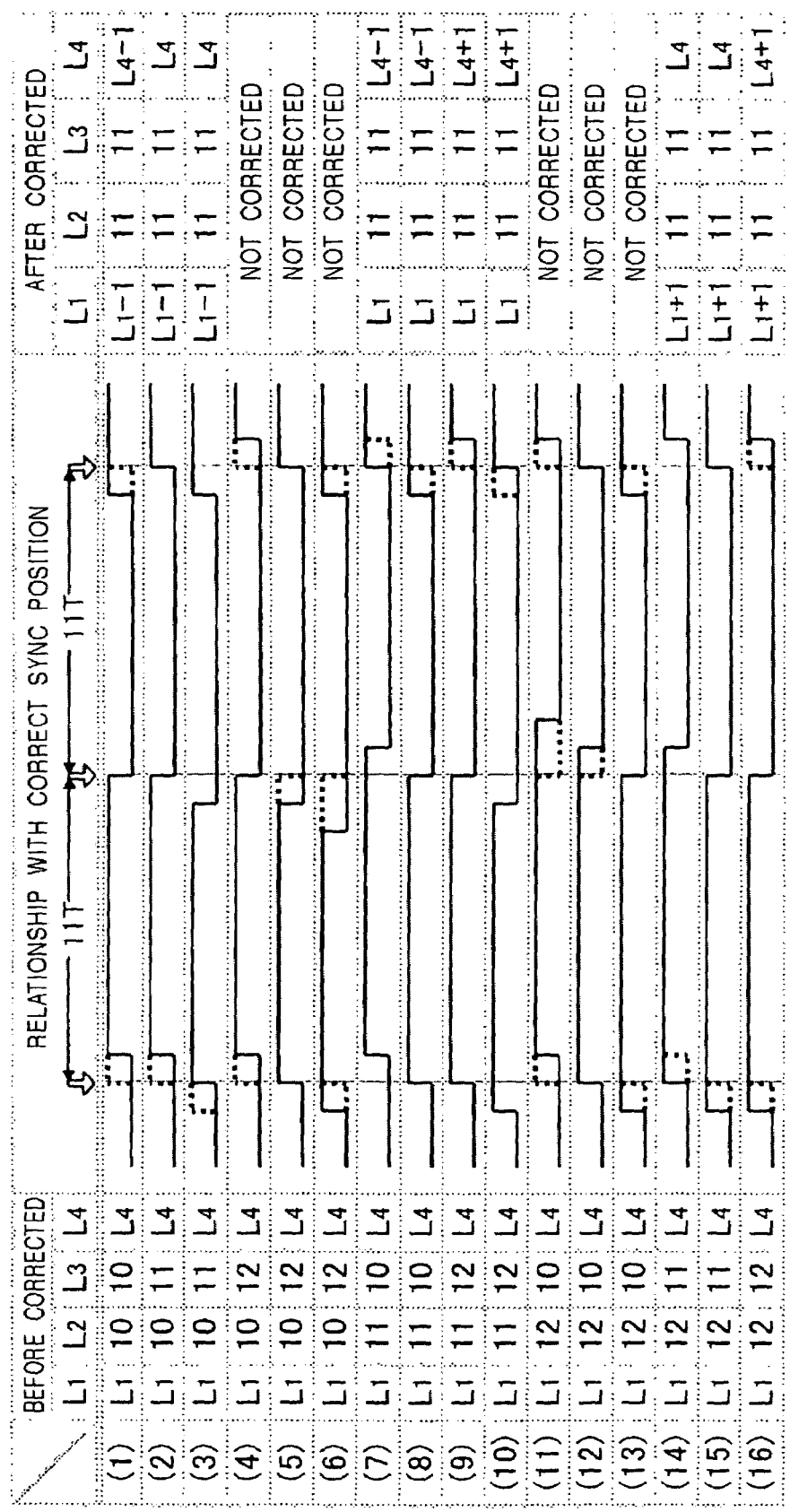
Figure 67:
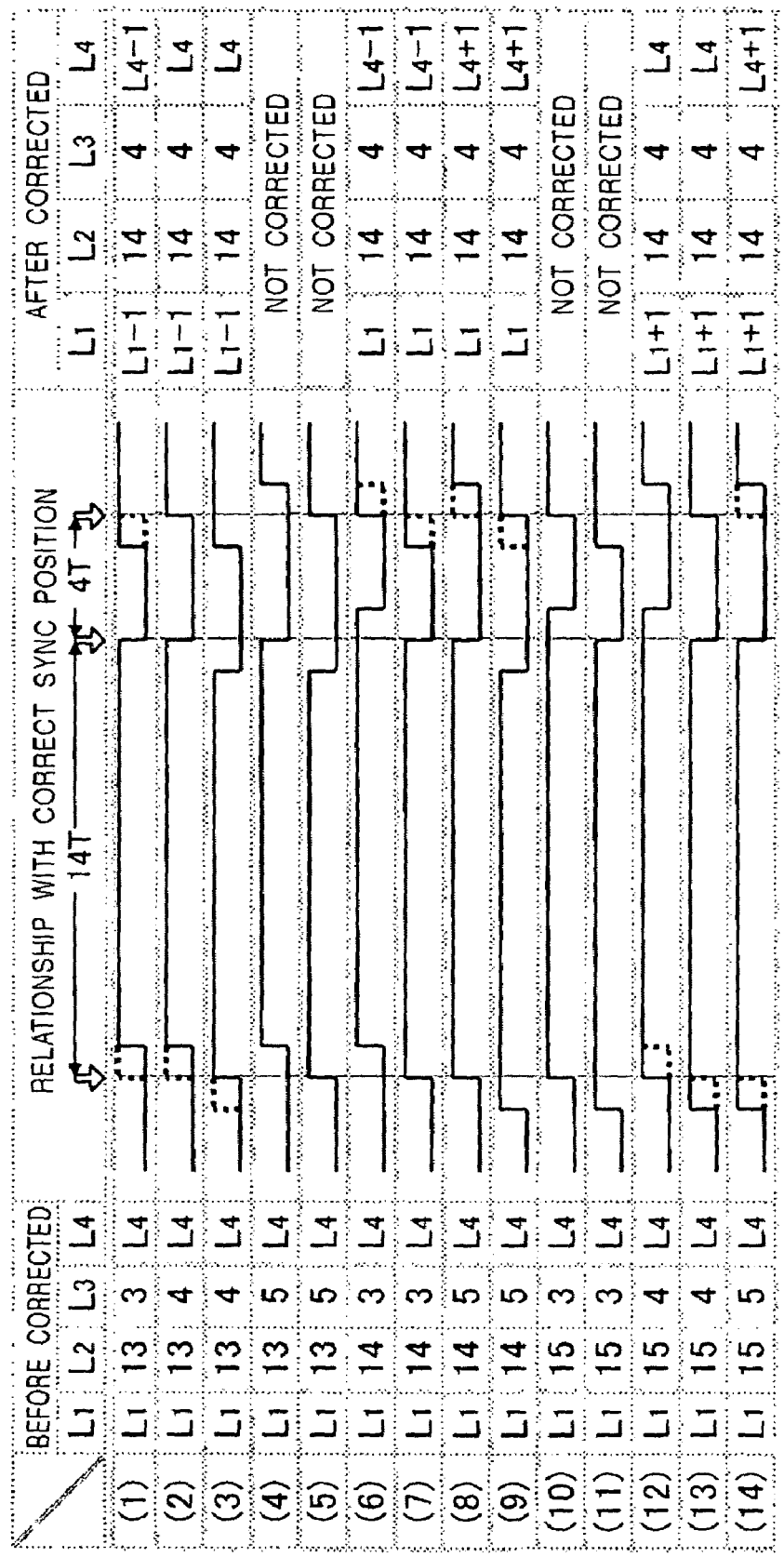

The methods shown in FIGS. 66 and 67 are based on the presence of run-length data having the same length as the sync pattern in the sync cycle. That is, if there is run-length data having 11T for a CD and if there is run-length data having 14T or 4T for a DVD, it is determined to be a correct pattern, and the other run-length data is corrected.

For example, if $L_2$ or $L_3$ is 11T as in cases (2), (3), (7) through (10), (14), and (15) in FIG. 66, the other pulse length is corrected based on 11T.

If $L_2$ is 14T or $L_3$ is 4T as in cases (2), (3), (7), (8), (9), (12), and (13) in FIG. 67, the other pulse length is corrected based on 14T or 4T.

Figure 68:
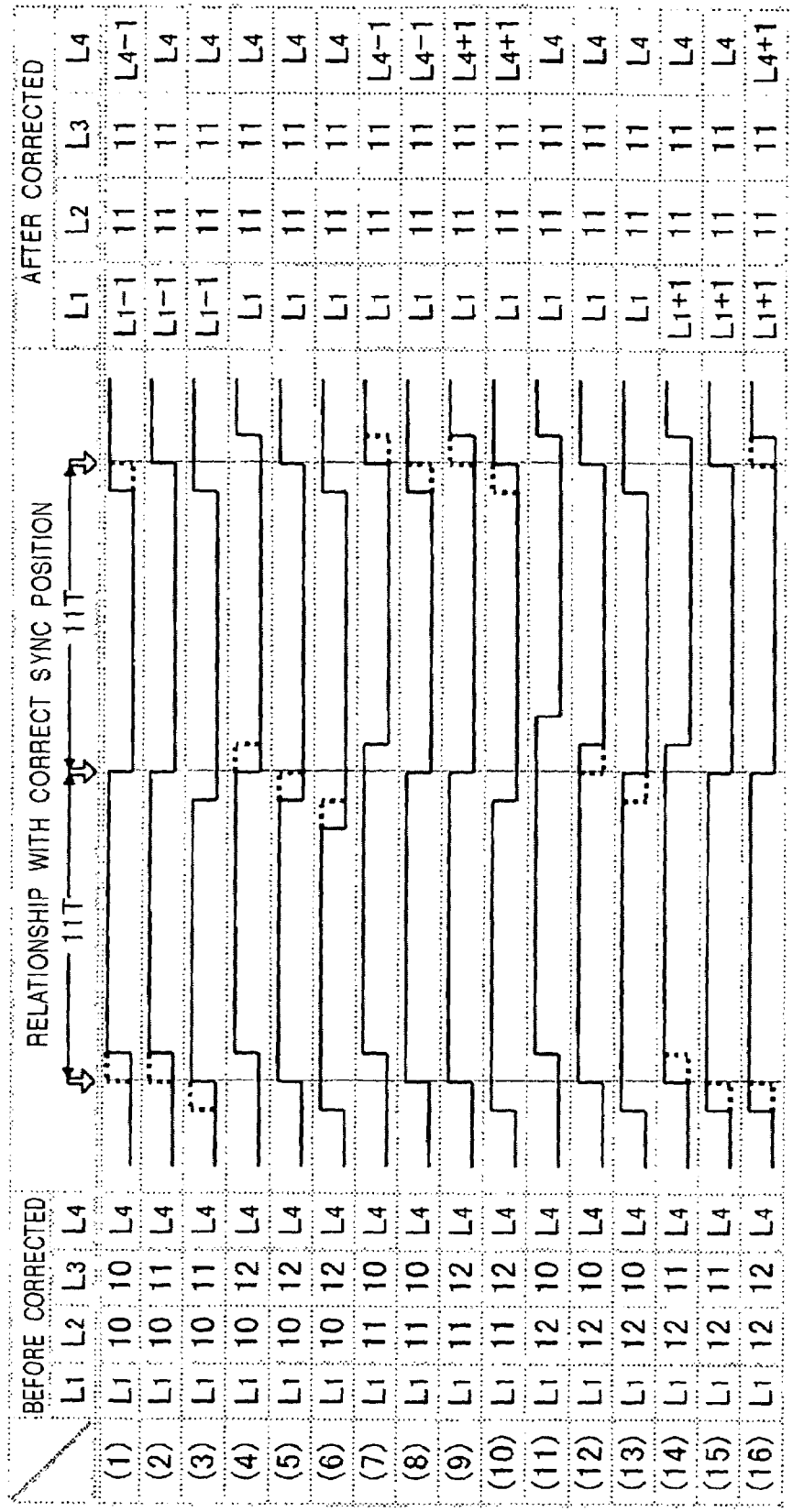
Figure 69:
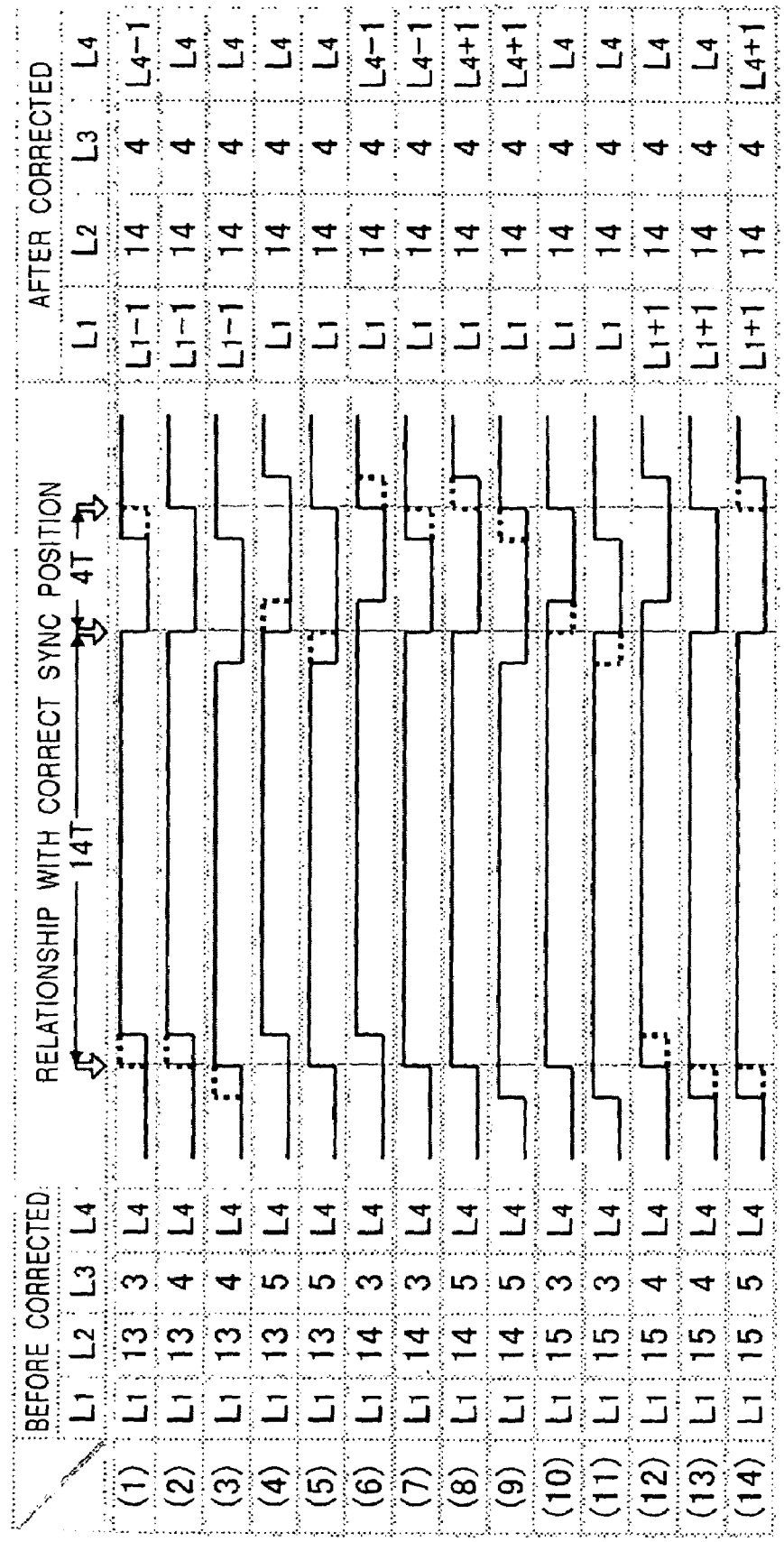

In the methods shown in FIGS. 68 and 69, corrections are conducted based on the same concept as in the methods shown in FIGS. 66 and 67. However, if deviations are large, corrections are not restricted by the presence of run-length data having the same length as the sync pattern.

That is, patterns which are not corrected in the methods in FIGS. 66 and 67 are corrected in the methods shown in FIGS. 68 and 69.

6-3-11 Monitor Signal

Corrections are conducted on run-length data according to the various methods described above. In this case, it is preferable that it can be externally monitored which method is used to correct run-length data. Accordingly, the RLL circuit 6 outputs a monitor signal indicating the type of method used. This makes it possible to detect the types of poor quality disks from the correction methods and the frequency of corrections.

7. 16-Phase and 2-Terminal VCO

As described above, the 16-phase 2-terminal VCO 10 controls the oscillation frequency of the VCO by using the rough control terminal and the fine control terminal.

Figure 70:
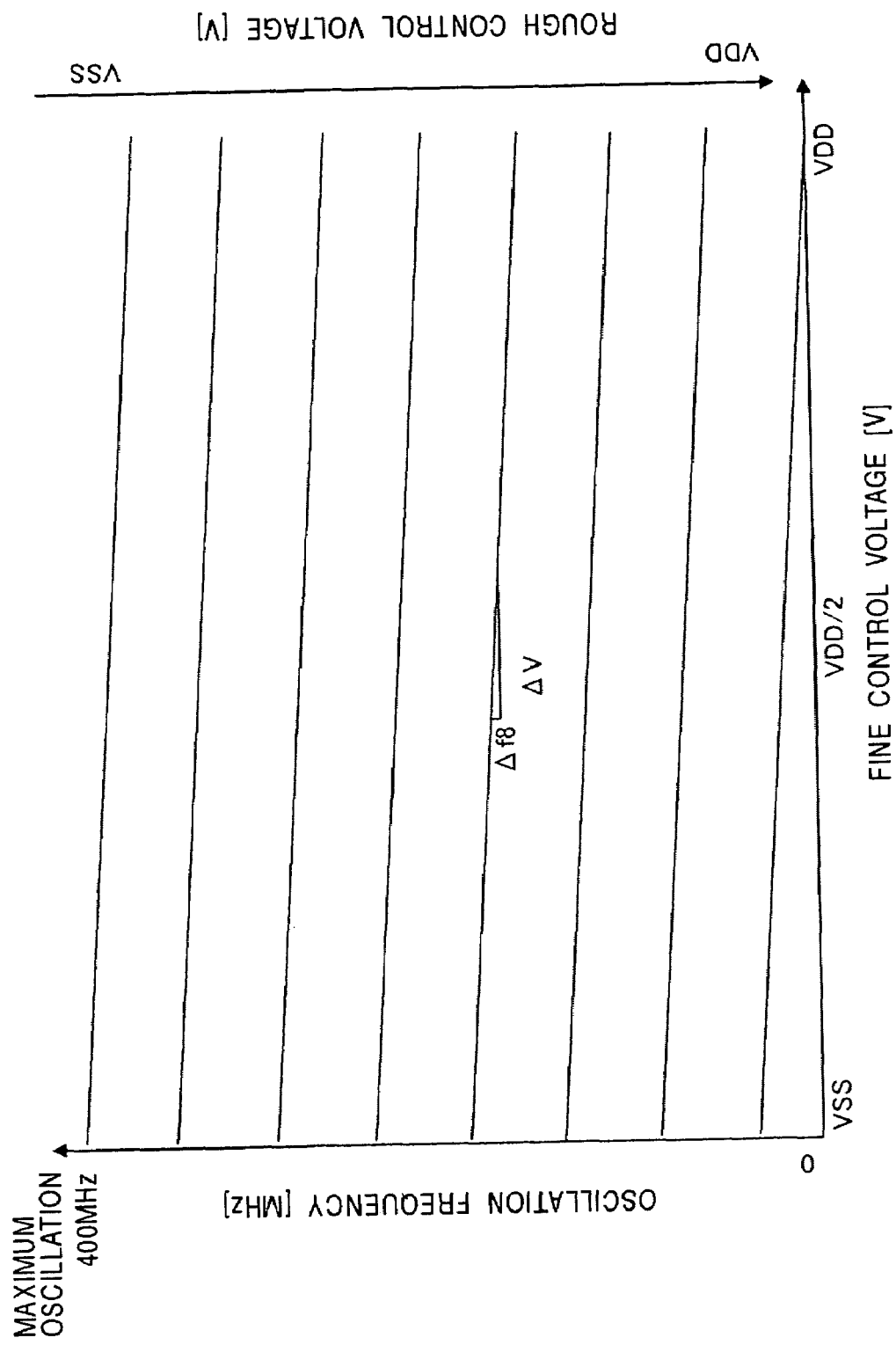
FIG. 70 illustrates characteristics of a 16-phase 2-terminal VCO 10 in this embodiment.

FIG. 70 illustrates the oscillation frequency of the 16-phase 2-terminal VCO 10 with respect to the control voltages. The horizontal axis represents VCF, the left vertical axis indicates the oscillation frequency, and the right vertical axis designates VCR. The oscillation frequency is maximized when the control voltages are VSS, and is minimized when the control voltages are VDD. The oscillation frequency changes sharply in accordance with a change in the VCR and changes gently in accordance with a change in the VCF. A frequency change in accordance with the VCF is indicated by $\Delta f8/\Delta V$.

In the 16-phase 2-terminal VCO 10, the frequency is adjusted roughly by the VCR and is adjusted finely by the VCF.

Figure 86:
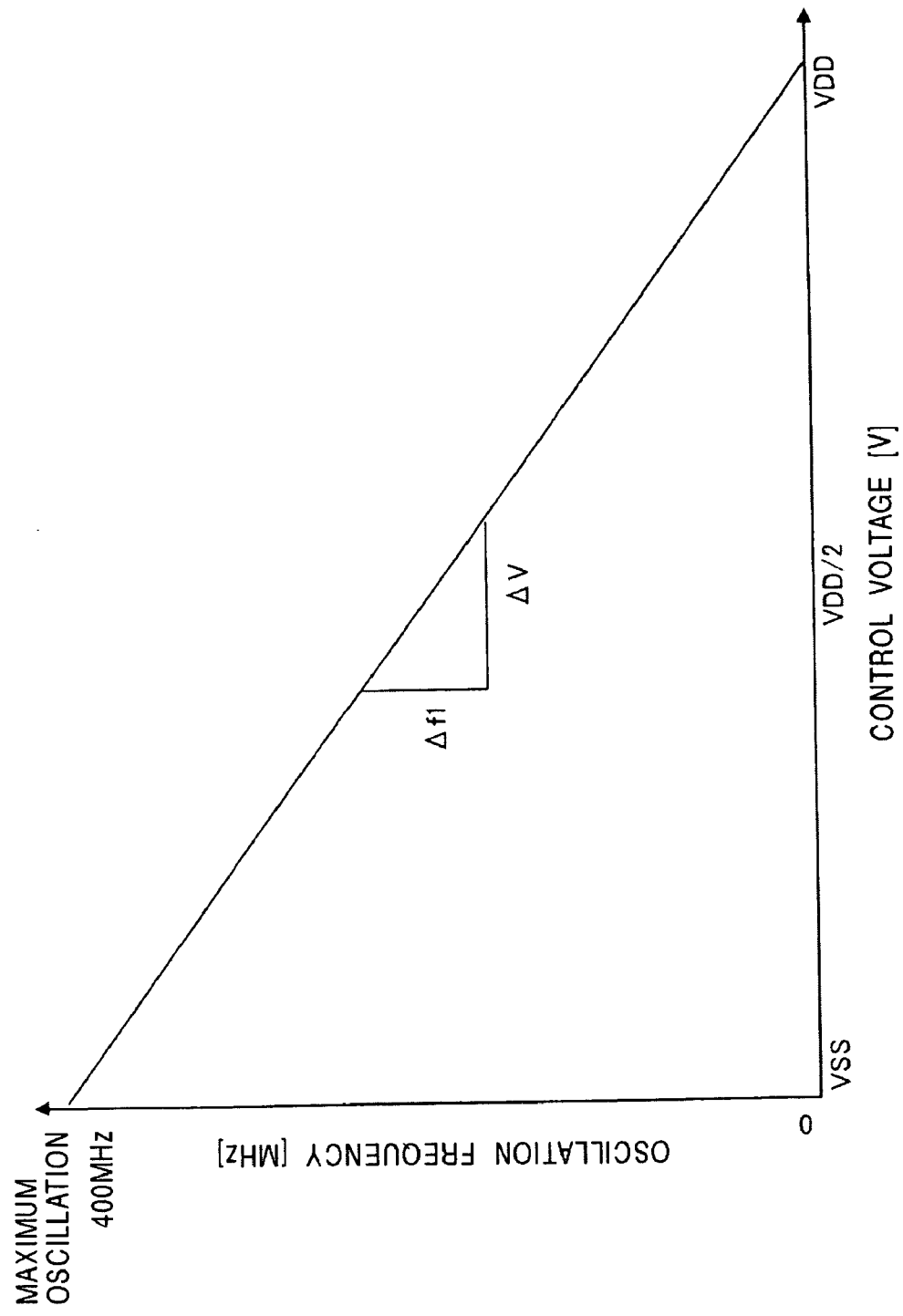
FIG. 86 illustrates frequency characteristics of a one-terminal control VCO.

Compared to a large frequency change as indicated by $\Delta f1/\Delta V$ of FIG. 86 when a known one-terminal VCO is used, a, frequency change is smaller as indicated by $\Delta f8/\Delta V$ of FIG. 70 when the 16-phase 2-terminal VCO 10 of this embodiment is used.

Accordingly, noise added to the VCF does not seriously influence the playability since a frequency change is small. Thus, the time constant of a VCF low-pass filter does not have to be large, and the capability of following a fluctuation due to the eccentricity of a disk or the rotation of a spindle motor can be increased.

On the other hand, noise added to the VCR seriously influences the playability. This can be, however, solved by increasing the time constant of the VCR low-pass filter. Since a small frequency change is controlled by the VCF, the capability of following a fluctuation in normal playback operation is not decreased even if the time constant of the VCR low-pass filter is increased.

Figure 87:
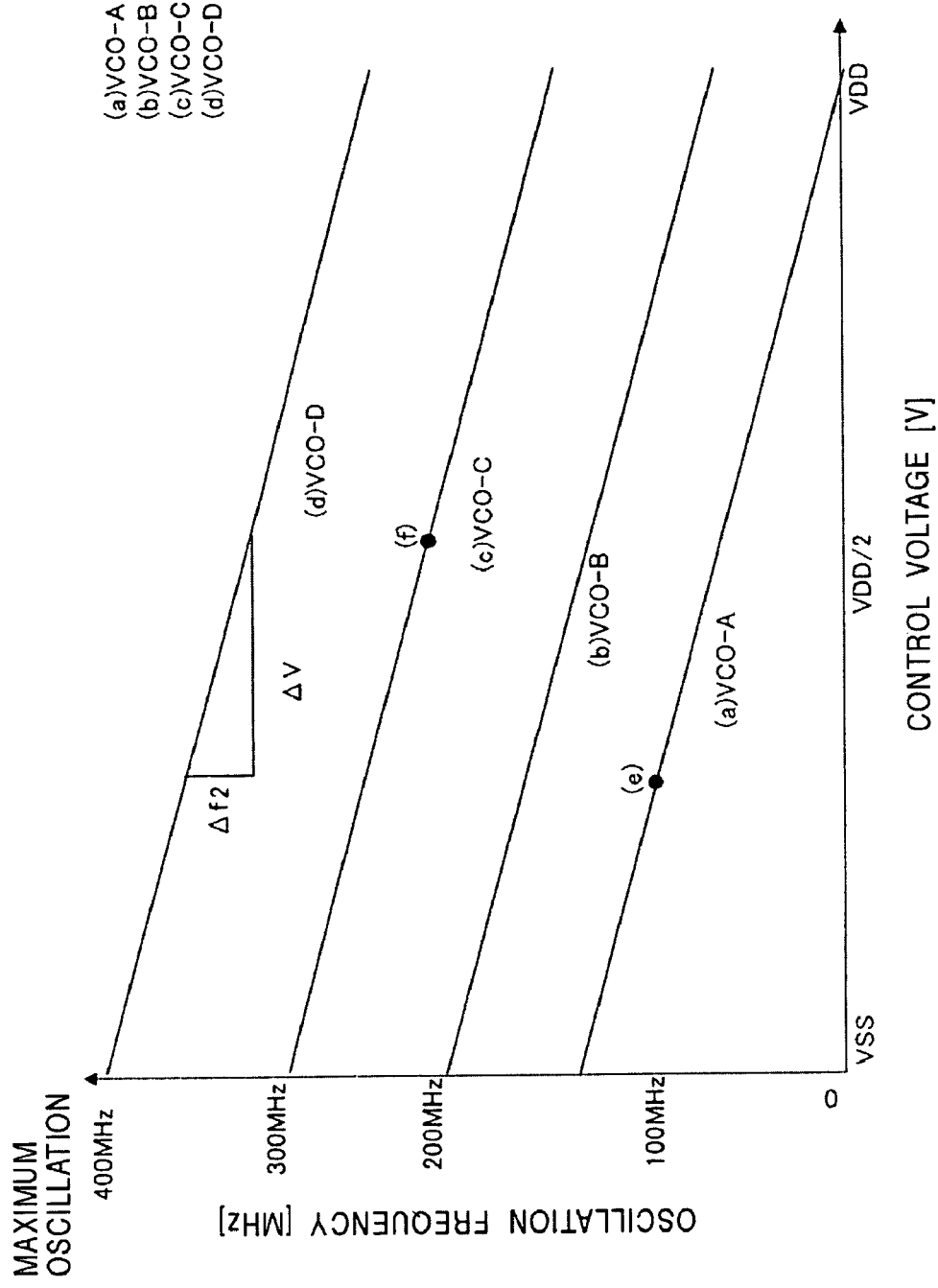
FIG. 87 illustrates frequency characteristics when four one-terminal VCOs are used.
Figure 88:
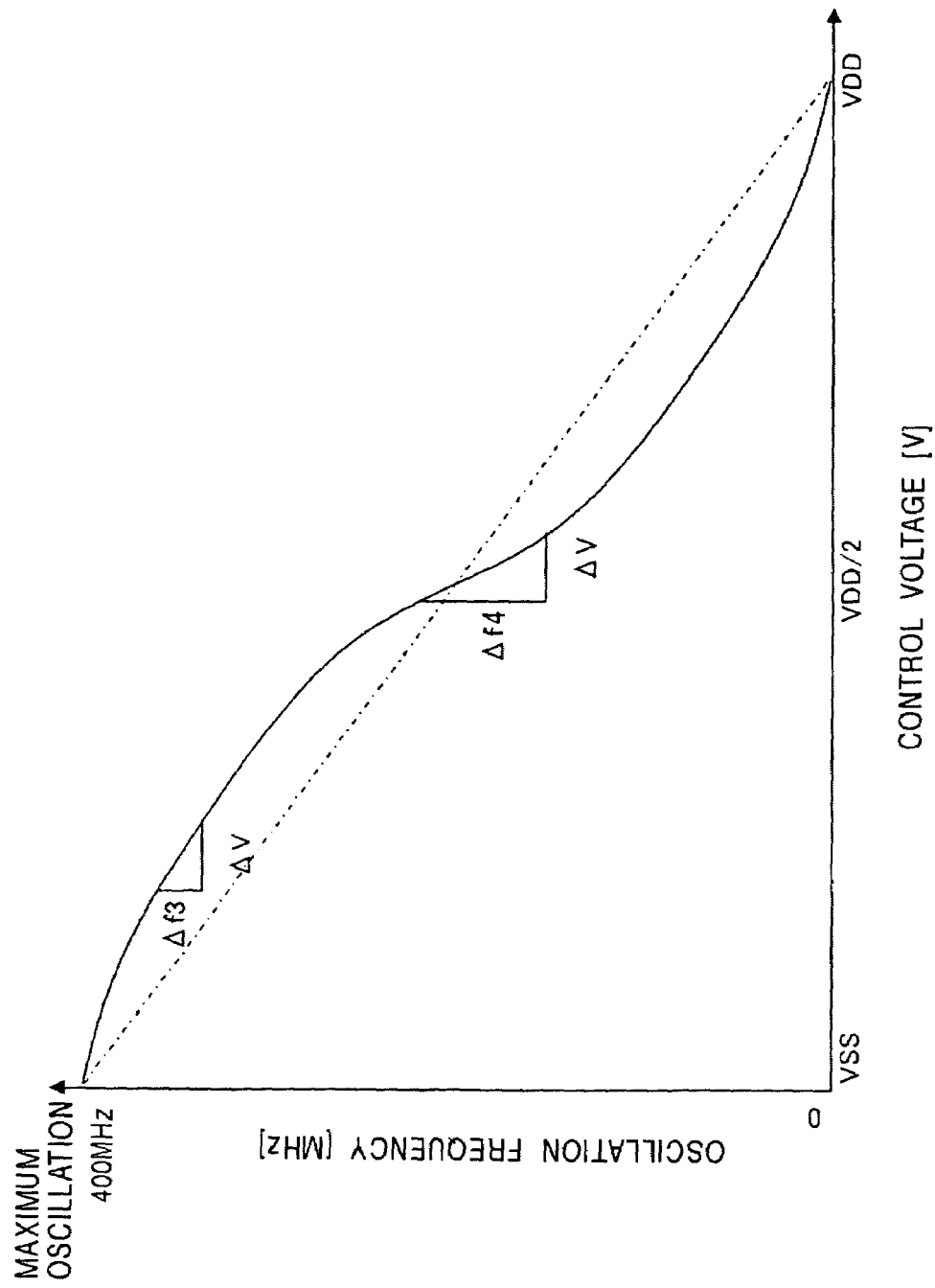
FIG. 88 illustrates frequency characteristics of an actual VCO.
Figure 90:
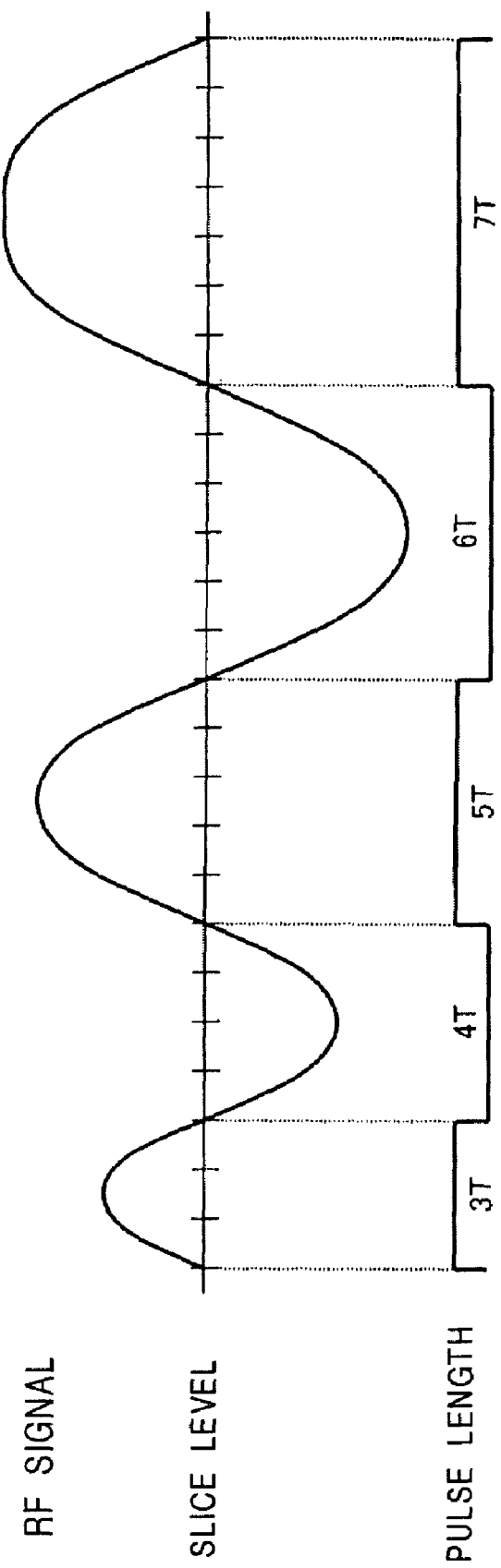
FIG. 90 illustrates the influence of asymmetry deviation on the binarization of an RF signal.

Unlike a known technique for switching a plurality of VCOs, as shown in FIG. 87, both the VCR and VCF terminals can be linearly controlled, thereby seamlessly controlling the oscillation frequency. Thus, wide-band oscillation from ×0.5 to ×48 for a CD and from ×0.5 to ×16 for a DVD can be implemented.

The control operation of the 16-phase 2-terminal VCO 10 is discussed below.

Figure 71:
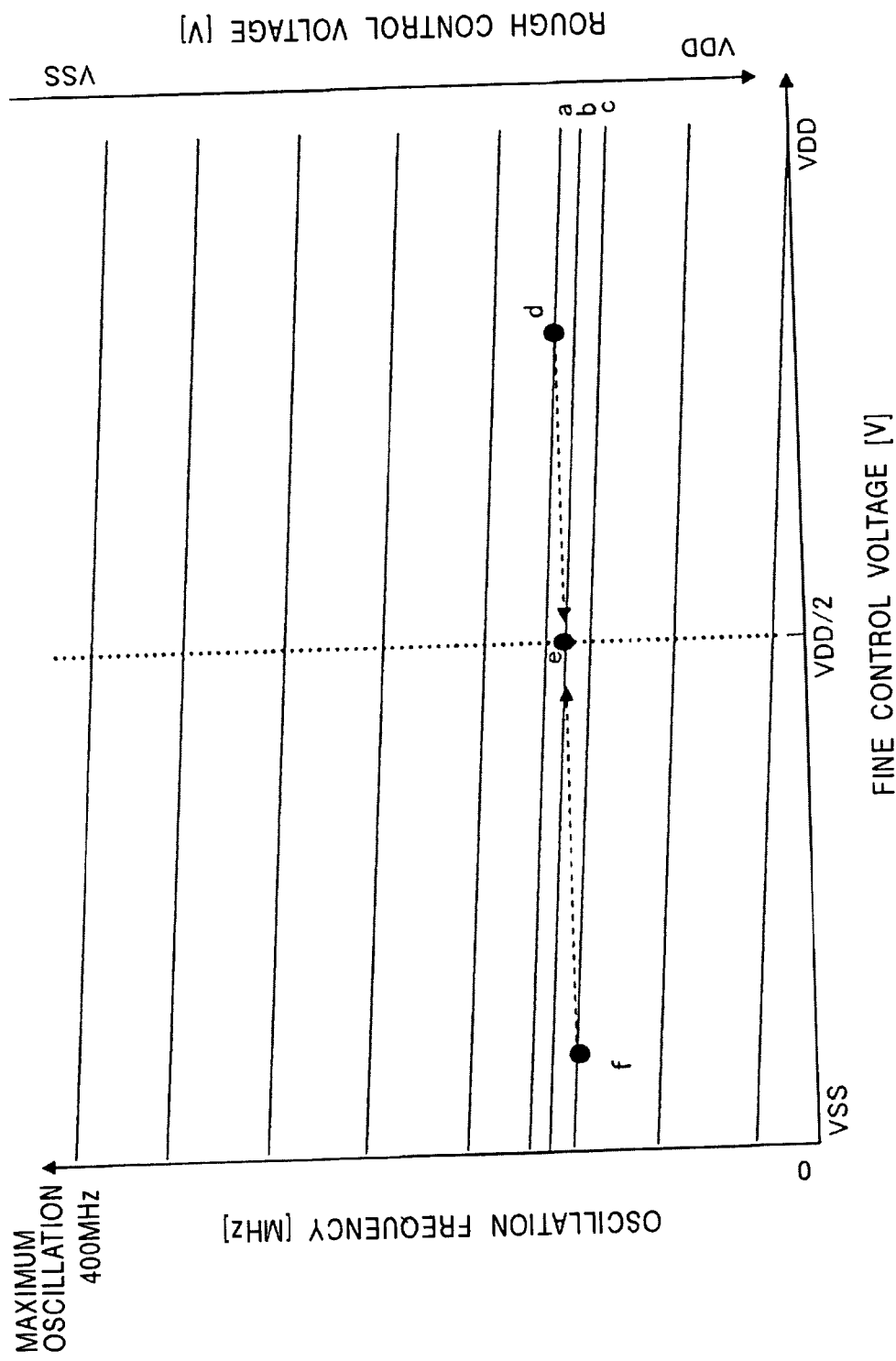
FIG. 71 illustrates a control method for the 16-phase 2-terminal VCO 10 in this embodiment.

The VCO 10 performs control so that VCF is maintained at VDD/2. In FIG. 71, when VCR is a and VCF is d, VCR is changed from a to b and VCF is changed from d to e so that VCF becomes VDD/2 at the same oscillation frequency.

Similarly, when VCR is c and VCF is f, VCR is changed from c to b and VCF is changed from f to e.

In this manner, when VCF is not VDD/2, the VCO 10 controls VCR so that VCF becomes VDD/2, thereby implementing a seamless operation.

Figure 72:
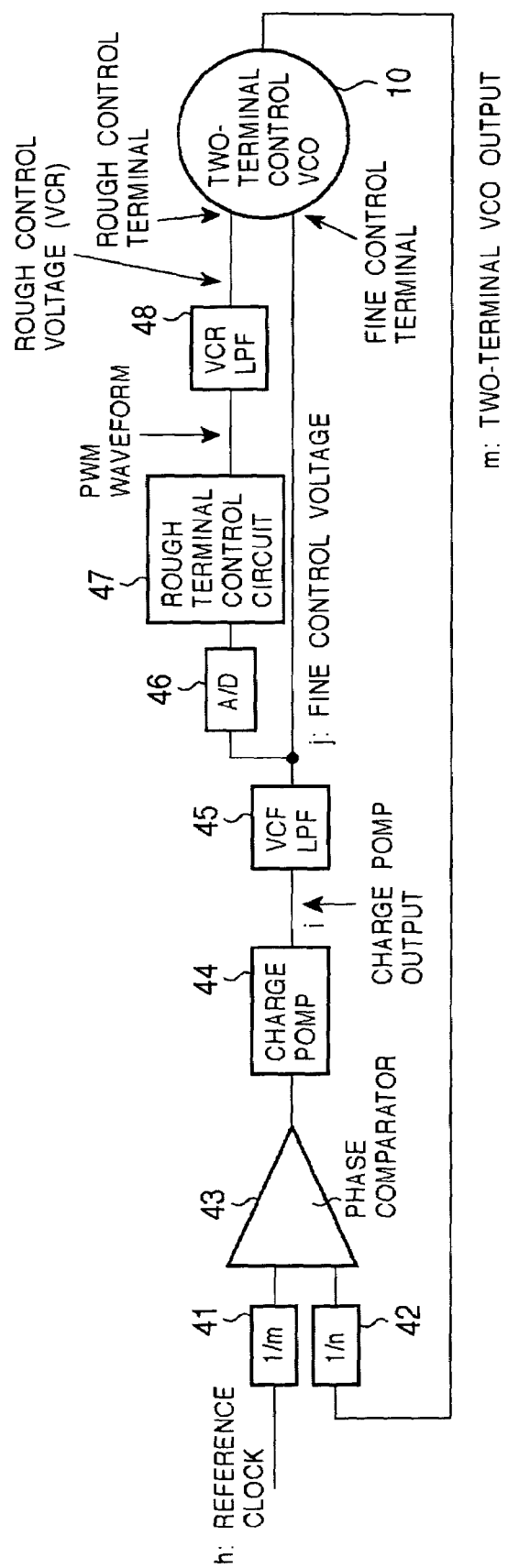
FIG. 72 is a block diagram illustrating a two-terminal VCO control circuit in this embodiment.

FIG. 72 illustrates the PLL configuration for a two-terminal VCO, that is, the configuration of the two-terminal VCO control circuit 9 for the 16-phase 2-terminal VCO 10.

The two-terminal VCO control circuit 9 includes a 1/m scaler 41, a 1/n scaler 42, a phase comparator 43, a charge pump 44, a VCF low-pass filter 45, an analog-to-digital (A/D) converter 46, a rough terminal control circuit 47, and a VCR low-pass filter 48.

The reference clock is supplied to the 1/m scaler 41 from the master PLL control circuit 8. The output of the VCF low-pass filter 45 is input into the fine control terminal of the 16-phase 2-terminal VCO 10. The output of the VCR low-pass filter 48 is input into the rough control terminal of the 16-phase 2-terminal VCO 10. The oscillation frequency of the 16-phase 2-terminal VCO 10 is supplied to the 1/n scaler 42.

Figure 73:
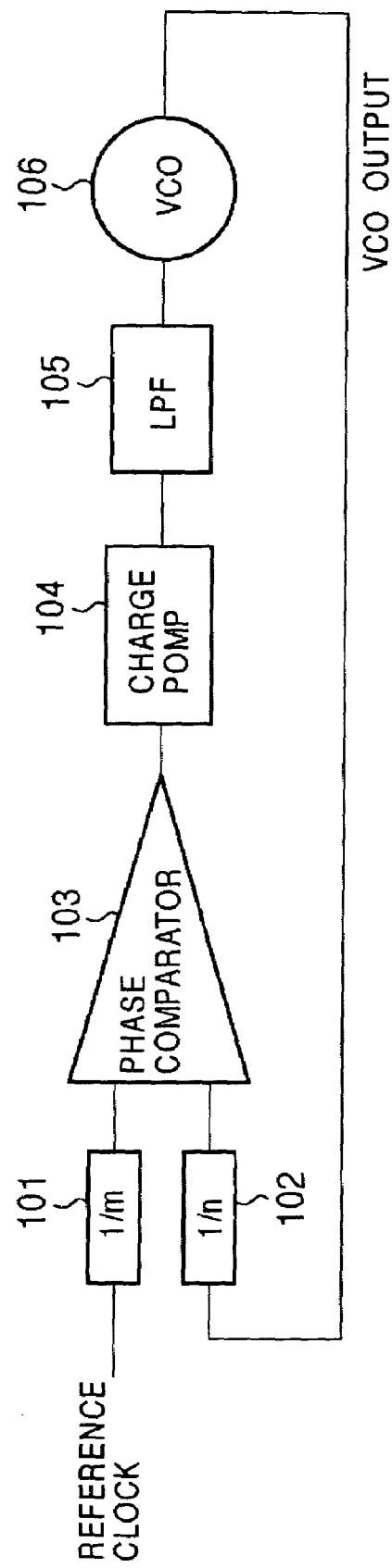
FIG. 73 is a block diagram illustrating a general PLL circuit configuration.

With this configuration, the 1/m scaler 41, the 1/n scaler 42, the phase comparator 43, the charge pump 44, the VCF low-pass filter 45, and the 16-phase 2-terminal VCO 10 form a fine control loop, which is similar to a general PLL. A general PLL circuit configuration is shown in FIG. 73, and the 1/m scaler 41, the 1/n scaler 42, the phase comparator 43, the charge pump 44, the VCF low-pass filter 45, and the 16-phase 2-terminal VCO 10 correspond to a 1/m scaler 101, 1/n scaler 102, a phase comparator 103, a charge pump 104, a low-pass filter 105, and a VCO 106, respectively.

The reference clock from the master PLL circuit 8 is scaled in the 1/m scaler 41, and the output of the 16-phase 2-terminal VCO 10 is scaled in the 1/n scaler 42, and the resulting outputs are input into the phase comparator 43. The phase comparator 43 outputs a phase difference between the two outputs into the charge pump 44. The charge pump 44 outputs the phase difference signal as a three-level pulse wave modulation (PWM).

Figure 74:
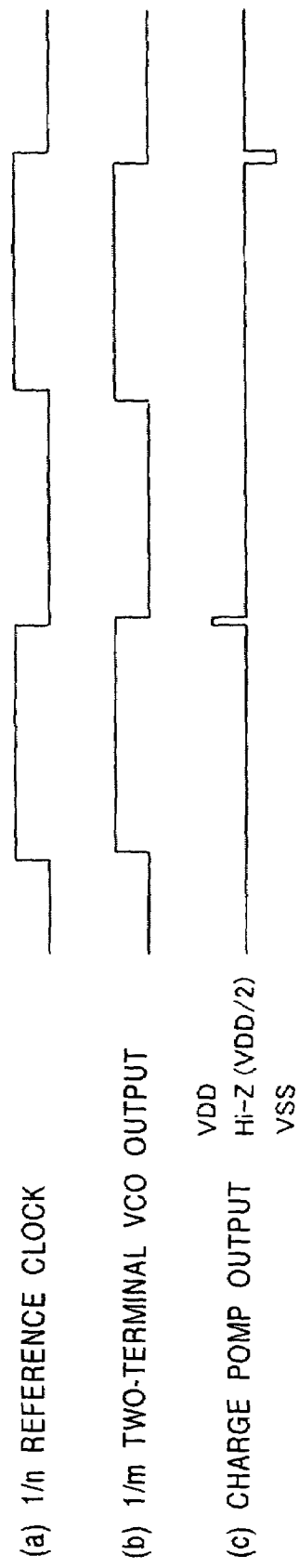
FIG. 74 is a waveform diagram illustrating the input of a phase comparator and the output of a charge pump in this embodiment.

The inputs of the phase comparator 43 and the output of the charge pump 44 are shown in FIG. 74. The difference between the two signals input into the phase comparator 43 indicated by (a) and (b) of FIG. 74, i.e., the difference of the falling edge between the 1/m reference clock and the 1/n output of the 16-phase 2-terminal VCO 10 is converted into a three-level PWM waveform, as indicated by (c) of FIG. 74, by the charge pump 44.

The time constant of the VCF low-pass filter 45 is set to be small in order to improve the capability of following a fluctuation. The VCF is then determined after the VCF low-pass filter 45, and is input into the fine control terminal of the 16-phase 2-terminal VCO 10.

The rough control loop is formed by the 1/m scaler 41, the 1/n scaler 42, the phase comparator 43, the charge pump 44, the VCF low-pass filter 45, the A/D converter 46, the rough terminal control circuit 47, the VCR low-pass filter 48, and the 16-phase 2-terminal VCO 10.

In this rough control loop, the VCF from the VCF low-pass filter 45 is A/D-converted in the A/D converter 46. In this case, the VCF is converted to VDD as the maximum and VSS as the minimum.

The rough terminal control circuit 47 processes the A/D-converted VCF in the following manner. The VDD/2 is set as the center, and the VCF at the VDD side is set to be + and the VCF at the VSS side is set to be –, and the resulting VCF is output as a three-level PWM waveform H, L, and Hi-Z.

Figure 75:
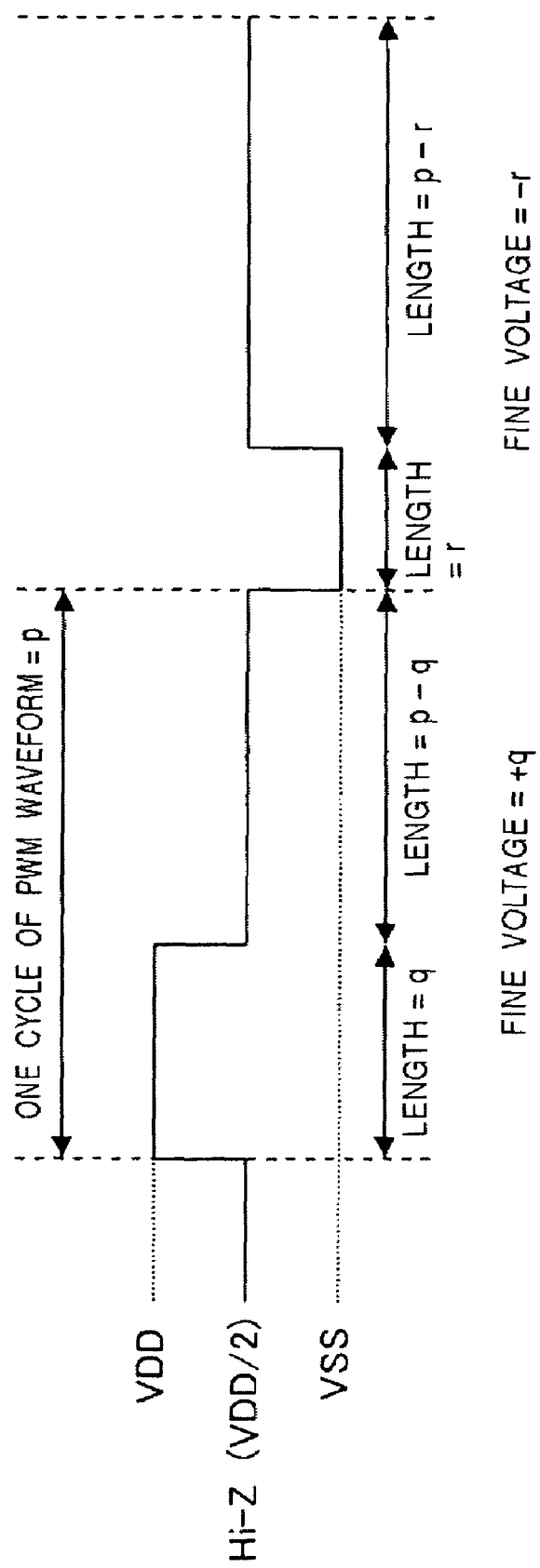
FIG. 75 is a waveform diagram illustrating the output of a rough terminal control circuit in this embodiment.

The PWM waveform output from the rough terminal control circuit 47 is shown in FIG. 75. One cycle of the PWM waveform is set to be p. As stated above, when VCF>VDD/2, the VCR is increased, and when VCF<VDD/2, the VCR is decreased, so that the VCF becomes VDD/2.

Accordingly, in FIG. 75, when VCF=+q, H is output in the zone q, and Hi-Z is output in the remaining zone p-q.

When the VCF is –r, L is output in the zone –r, and Hi-Z is output in the remaining zone p-r.

In this manner, in the PWM waveform, H and L are output according to the lengths of q and r, which are deviations of VCF from VDD/2. Accordingly, when the value of q or r is larger, the length of H or L becomes shorter, and when the value of q or r is smaller, the length of H and L becomes shorter.

This PWM waveform is set to be VCR after passing through the VCR low-pass filter 48, and is input into the rough control terminal of the 16-phase 2-terminal VCO 10.

The frequency changes sharply in accordance with a change in the VCR control voltage. Accordingly, the time constant of the VCR low-pass filter 48 is set to be sufficiently large so that the voltage changes gently.

With this configuration, in the VCO 10, the reference clock is controlled by the two terminals, i.e., the fine terminal and the rough terminal. It is thus possible to provide a PLL implementing seamless operation and exhibiting a high carrier-to-noise (C/N) ratio in a wide band.

8. Jitter Meter

The jitter meter 7 calculates the amount of errors to be accumulated from phase errors of the edges of the RF signal to the virtual channel clock, integrates the amount of errors in a set cycle, and outputs the resulting amount as a jitter value. Errors are accumulated in every 8 frames of the RF signal.

Phase errors generated in the phase-control/data-extracting circuit 5 are shown in FIG. 76 in comparison with FIGS. 23 and 24.

In the 1T/16 phase control mode shown in FIG. 23, phase errors are generated with a precision of 1T/16. In the 1T/32 phase control mode shown in FIG. 24, phase errors are generated with a precision of 1T/32.

The amount of errors accumulated is set as follows. The ideal points of the virtual channel clock, Case A and Case P or Case P', are set to be 0, and when the point is farther than the ideal points, the amount of errors becomes greater.

Figure 77:
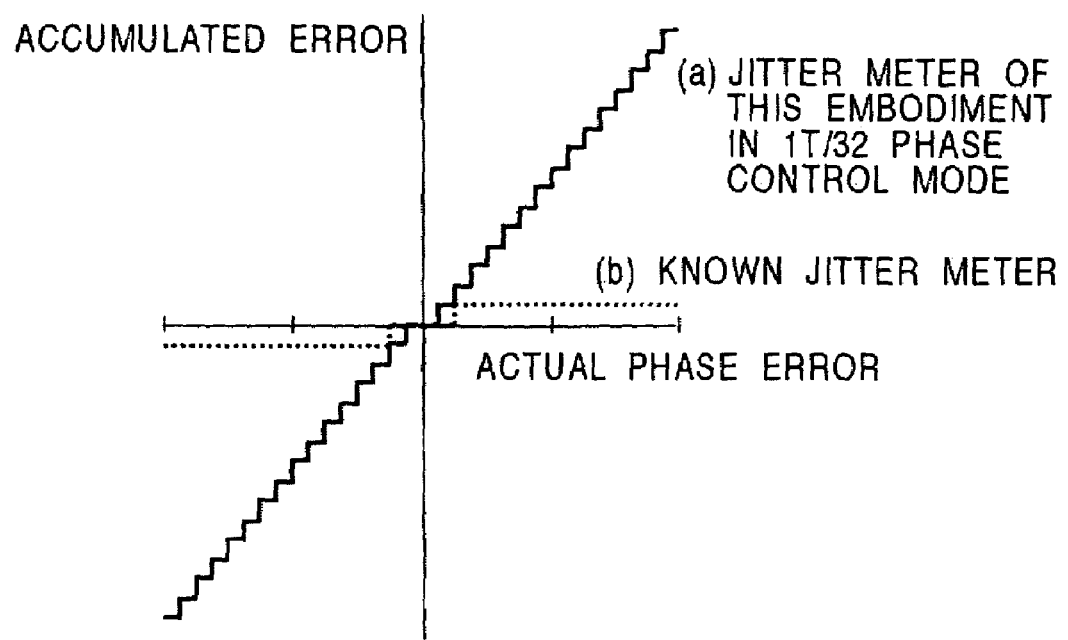
FIG. 77 illustrates the linearity of phase errors by using the jitter meter of this embodiment and a known jitter meter.

The jitter meter 7 is compared with a known jitter meter. FIG. 76 illustrates a conversion table of phase errors when the jitter meter 7 of this embodiment is used in comparison with a conversion table when a known jitter meter is used. FIG. 77 illustrates linear characteristics of phase errors when the jitter meter 7 of this embodiment is used in comparison with linear characteristics when a known jitter meter is used.

FIGS. 76 and 77 show that, in a known jitter meter, phase errors are detected with a precision of 1T/8. Thus, the precision of a known digital PLL system is lower than that of the digital PLL system of this embodiment. Also, in a known jitter meter, the correlation between phase errors and the amount of errors accumulated is low. This is due to the high frequency of a high frequency clock, which is discussed in the related art. In contrast, in this embodiment, the precision of the PLL system is higher, and as phase errors become larger, the amount of errors accumulated also becomes greater. Accordingly, the correlation between the two factors is strong.

Figure 78:
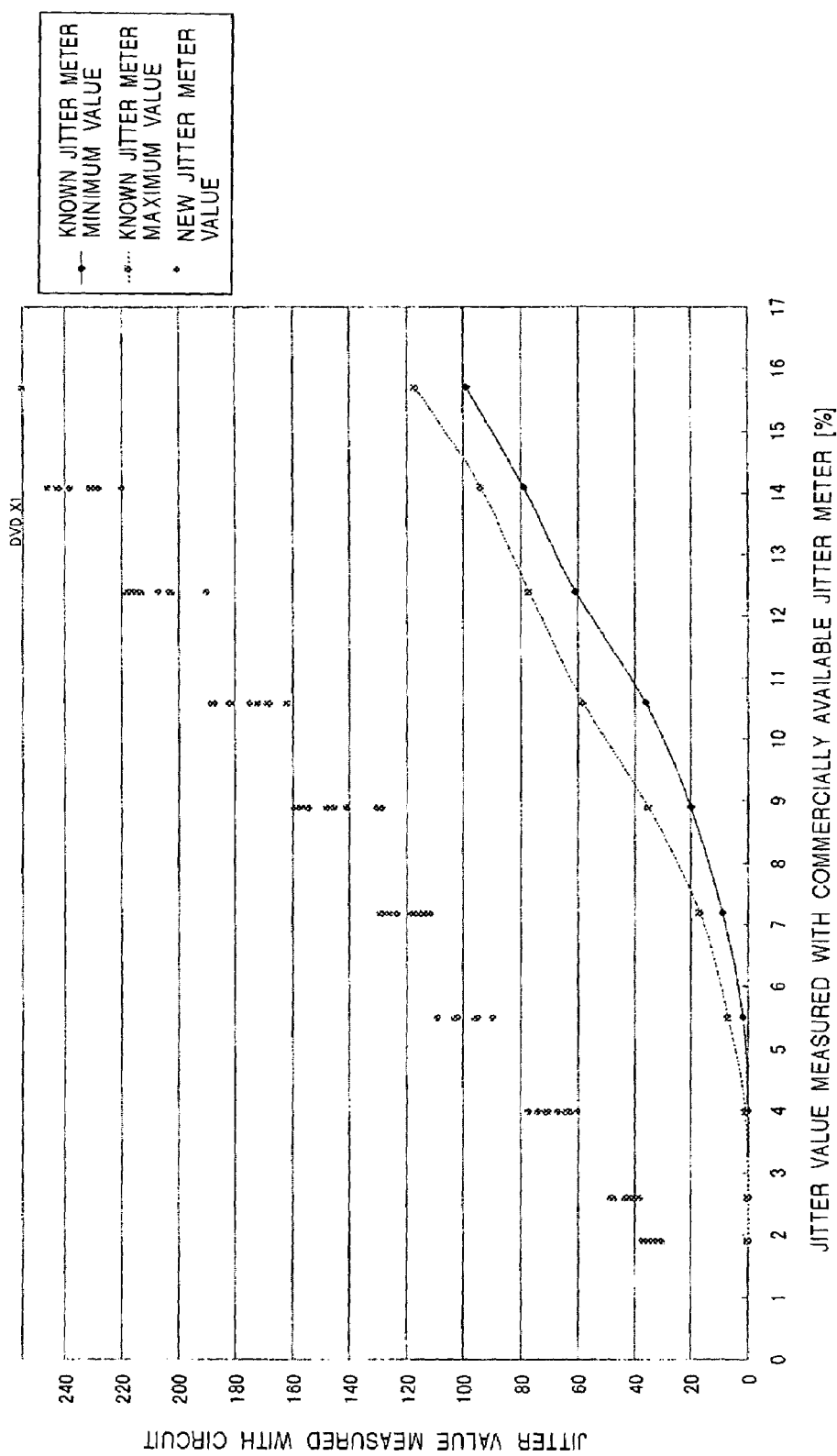
FIG. 78 illustrates values measured with the jitter meter of this embodiment and a known jitter meter.

The characteristics of the jitter meters vary according to the above-described factors. The correlation between the values measured with a commercially available jitter meter (horizontal axis) and the values measured with a known jitter meter and the jitter meter of this embodiment (vertical axis) are shown in FIG. 78. In contrast to the known jitter meter which cannot measure jitter values 5% or smaller, the perfect correlation can be obtained by the jitter meter 7 of this embodiment in the whole range.

As described above, by using high-precision phase errors generated in the phase-control/data-extracting circuit 5, a high-performance jitter meter function can be implemented within an LSI.

9. Advantages of Digital PLL System

As is seen from the foregoing description, in the digital PLL system of this embodiment, by using the 16-phase 2-terminal VCO 10, high-speed operation up to, for example, ×16 for a DVD, can be performed while keeping a low operating frequency equivalent to that of an analog PLL. Additionally, an RF signal can be detected with higher precision than in a known PLL system.

Since the operating frequency can be maintained at low, the life and yield of the LSI can be improved. Since the PLL is digital, a system independent of the temperature change or power supply voltage can be implemented. Due to a wide capture range or lock range, the access time can be decreased.

Asymmetry deviation can be corrected as digital data, and the playback capability of ordinary disks having asymmetry deviation (poor quality disks) can be improved.

By correcting run-length data that does not comply with the format, the playback capability of poor quality disks can be improved. Since all items of corrected data can be monitored, the types of errors of poor quality disks can be easily analyzed.

Sync patterns can be precisely corrected, thereby further strengthening the protection function for the sync patterns.

By using the phase-control loop gain and dead zone, and the phase-control on/off function of run-length data that does not comply with the format, poor quality disks that cannot be conventionally played back can be played back.

Two control terminals, i.e., rough and fine control terminals, are provided for the VCO. This makes it possible to increase the capability of performing seamless operation and following a fluctuation in the time domain of an RF signal while suppressing the influence of noise added to the control voltage.

By setting the nTap Mode, the playback operation can be performed with a high C/N ratio, and the influence of a phase deviation of the clock of the 16-phase 2-terminal VCO 10 can be suppressed.

Phase errors of the edges of an RF signal from the virtual channel clock can be accumulated, thereby making it possible to measure a jitter value with high precision.

The jitter value can be precisely measured at any playback speed, and the waveform shaping of the RF signal according to the playback speed can be performed.

By integrating the jitter meter in an LSI, jitter of an RF signal can be measured without the need to use a commercially available jitter meter. Jitter measuring can be used, for example, when checking products in a final manufacturing process.

10. Phase Error Determination of 16-Phase VCO

10-1 Phase Error

In the above-described digital PLL system of this embodiment, the pulse length of an input RF signal is measured in the pulse-length measuring circuit 2 by using 16 phase clocks (CLK1, CLK2, . . . , CLK16) supplied from the 16-phase 2-terminal VCO 10.

Accordingly, unless the 16 phase clocks have uniform phase differences (360°/16=22.5°), the pulse length cannot be correctly measured, thereby influencing the playability. It is thus necessary to test whether the 16 phase clocks have correct phase differences.

One method for detecting a deviation of phase differences is to directly measure the 16 phase clocks with a tester. However, since the 16-phase 2-terminal VCO 10 asynchronously oscillates with respect to a test signal input into the tester, the reference point cannot be determined, thereby failing to measure the phase differences. Accordingly, the phase difference has to be measured by another method.

Figure 79A:
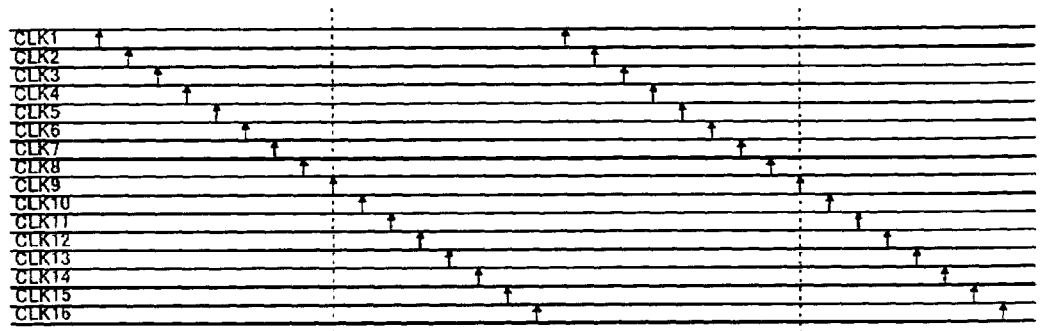
FIGS. 79A, 79B, and 79C illustrate phase differences of 16 phase clocks in this embodiment.
Figure 79B:
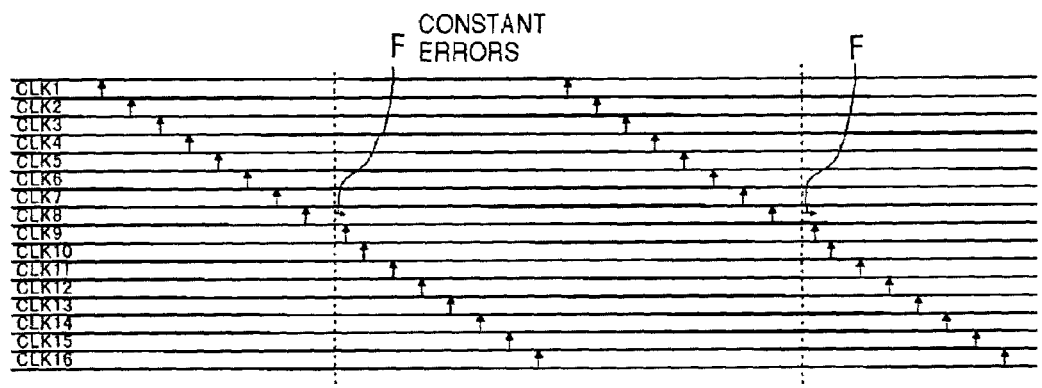
Figure 79C:
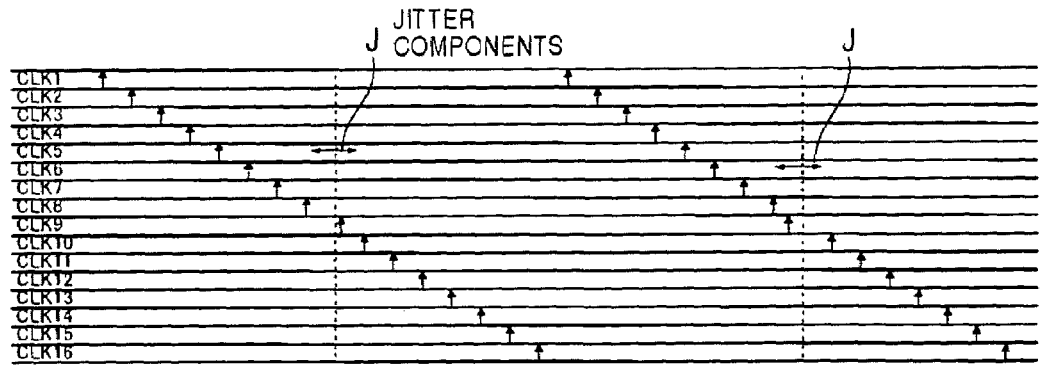

There are two types of phase differences of the 16 phase clocks, as shown in FIGS. 79B and 79C, and more specifically, constant phase errors as shown in FIG. 79B and phase errors caused by jitter components in a clock as shown in FIG. 79C.

FIG. 79A illustrates the ideal state without phase errors in which the clocks CLK1 through CLK16 have uniform phase differences at 22.5°.

FIG. 79B illustrates the state in which, for example, the clock CLK9, constantly deviates from the ideal state indicated by the broken lines by an amount indicated by the arrow F.

FIG. 79C illustrates the state in which, for example, the clock CLK9 having jitter components, fluctuates within a range indicated by the arrow J away from the ideal state indicated by the broken lines.

In this embodiment, constant phase errors and phase errors caused by jitter are detected in the following manner.

10-2 Configuration for Phase Error Determination

In the digital PLL system shown in FIG. 1, for determining phase errors, the selector 91, the VCO test count circuit 92, the clock selection circuit 93, the 1/6 scaler 94, and the control/measured-value output circuit 95 are disposed.

As discussed above, the selector 91 normally selects the output of the asymmetry correction circuit 1. When determining phase errors, the selector 91 selects the output of the asymmetry correction circuit 1 or the output of the 1/6 scaler 94. More specifically, when determining constant phase errors, the selector 91 selects the RF signal, which is the output of the asymmetry correction circuit 1, as the RF signal asynchronous with the 16 phase clocks. In contrast, when determining phase errors caused by jitter, the selector 91 selects the output of the 1/6 scaler 94 as the RF signal synchronized with the 16 phase clocks.

The RF signal selected by the selector 91 and the 16 phase clocks from the 16-phase 2-terminal VCO 10 are supplied to the VCO test count circuit 92. Then, the VCO test count circuit 92 performs sampling on the RF signal by using the 16 phase clocks so as to count the changing points of the RF signal generated between the clocks CLK1 through CLK16.

The clock selection circuit 93 selects one of the clocks CLK1 through CLK16 and outputs the selected clock to the 1/6 scaler 94. The 1/6 scaler 94 scales the clock selected by the clock selection circuit 93 and supplies the scaled clock to the selector 91 as the RF signal synchronized with the 16 phase clock.

The control/measured-value output circuit 95 controls the switching operation of the selector 91 and the clock selection in the clock selection circuit 93. The control/measured-value output circuit 95 reads the value counted by the VCO test count circuit 92, and outputs the count value from a terminal 96. The terminal 96 is provided for an LSI serving as the digital PLL system of this embodiment.

Although in this embodiment the above-described configuration for determining phase errors is integrated in an LSI as the digital PLL system, it may be provided for an external measuring device. In this case, as the LSI of the digital PLL system, output terminals for a binarized RF signal and 16 phase clocks and an input terminal for the output of the 1/6 scaler 94 are formed and can be connected to an external measuring device, thereby forming the configuration of the digital PLL system shown in FIG. 1.

10-3 Determination of Constant Phase Errors

Tests for detecting the above-described two types of phase errors are discussed below. A method for detecting constant deviations of the 16 phase clocks from the ideal phase difference is described first with reference to FIGS. 80A and 80B.

In this test method, an RF signal asynchronous with the 16 phase clocks from the 16-phase 2-terminal VCO 10 is input and is sampled with the 16 phase clocks. Then, the changing points of the RF signal between the clocks (H/L changing points of a binarized signal: signal edges) are counted.

In this case, since the RF signal is asynchronous with the VCO clock frequency, the changing points of the RF signal uniformly appear in one cycle of the 16 phase clocks.

Figure 80A:
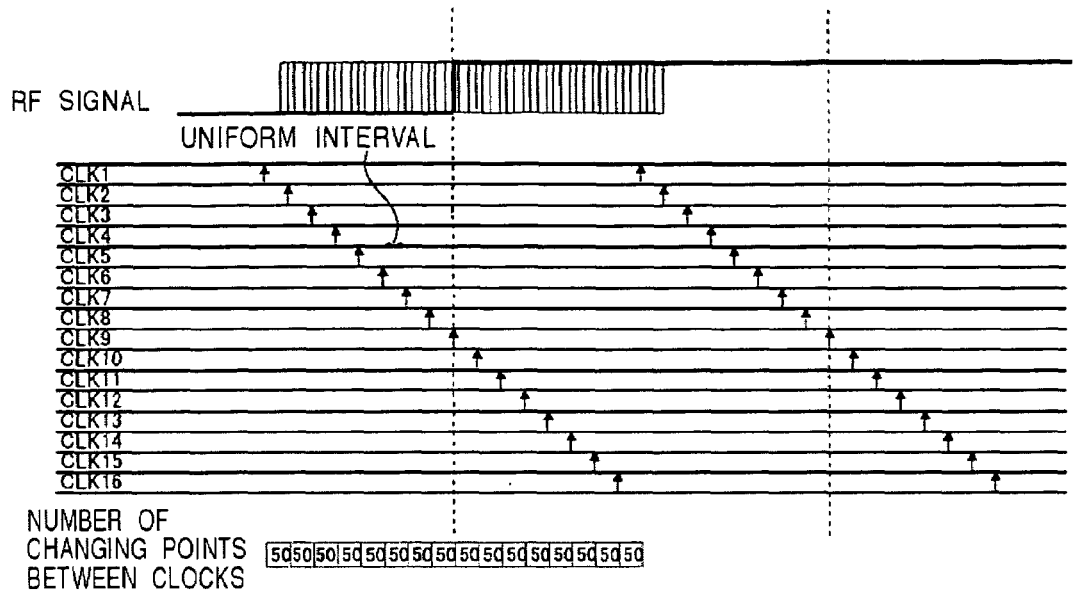
FIGS. 80A and 80B illustrate a method for determining constant phase errors of 16 phase clocks in this embodiment.

FIG. 80A illustrates the ideal state of the phase differences, and in this state, the numbers of changing points of the RF signal between adjacent clocks are uniform.

At the bottom of FIG. 80A, the numbers of changing points of the RF signal between adjacent clocks are indicated. In this example, there are 800 changing points of the RF signal in one cycle of the 16 phase clocks, and 50 changing points are uniformly counted between adjacent clocks in the ideal phase state.

Figure 80B:
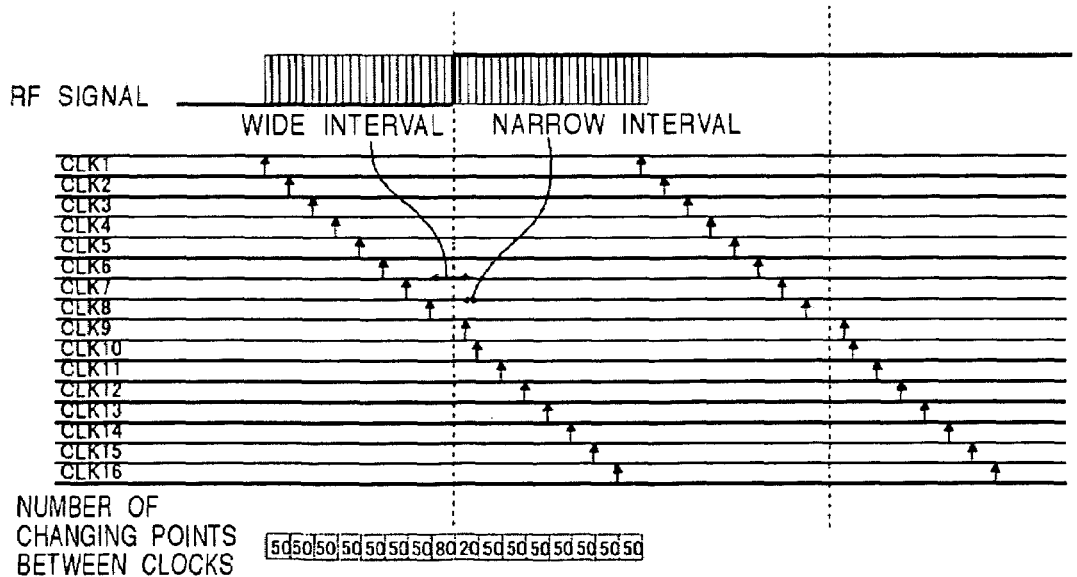

However, if there are phase errors as shown in FIG. 80B, the numbers of changing points of the RF signal between adjacent clocks are not uniform.

For example, the clock CLK9 constantly deviates from the ideal state, as shown in FIG. 80B, and then, the distribution of the 800 changing points of the RF signal between adjacent clocks is examined. In this case, since the interval between the clocks CLK8 and CLK9 becomes large by constant phase errors, 80 changing points are counted. Conversely, since the interval between the clocks CLK9 and CLK10 is narrow, only 20 changing points are counted.

That is, because of constant phase errors, the numbers of changing points between the clocks become non-uniform. By measuring the numbers of changing points of the RF signal between adjacent clocks, constant phase errors can be detected.

Figure 81:
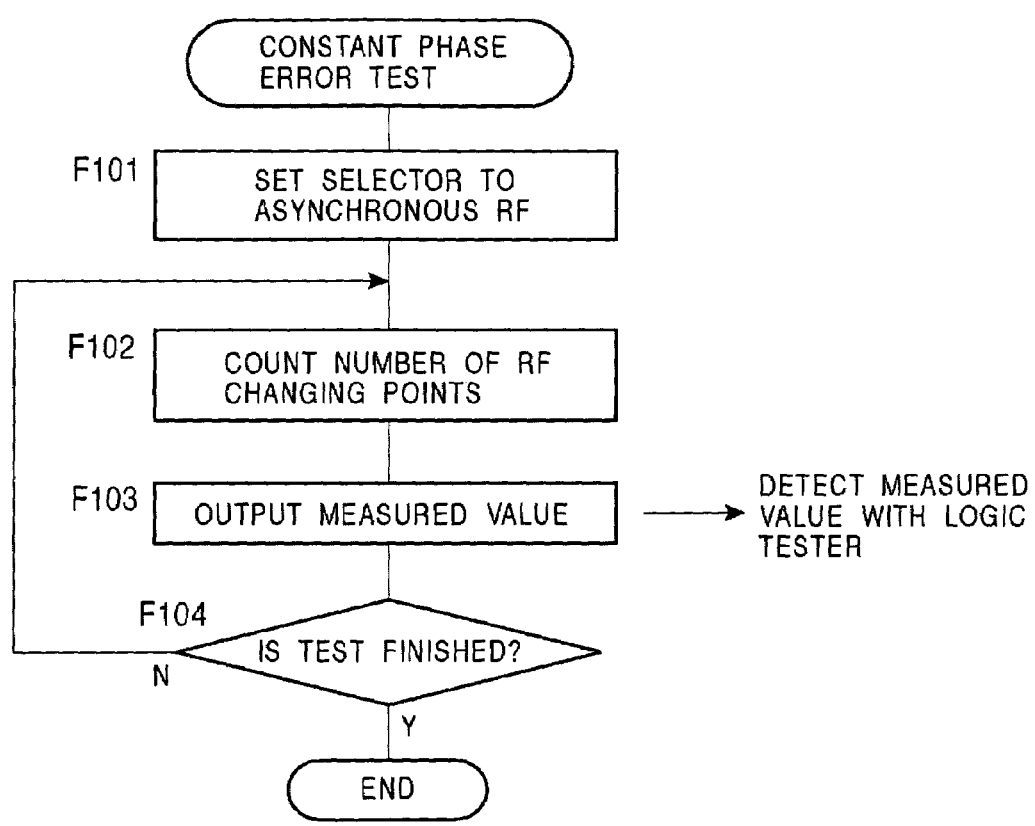
FIG. 81 is a flowchart illustrating a process for determining constant phase errors of 16 phase clocks in this embodiment.

A test process for determining constant phase errors according to the above-described method is discussed below with reference to the flowchart of FIG. 81.

In step F101, the selector 91 is set to be the asynchronous RF signal. That is, the control/measured-value output circuit 95 controls the selector 91 to select the output from the asymmetry correction circuit 1.

In step F102, the numbers of changing points of the RF signal are counted in the VCO test count circuit 92. That is, edges of the RF signal are counted while resetting/starting counting at the edges of the clocks.

In step F103, the control/measured-value output circuit 95 reads the count value when the VCO test count circuit 92 resets counting at the edge of each clock, and outputs the read count value from the terminal 96. Steps F102 and F103 are repeated until the test is finished in step F104.

As a result of the above-described test process, the values indicated at the bottom of FIGS. 80A and 80B, that is, the count values of the changing points of the RF signal between the clocks, are sequentially output from the terminal 96.

A logic tester is connected to the terminal 96 so that the output count values can be monitored, thereby making it possible to determine phase errors. If the count values are uniform between the clocks, the phase state is ideal, and if they are not uniform, phase errors are occurring.

10-4 Determination of Jitter Phase Errors

A method for determining phase errors caused by jitter components is now discussed with reference to FIGS. 82A and 82B.

In this test, one clock of the 16 phase clocks is scaled to 1/6 and is used as the RF signal, i.e., the RF signal synchronized with the 16 phase clocks. The RF signal is then sampled with the 16 phase clocks, and the number of changing points of the RF signal between adjacent clocks is counted, thereby detecting the timing between the RF signal and each clock.

Figure 82A:
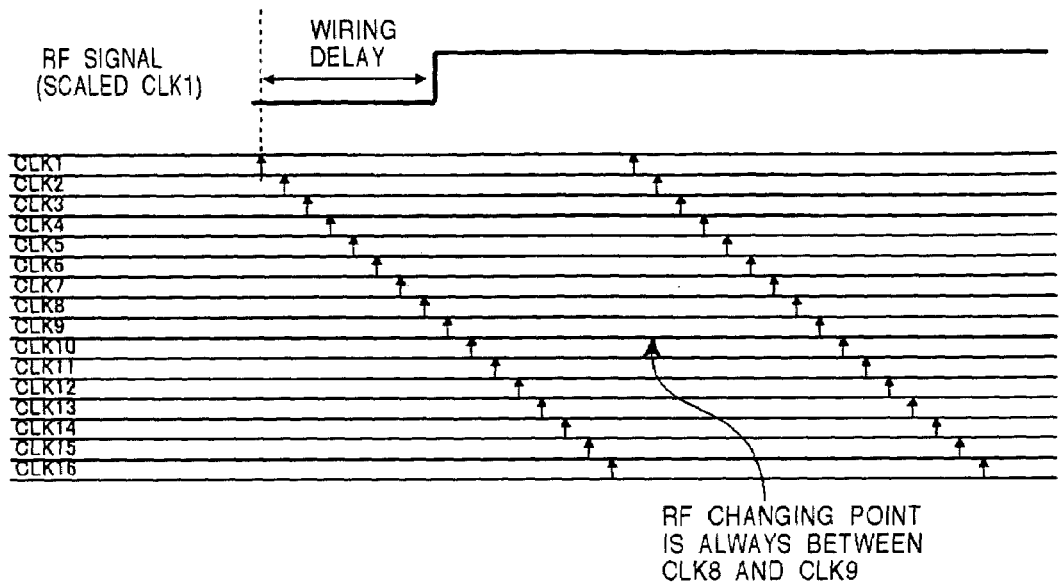
FIGS. 82A and 82B illustrate a method for determining phase errors due to jitter components in 16 phase clocks in this embodiment.
Figure 82B:
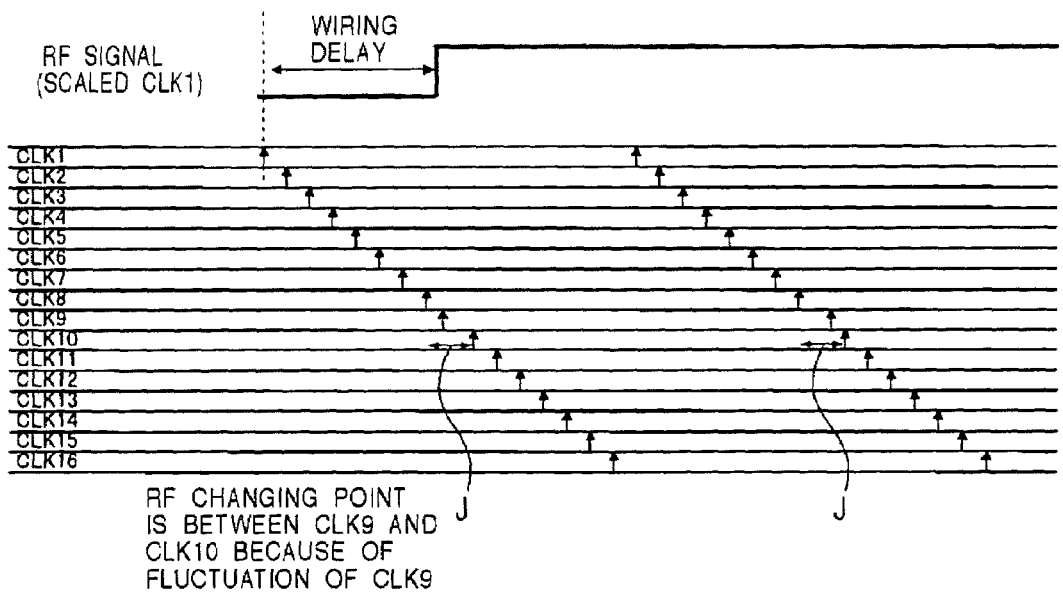

FIGS. 82A and 82B illustrate that the signal generated by scaling, for example, the clock CLK1, is used as the RF signal.

FIG. 82A illustrates the ideal state of the 16 phase clocks without jitter components.

The RF signal generated by scaling the clock CLK1 is delayed for a predetermined time period due to a wiring delay. In this case, if there is no jitter component in the clocks, the changing points of the RF signal always appear between the clocks CLK8 and CLK9. This is because the changing points of the RF signal are delayed from the timing of the clock CLK1 for a fixed time period due to a delay of the frequency of the scaled RF signal and the wiring. In this example, the changing points always appear between the clocks CLK8 and CLK9.

Accordingly, only the number of changing points between the clocks CLK8 and CLK9 is counted.

FIG. 82B illustrates the phase state in which there is a fluctuation in the clock CLK9 due to jitter components. In this case, the changing points of the RF signal do not always appear between the clocks CLK8 and CLK9. That is, due to a fluctuation in the clock CLK9 in the time domain, the changing points of the RF signal sometimes appear between the clocks CLK9 and CLK10.

More specifically, in this case, the timing of the changing points of the RF signal generated by scaling the clock CLK1 is examined, and if the timing relationship between the changing points of the RF signal and the individual clocks is fixed, there is no fluctuation in the clock CLK9 due to jitter components. If the above-descried timing relationship changes, phase errors are occurring due to jitter components in the clock CLK9.

Accordingly, the above-described determination is made by sequentially switching the clock to be scaled and used as the RF signal. Then, the presence or absence of phase errors due to jitter components can be checked for all the clocks CLK1 through CLK16.

Figure 83:
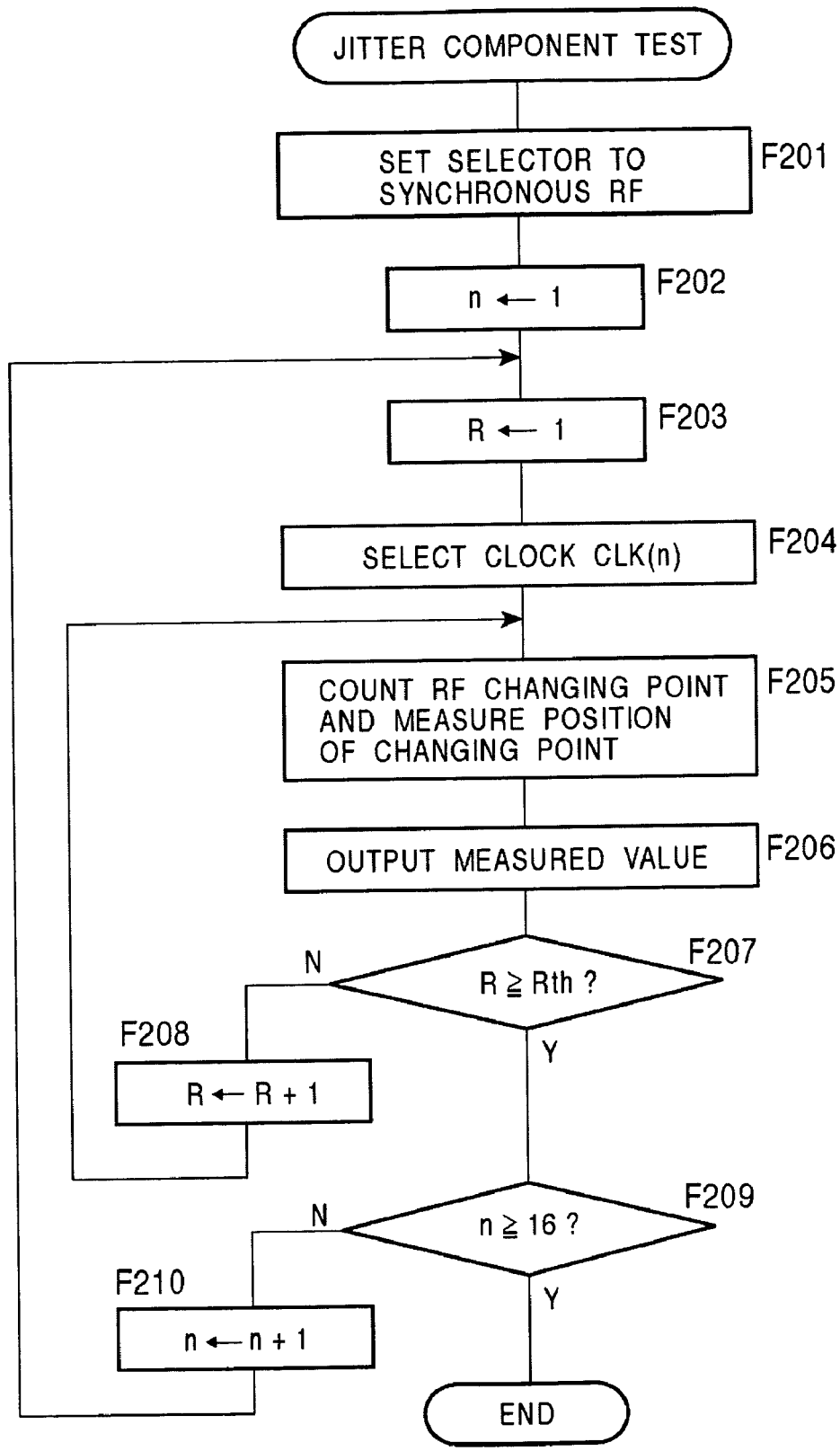
FIG. 83 is a flowchart illustrating a process for determining phase errors due to jitter components in 16 phase clocks in this embodiment.

A test process for determining phase errors due to jitter components by the above-described method is discussed below with reference to the flowchart of FIG. 83.

In step F201, the selector 91 is set to the RF signal synchronized with the 16 phase clocks. That is, the control/measured-value output circuit 95 controls the selector 91 to select the output from the 1/6 scaler 94.

The control/measured-value output circuit 95 sets variable n to be 1 in step F202, and sets variable R to be 1 in step F203. The variable n is a variable for specifying the clock to be selected in the clock selection circuit 93, and the variable R is the number of measurements by which the timing relationship of the RF signal and a clock is checked.

In step F204, the control/measured-value output circuit 95 instructs the clock selection circuit 93 to select the clock CLK(n). First, the clock CLK1 is selected in the clock selection circuit 93 and is scaled in the 1/6 scaler 94, resulting in the RF signal.

In step F205, the VCO test count circuit 92 counts the number of changing points of the RF signal.

More specifically, the VCO test count circuit 92 counts edges of the RF signals while resetting/starting counting at the edge of each clock. As discussed with reference to FIGS. 82A and 82B, the changing points of the RF signal are counted between a certain clock CLK(x) and CLK(x+1). The control/measured-value output circuit 95 then determines the timing relationship between the changing points of the RF signal and the clock according to whether the count value is 0 or 1, and outputs the measured value from the terminal 96 in step F206.

Steps F205 and F206 are repeated while the variable R is incremented by one in step F208 until the variable reaches a predetermined value Rth in step F207. That is, the timing relationship between the changing points of the RF signal using the clock CLK1 and each clock of the 16 phase clocks is detected for Rth times.

A logic tester, for example, is connected to the terminal 96 so as to monitor the output values. In this manner, for example, in the case of FIG. 82B, the occurrence of phase errors due to jitter components in the clock CLK9 can be determined. More specifically, if it is detected for all the Rth times (or almost all the Rth times) that the changing points of the RF signal are always present between the clocks CLK8 and CLK9, it can be determined that no jitter components are contained in the clock CLK9. If changing points of the RF signal are found between the clocks CLK8 and CLK9 and also between the clocks CLK9 and CLK10, i.e., if the timing of the appearance of changing points is not uniform, it can be determined that jitter components are contained in the clock CLK9.

The control/measured-value output circuit 95 may output timing relationship information from the terminal 96. However, the count values between the clocks may directly output from the terminal 96, in which case, the timing relationship is checked with a logic tester.

Alternatively, the count values between the clocks up to the Rth time may be added, and the added value may be output from the terminal 96. For example, for the RF signal based on the clock CLK1, if there is no jitter component, the added value between the clocks CLK8 and CLK9 should become Rth, and the values between the other clocks should become 0. The added values may be checked with a logic tester.

The control/measured-value output circuit 95 determines in step F209 whether the variable n reaches 16. If the outcome of F209 is NO, the process returns to step F210 in which the variable n is incremented by one, and returns to step F203.

Then, the variable R is set to be 1 in step F203, and the control/measured-value output circuit 95 instructs the clock selection circuit 93 to select the clock CLK(n) in step F204. The clock CLK2 is scaled and used as the RF signal this time, and the timing relationship is checked for Rth times, thereby determining the presence or absence of jitter components in the clock CLK10.

Thereafter, the variable n is incremented, and in this manner, the clocks (CLK3, CLK4, . . . , CLK16) are sequentially selected in the selection circuit 93. If it is determined in step F209 that the variable n reaches 16, the test is completed. Then, the presence or absence of jitter components in all the clocks CLK1 through CLK16 have been determined.

10-5 Advantages of Phase Error Determination

According to the above-described phase error determination, the suitability of the 16 phase clocks used in the digital PLL system of this embodiment can be easily determined. Thus, testing for LSIs provided with the digital PLL system of this embodiment can be efficiently performed, and results (pass or fail) for the LSIs can be obtained. In particular, phase errors of 16 phase clocks, which cannot be directly measured, can be measured according to the foregoing method, thereby improving the reliability of pass/fail results of LSIs.

The configuration for determining phase errors is disposed within an LSI, as shown in FIG. 1. Accordingly, deviation of the phase differences of 16 phase clocks can be detected without the need to provide a specific device for a logic tester, thereby reducing the cost for testing. The provision of a logic tester enables the measurements of phase errors. Thus, the outsourcing of the measurements of phase errors to outside agents can be encouraged, thereby improving the manufacturing efficiency.

What is claimed is:

1. A method for reproducing data employing N phase clocks used in a digital phase-locked loop system which comprises:

clock generating means for generating a reference clock based on a frequency of an input signal and means for generating the N phase clocks with a VCO by using the reference clock;

pulse-length measuring means for measuring a pulse length of a playback signal generated by binarizing the input signal and using the N phase clocks so as to output pulse-length data, said method for reproducing data comprising:

inputting a signal and generating a reference clock based on a frequency of the input signal;

generating the N phase clocks with a VCO by using the reference clock;

detecting a pulse length of a playback signal that is generated by binarizing the input signal, the pulse length being determined by using the N phase clocks so as to generate pulse-length data for the playback signal based on a timing relationship between changing points of the binarized input signal determined by the N phase clocks; and adjusting the VCO based upon the detected pulse length of the playback signal.

2. The method for reproducing data according to claim 1, wherein the timing relationship between the changing points of the playback signal and each clock of the N phase clocks is detected while sequentially switching the clock to be selected.

* * * * *